(12) United States Patent
Zhang et al.

(10) Patent No.: US 12,137,585 B2
(45) Date of Patent: Nov. 5, 2024

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Bo Zhang, Beijing (CN); Xiaoqing Shu, Beijing (CN); Zhenhua Zhang, Beijing (CN); Rong Wang, Beijing (CN); Zhenggang Wu, Beijing (CN); Xin Zhang, Beijing (CN); Yang Zhou, Beijing (CN); Junxiu Dai, Beijing (CN); Maoying Liao, Beijing (CN); Yi Zhang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 799 days.

(21) Appl. No.: 17/419,741

(22) PCT Filed: Sep. 10, 2020

(86) PCT No.: PCT/CN2020/114625
§ 371 (c)(1),
(2) Date: Jun. 30, 2021

(87) PCT Pub. No.: WO2021/243876
PCT Pub. Date: Dec. 9, 2021

(65) Prior Publication Data
US 2022/0320230 A1  Oct. 6, 2022

(30) Foreign Application Priority Data
Jun. 5, 2020  (CN) .......................... 202010505924.2

(51) Int. Cl.
*H01L 27/32* (2006.01)
*H10K 59/121* (2023.01)
(Continued)

(52) U.S. Cl.
CPC ....... *H10K 59/131* (2023.02); *H10K 59/1213* (2023.02); *H10K 59/1216* (2023.02);
(Continued)

(58) Field of Classification Search
None
See application file for complete search history.

(56) References Cited

U.S. PATENT DOCUMENTS 9,219,105 B2   12/2015   Jung
10,290,694 B2   5/2019   Xiang et al.
(Continued)

FOREIGN PATENT DOCUMENTS

CN   107871766 A   4/2018
CN   107871767 A   4/2018
(Continued)

OTHER PUBLICATIONS

Office Action in corresponding U.S. Appl. No. 17/419,754 dated Feb. 29, 2024. 15 pages.
(Continued)

*Primary Examiner* — William C Trapanese
(74) *Attorney, Agent, or Firm* — Leason Ellis LLP

(57) ABSTRACT

A display substrate and a display device. A first opening region includes a first opening and a first opening peripheral region surrounding the first opening; a display region surrounds the first opening region the first signal lines extend along the first direction; the second signal lines extend along a second direction; the second signal lines pass through the first opening peripheral region along the second direction, each second signal line includes a longitudinal winding
(Continued)

portion in the first opening peripheral region; the longitudinal winding portion partially surrounds the first opening; the longitudinal winding portion closest to the first opening among longitudinal winding portion of the plurality of second signal lines is an edge longitudinal winding portion, and the first floating electrode is in a same layer as the edge longitudinal winding portion and is at a side of the edge longitudinal winding portion close to the first opening.

20 Claims, 31 Drawing Sheets

(51) Int. Cl.
  *H10K 59/131* (2023.01)
  *H10K 59/65* (2023.01)
  *G09G 3/20* (2006.01)
  *G09G 3/3233* (2016.01)

(52) U.S. Cl.
  CPC ............ *H10K 59/65* (2023.02); *G09G 3/2074* (2013.01); *G09G 3/3233* (2013.01); *G09G 2300/0426* (2013.01); *G09G 2300/0842* (2013.01)

(56) References Cited

U.S. PATENT DOCUMENTS

| | | | |
|---|---|---|---|
| 10,490,119 | B2 | 11/2019 | Kim et al. |
| 10,490,620 | B1 * | 11/2019 | Lai ................... H10K 59/131 |
| 10,636,859 | B2 | 4/2020 | Park et al. |
| 10,748,472 | B2 | 8/2020 | Kim et al. |
| 10,847,598 | B2 | 11/2020 | Gu |
| 10,847,599 | B2 | 11/2020 | Jeon et al. |
| 10,916,595 | B2 | 2/2021 | Park et al. |
| 10,923,552 | B2 | 2/2021 | Choi et al. |
| 10,964,771 | B2 | 3/2021 | Lee et al. |
| 11,009,999 | B2 | 5/2021 | Choi et al. |
| 11,011,595 | B2 | 5/2021 | Lee et al. |
| 11,093,059 | B2 | 8/2021 | Han et al. |
| 11,101,340 | B2 | 8/2021 | Sung et al. |
| 2016/0211308 | A1 | 7/2016 | Lee |
| 2018/0069069 | A1 | 3/2018 | Ebisuno et al. |
| 2018/0090061 | A1 | 3/2018 | Kim et al. |
| 2018/0158417 | A1 | 6/2018 | Xiang et al. |
| 2019/0051718 | A1 | 2/2019 | Zhang et al. |
| 2019/0115415 | A1 | 4/2019 | Choi et al. |
| 2020/0013849 | A1 | 1/2020 | Kim et al. |
| 2020/0111401 | A1 | 4/2020 | Zhao et al. |
| 2020/0168633 | A1 | 5/2020 | Ina et al. |
| 2020/0176526 | A1 | 6/2020 | Yoon et al. |
| 2020/0176527 | A1 | 6/2020 | An et al. |
| 2020/0194461 | A1 | 6/2020 | Park et al. |
| 2021/0125546 | A1 | 4/2021 | Fei et al. |
| 2022/0320231 | A1 | 10/2022 | Zhang et al. |

FOREIGN PATENT DOCUMENTS

| | | |
|---|---|---|
| CN | 107887424 A | 4/2018 |
| CN | 108010947 A | 5/2018 |
| CN | 108538907 A | 9/2018 |
| CN | 108598143 A | 9/2018 |
| CN | 108735094 A | 11/2018 |
| CN | 108831302 A | 11/2018 |
| CN | 108933159 A | 12/2018 |
| CN | 109119447 A | 1/2019 |
| CN | 109637372 A | 4/2019 |
| CN | 109659335 A | 4/2019 |
| CN | 109935620 A | 6/2019 |
| CN | 110010052 A | 7/2019 |
| CN | 209056266 U | 7/2019 |
| CN | 110610667 A | 12/2019 |
| CN | 110649080 A | 1/2020 |
| CN | 110690254 A | 1/2020 |
| CN | 110797373 A | 2/2020 |
| CN | 110800035 A | 2/2020 |
| CN | 110854139 A | 2/2020 |
| CN | 110942752 A | 3/2020 |
| CN | 111009547 A | 4/2020 |
| CN | 111081141 A | 4/2020 |
| CN | 210245497 U | 4/2020 |
| CN | 111106143 A | 5/2020 |
| CN | 111142296 A | 5/2020 |
| CN | 111192909 A | 5/2020 |
| CN | 111223893 A | 6/2020 |
| CN | 111261043 A | 6/2020 |
| CN | 111276514 A | 6/2020 |
| CN | 111489646 A | 8/2020 |
| JP | 2003167271 A | 6/2003 |

OTHER PUBLICATIONS

First Office Action in Corresponding Chinese Application No. 202010505924.2, mailed Apr. 22, 2022. 35 pages.

* cited by examiner

A2-B2

A3-B3

A4-B4

I

J

A3-B3

DISPLAY SUBSTRATE AND DISPLAY DEVICE

This application is a U.S. National Stage Application under 35 U.S.C. § 371 of International Patent Application No. PCT/CN2020/114625 filed Sep. 10, 2020, which claims the benefit of priority of Chinese Patent Application No. 202010505924.2 filed on Jun. 5, 2020, both of which are incorporated by reference in their entireties.

TECHNICAL FIELD

The present disclosure relates to a display substrate and a display device.

BACKGROUND

At present, the display screen of display device is developing towards large screen and full screen. Generally, a display device (e.g., a mobile phone, a tablet computer, etc.) has a camera apparatus (or an imaging apparatus), which is usually arranged on a side outside the display region of the display screen. However, the installation of the camera device needs to occupy a certain frame position, which is not conducive to the full screen and narrow frame design of the display screen. For example, the camera device can be combined and overlapped with the display region of the display screen, and a position is reserved for the camera device in the display region to maximize the display region of the display screen.

SUMMARY

At least one embodiment of the present disclosure provides a display substrate, the display substrate includes a base substrate, a first opening region, a second opening region, an inter-opening region, a display region, and a first signal line. The first opening region includes a first opening and a first opening peripheral region surrounding the first opening. The second opening region is arranged adjacent to the first opening region along a first direction and includes a second opening and a second opening peripheral region surrounding the second opening. The inter-opening region is located between the first opening region and the second opening region, and at least one selected from the group consisting of the inter-opening region, the first opening peripheral are, and the second opening peripheral region includes a first virtual sub-pixel. The display region at least partially surrounds the first opening region, the second opening region, and the inter-opening region, and includes a plurality of pixels, each of the plurality of pixels includes a plurality of sub-pixels, each of the plurality of sub-pixels includes a pixel circuit, the pixel circuit includes a transistor, a light-emitting element, and a storage capacitor, and the transistor includes an active layer, a gate electrode, a source electrode and a drain electrode. The light-emitting element is connected with one of the source electrode and the drain electrode of the transistor. The storage capacitor includes a first electrode plate and a second electrode plate, and the gate electrode and the first electrode plate of the storage capacitor are arranged on the same layer. A first signal line extends in a first direction, includes a first portion passing through the first opening peripheral region, the inter-opening region, and the second opening peripheral region, and is configured to provide a first display signal to the pixel circuit. A first portion of the first signal line passes through the first virtual sub-pixel, and the first virtual sub-pixel includes a virtual pixel circuit, the virtual pixel circuit includes a first compensation capacitor, and the first compensation capacitor includes a first electrode plate and a second electrode plate. The first electrode plate is arranged in the same layer as the first portion of the first signal line and electrically connected with the first signal line, and is arranged in the same layer as the second electrode plate of the storage capacitor. The second electrode plate is arranged in different layers and insulated from the first electrode plate of the first compensation capacitor, where the orthographic projection of the second electrode plate of the first compensation capacitor on the base substrate at least partially overlaps with the orthographic projection of the first electrode plate of the first compensation capacitor on the base substrate.

At least one embodiment of the present disclosure further provides a display substrate, the display substrate includes a base substrate, and the base substrate includes a first opening region, a display region, a plurality of first signal lines, a plurality of second signal lines, and a first floating electrode. The first opening region includes a first opening and a first opening peripheral region surrounding the first opening. The display region at least partially surrounds the first opening region and includes a first display region and a second display region. The first display region is at a first side of the first opening region, and the second display region is at a second side of the first opening region; the first side and the second side are opposite to each other in a first direction, and the first display region and the second display region include a plurality of pixels. The plurality of first signal lines are configured to provide first display signals to the plurality of pixels, extend along the first direction, and pass through the first display region and the second display region. The plurality of second signal lines are configured to provide second display signals to the plurality of pixels, extend along a second direction intersecting the first direction, a portion of the plurality of second signal lines pass through the first opening peripheral region along the second direction, and each of the plurality of second signal lines including a longitudinal winding portion located in the first opening peripheral region, where the longitudinal winding portions are partially arranged around the first opening. The longitudinal winding portion closest to the first opening among the longitudinal winding part of the plurality of second signal lines includes an edge longitudinal winding portion, and the first floating electrode is arranged in the same layer as the edge longitudinal winding portion and located at a side of the edge longitudinal winding portion close to the first opening.

At least one embodiment of the present disclosure further provides a display device including any one of the above mentioned display substrate.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

In order to make objectives, technical details and advantages of the embodiments of the present disclosure apparent, the technical solutions of the embodiments will be described in a clearly and fully understandable way in connection with the drawings related to the embodiments of the present disclosure. Apparently, the described embodiments are just a portion but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Similarly, terms such as "a/an", "one" or "the" do not mean quantity limit, but mean the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the described object is changed, the relative position relationship may be changed accordingly.

In the following description, if it is mentioned that two or more parts are "integrally formed or integral", it means that these parts are formed by at least a same raw material layer, for example, by performing one same patterning process on one same layer, so that there is no interface between these parts and these parts are continuous.

Figure 1:
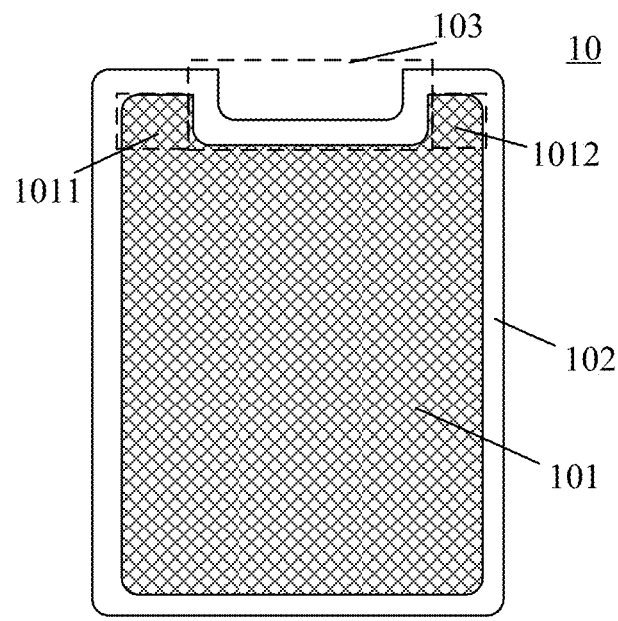
FIG. 1 is a schematic planar view of a display substrate.

FIG. 1 is a schematic planar view of a display substrate. As shown in FIG. 1, the display substrate 10 includes a display region 101 and a peripheral region 102 surrounding the display region 101. the display region 101 is designed in an irregular shape with a notch 103 at least at a side thereof, and components such as a camera, a distance sensor, etc. may be arranged in the region of the notch 103, thereby contributing to the realization of a narrow frame design of the display substrate 10.

As shown in FIG. 1, the display region 101 includes a first display region 1011 and a second display region 1012 that are respectively located at the left side and the right side of the notch 103. The first display region 1011 and the second display region 1012 are at a same horizontal position with respect to the bottom edge (the lower edge in the figure) of the display region 101. For example, the first display region 1011 and the second display region 1012 are driven by same one or more scan signal lines (gate lines) extending horizontally from left to right in the figure. Of course, in some other embodiments, the first display region and the second display region may be located at different horizontal positions. For example, in the case where the display screen adopting the display substrate is a special-shaped (non-rectangular or non-rectangular-like) display screen, for example, the first display region and the second display region are arranged along a curved edge of the display screen, then the first display region and the second display region may not be located at the same horizontal position. Due to the existence of the notch 103, the number of pixels in the same row in the first display region 1011 and the second display region 1012 is less than the number of pixels in the same row in other portions of the display region 101 except the first display region 1011 and the second display region 1012 (for example, the middle portion in FIG. 1). Therefore, in this display substrate 10, the number of pixels connected by horizontally extending signal lines for providing display signals (e.g., scan signals) for the same row of pixels in the first display region 1011 and the second display region 1012 is different from the number of pixels connected by signal lines for providing electrical signals (e.g., scan signals) for a rows of pixels in other portions of the display region 101 except the first display region 1011 and the second display region 1012, and in the case where the notch 103 is irregular (e.g., trapezoidal, teardrop-shaped, etc.), the number of pixels in different rows in the first display region 1011 and the second display region 1012 may also be different. Therefore, in this display substrate 10, because the numbers of pixels in different rows are different, the loads of signal lines connected to pixels in different rows are different, and then the signal transmission speeds of these signal lines are different, and the deviations between actual display signals and design values in different rows are different, which affects the display effect of the display substrate.

For example, the load compensation is performed on these signal lines with different loads, so that the loads of these signal lines are basically the same, thereby reducing the adverse influence on the display quality due to the arrangement of the notch 103.

At least one embodiment of the present disclosure provides a display substrate, and the display substrate includes a base substrate, a first opening region, a second opening region, an inter-opening region, a display region, and a first signal line. The first opening region includes a first opening and a first opening peripheral region surrounding the first opening. The second opening region is arranged adjacent to the first opening region along a first direction and includes a second opening and a second opening peripheral region surrounding the second opening. The inter-opening region is located between the first opening region and the second opening region, and at least one selected from the group consisting of the inter-opening region, the first opening peripheral are, and the second opening peripheral region includes a first virtual sub-pixel. The display region at least partially surrounds the first opening region, the second opening region, and the inter-opening region, and includes a plurality of pixels, each of the plurality of pixels includes a plurality of sub-pixels, each of the plurality of sub-pixels includes a pixel circuit, the pixel circuit includes a transistor, a light-emitting element, and a storage capacitor, and the transistor includes an active layer, a gate electrode, a source electrode and a drain electrode. The light-emitting element is connected with one of the source electrode and the drain electrode of the transistor. The storage capacitor includes a first electrode plate and a second electrode plate, and the gate electrode and the first electrode plate of the storage capacitor are arranged on the same layer. A first signal line extends in a first direction, includes a first portion passing through the first opening peripheral region, the inter-opening region, and the second opening peripheral region, and is configured to provide a first display signal to the pixel circuit. A first portion of the first signal line passes through the first virtual sub-pixel, and the first virtual sub-pixel includes a virtual pixel circuit, the virtual pixel circuit includes a first compensation capacitor, and the first compensation capacitor includes a first electrode plate and a second electrode plate. The first electrode plate is arranged in the same layer as the first portion of the first signal line and electrically connected with the first signal line, and is arranged in the same layer as the second electrode plate of the storage capacitor. The second electrode plate is arranged in different layers and insulated from the first electrode plate of the first compensation capacitor, where the orthographic projection of the second electrode plate of the first compensation capacitor on the base substrate at least partially overlaps with the orthographic projection of the first electrode plate of the first compensation capacitor on the base substrate.

At least one embodiment of the present disclosure further provides a display substrate, the display substrate includes a base substrate, and the base substrate includes a first opening region, a display region, a plurality of first signal lines, a plurality of second signal lines, and a first floating electrode. The first opening region includes a first opening and a first opening peripheral region surrounding the first opening. The display region at least partially surrounds the first opening region and includes a first display region and a second display region. The first display region is at a first side of the first opening region, and the second display region is at a second side of the first opening region; the first side and the second side are opposite to each other in a first direction, and the first display region and the second display region include a plurality of pixels. The plurality of first signal lines are configured to provide first display signals to the plurality of pixels, extend along the first direction, and pass through the first display region and the second display region. The plurality of second signal lines are configured to provide second display signals to the plurality of pixels, extend along a second direction intersecting the first direction, a portion of the plurality of second signal lines pass through the first opening peripheral region along the second direction, and each of the plurality of second signal lines including a longitudinal winding portion located in the first opening peripheral region, where the longitudinal winding portions are partially arranged around the first opening. The longitudinal winding portion closest to the first opening among the longitudinal winding part of the plurality of second signal lines includes an edge longitudinal winding portion, and the first floating electrode is arranged in the same layer as the edge longitudinal winding portion and located at a side of the edge longitudinal winding portion close to the first opening.

The present disclosure is explained by several specific examples. In order to keep the following description of embodiments of the present invention clear and concise, detailed descriptions of known functions and known components may be omitted. If any component of an embodiment of the present invention appears in more than one drawing, the component is denoted by the same reference numeral in each drawing.

Figure 2A:
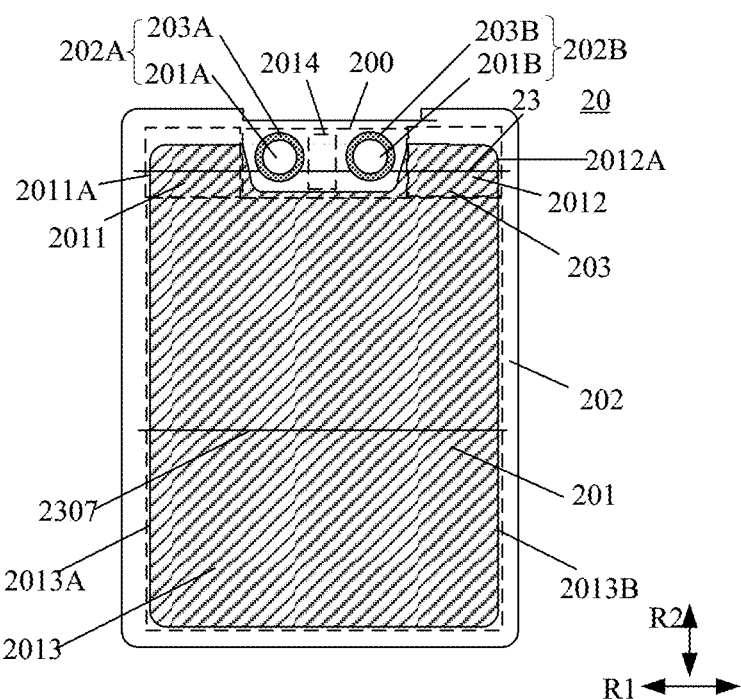
FIG. 2A is a schematic planar view of a display substrate provided by an embodiment of the present disclosure.
Figure 2B:
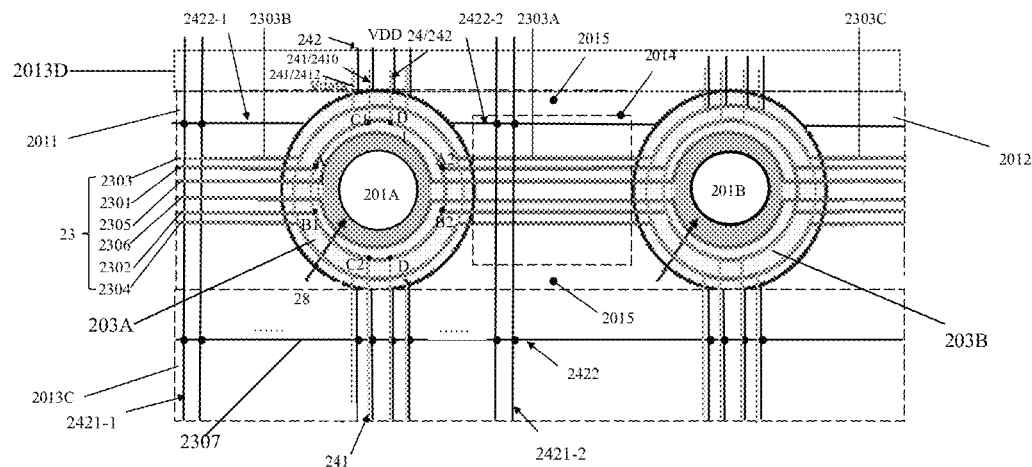
FIG. 2B is a partially enlarged schematic diagram including a first opening region and a second opening region in FIG. 2A.

FIG. 2A is a schematic planar view of a display substrate according to an embodiment of the present disclosure, FIG. 2B is a partially enlarged schematic diagram including a first opening region and a second opening region in FIG. 2A.

As shown in FIG. 2A and FIG. 2B, the display substrate 20 includes a base substrate, and the base substrate includes a first opening region 202A, a second opening region 202B, an inter-opening region 2014, a display region 201, and a first signal line 23. The first opening region 202A includes a first opening 201A and a first opening peripheral region 203A surrounding the first opening 201A. The second opening region 202B is adjacent to first opening region 202A along a first direction R1, and includes a second opening 201B and a second opening peripheral region 203B surrounding second opening 201B. The inter-opening region 2014 is located between the first opening region 202A and the second opening region 202B. The display region 201 at least partially surrounds the first opening region 202A, the second opening region 202B, and the inter-opening region 2014, and includes a plurality of pixels, each of the plurality of pixel includes a plurality of sub-pixels, and each of the plurality of sub-pixels includes a pixel circuit. As shown in FIG. 2B, the first signal line 23 extends in the first direction R1, includes a first portion passing through the first opening peripheral region 202A, the inter-opening region 2014, and the second opening peripheral region 203B, and is configured to provide a first display signal to the pixel circuit.

For example, in the embodiments as shown in FIG. 2A and FIG. 2B, the second opening region 202B and the first opening region 202A are arranged along the first direction R1, so that the inter-opening region 2014 is located between the first opening region 202A and the second opening region 202B in the first direction R1. Of course, in other embodiments, the second opening region 202B may also be aligned with the first opening region 202A along the second direction R2. Under this case, the inter-opening region 2014 is located between the first opening region 202A and the second opening region 202B in the second direction R2. The embodiments of the present disclosure do not limit the arrangement direction of the second opening region 202B and the first opening region 202A.

The display region 201 includes pixels arranged in an array, each pixel includes one or more sub-pixels, and further includes various signal lines for transmitting various electrical signals to the sub-pixels for realizing a display function. a frame region 204 includes various driving circuits, signal lines electrically connected with sub-pixels, contact pads, etc. The signal lines of the frame region 204 are electrically connected (or integral) with signal lines (such as gate lines, data lines, etc.) in the display region 201 to provide electrical signals (such as scan signals, data signals, etc.) for sub-pixels.

For example, the first opening 201A is arranged to allow light from the display side of the display substrate to pass through to reach a camera and a distance sensor so as to realize light sensing, thereby realizing functions such as image shooting and distance sensing. For example, in the area corresponding to the first opening 201A, apparatus such as a camera and a distance sensor can be arranged on the back side of the display substrate (that is, the side opposite to the display side), and at least portion of the camera and the distance sensor are exposed through the first opening 201A.

For example, various signal lines from the frame region 204 extend through the display region 201. In the case where the various signal lines encounter the first opening region 201A, these signal lines pass through the first opening peripheral region 203A to bypass the first opening 201A, and then enter the display region 201 to provide electrical signals (such as scan signals, data signals, etc.) to the passing sub-pixels. Therefore, these signal lines may not be arranged in the first opening 201A to increase the light transmittance of the first opening 201A.

The display region 201 includes a first display region 2011 and a second display region 2012. The first display region 2011 is located at a first side of the first opening region 202A, the second display region 2012 is located at a second side of the first opening region 202A, and the first side and the second side are opposite to each other in a first direction R1 (horizontal direction in the figure). For example, the first display region 2011, the first opening peripheral region 203A, and the second display region 2012 are sequentially arranged along the first direction R1. The whole of the first display region 2011 and the second display region 2012 includes a first pixel array. For example, the first pixel array includes a plurality of pixels arranged in an array, each pixel includes a plurality of sub-pixels, and each sub-pixel includes a pixel circuit.

Taking the first signal line 2301 in FIG. 2B as an example, for example, the display substrate includes a plurality of first signal lines 2301/2302/2303/2304/2305/2306, and the first signal line 2301 is configured to provide a first display signal to the first pixel array and sequentially pass through the first display region 2011, the first opening peripheral region 203A, and the second display region 2012 along the first direction R1, Thereby electrically connecting sub-pixels in the first display region 2011 and the second display region 2012 located at opposite sides of the first opening 201A. For example, the first signal line 2301 provides a first display signal for sub-pixels of the plurality of pixels in the first display region 2011 and the second display region 2012 which are in the same horizontal position as the sub-pixels of the plurality of pixels in the first opening peripheral region 203A. In various embodiments, the first display signal may be, for example, an electrical signal in any form such as a gate scan signal, a light-emitting control signal, or a reset voltage signal. For example, a plurality of first signal lines 2301/2302/2303/2304/2305/2306 can provide one or more of a scan signal, a light-emitting control signal, a reset voltage signal, etc. for the pixel circuits in the first display region 2011 and the second display region 2012.

For example, as shown in FIG. 2A and FIG. 2B, the display substrate 20 further includes a third display region 2013. For example, the third display region 2013 includes a first portion 2013C located at a first side of the first display region 2011 and the second display region 2012 in a second direction R2 and a second portion 2013D located at a second side of the first display region 2011 and the second display region 2012 in the second direction R2. The first side of the first display region 2011 and the second display region 2012 and the second side of the first display region 2011 and the second display region 2012 are opposite to each other in the second direction R2. The first portion 2013C and the second portion 2013D are both connected with the first display region 2011 and the second display region 2012.

For example, two edges 2013A and 2013B of the first portion 2013C of the third display region 2013 facing each other in the first direction R1 are respectively aligned with an edge 2011A of the first display region 2011 extending in the second direction R2 and away from the first opening 201A, and an edge 2012A of the second display region 2012 extending in the second direction R2 and away from the first opening 201A. The third display region 2013 includes a plurality of rows and columns of pixels. As illustrated in FIG. 2B, the display substrate 20 further includes a plurality of third signal lines 2307, and the plurality of third signal lines 2307 are located in both the first portion 2013C of the third display region 2013 and the second portion 2013D of the third display region 2013. FIG. 2A and FIG. 2B show a third signal line 2307 located in the first portion 2013C of the third display region 2013 as an example. The third signal line 2307 is configured to provide a third scan signal to a plurality of rows of pixels of the third display region 2013, respectively, and extends along the first direction R1. In the present embodiment, for example, the second signal line 24 passes sequentially through the second portion 2013D of the third display region 2013, the first opening peripheral region 203A, and the first portion 2013C of the third display region 2013 along the second direction R2, and is configured to provide a second display signal to a plurality of columns of pixels of the third display region 2013.

The third display region 2013 also includes a plurality of pixels, each pixel includes a plurality of sub-pixels, and each sub-pixel includes a pixel circuit. Each pixel of the third display region 2013 may have the same structure as each pixel of the first display region and the second display region. For example, in some embodiments, the number of pixels included in each row of sub-pixels in a plurality of rows and columns in the third display region 2013 is substantially the same. In this case, the numbers of pixels electrically respectively connected with the plurality of third signal lines 2037 are basically the same, so that the plurality of third signal lines 2037 have basically the same load. For example, the number of the pixels included in each row of pixels in the plurality of rows and columns is larger than the number of pixels in the first pixel row of the first pixel array and the number of pixels in the second pixel row of the first pixel array. For example, after load compensation, the load of each first signal line 2301/2302/2303/2304 is basically the same as the loads of the plurality of third signal lines 2037, and then the signal transmission speed of each first signal line 2301/2302/2303/2304 and each third signal line 2037 is basically the same, and the deviation between the actual display signal transmitted to the pixel circuits of the sub-pixels and the design value is basically the same, so that the display consistency of the display region 201 can be maintained and the display effect of the display substrate 20 can be improved.

As shown in FIG. 2B, for example, the display substrate 20 further includes a first power supply line VDD, and the first power supply line VDD is connected with a first voltage terminal and configured to provide a first power supply voltage to pixel circuits of one or more sub-pixels. For example, the first power supply line VDD includes a plurality of first sub-routing lines 2421/2422 extending along the first direction R1 and a plurality of second sub-routing lines 2423/2424 extending along the second direction R2. A first part of the first sub-routing lines 2421 in the plurality of first sub-routing lines 2421/2422 is disconnected (broken) in the first opening region 202A, and a second part of the first sub-routing lines 2422 in the plurality of first sub-routing lines 2421/2422 passes through the third display region. For example, in FIG. 2B, the first sub-routing line 2422 passes through the first portion 2013C of the third display region 2013 along the first direction R1. A first part of second sub-routing lines 2423 in the plurality of second sub-routing lines 2423/2424 is disconnected (broken) in the first opening region 202A, and a second part of second sub-routing lines 2424 in the second sub-routing lines 2423/2424 sequentially passes through the first display region 2011 and the third display region 2013. In the present embodiment, for example, the second part of second sub-routing lines 2424 sequentially passes through the second part 2013D of the third display region 2013, the first display region 2011, and the first portion 2013C of the third display region 2013. Or, the second sub-routing line 2424 passes through the second display region 2012 and the third display region 2013 in sequence, for example, in the present embodiment, the second sub-routing line 2424 passes through the second portion 2013D, the second display region 2012, and the first portion 2013C of the third display region 2013 in sequence. The first part of the first sub-routing lines 2421 is electrically connected with at least one second sub-routing line 2424 in the second part of second sub-routing lines 2424 in the first display region 2011 and the second display region 2012, respectively, and the first part of second sub-routing lines 2423 is electrically connected with at least one first sub-routing line 2422 in the second part of the first sub-routing lines 2422 in the third display region 2013 so as to provide the first power supply voltage to the sub-pixels of each row and column of the first pixel array and the second pixel array.

Figure 15:
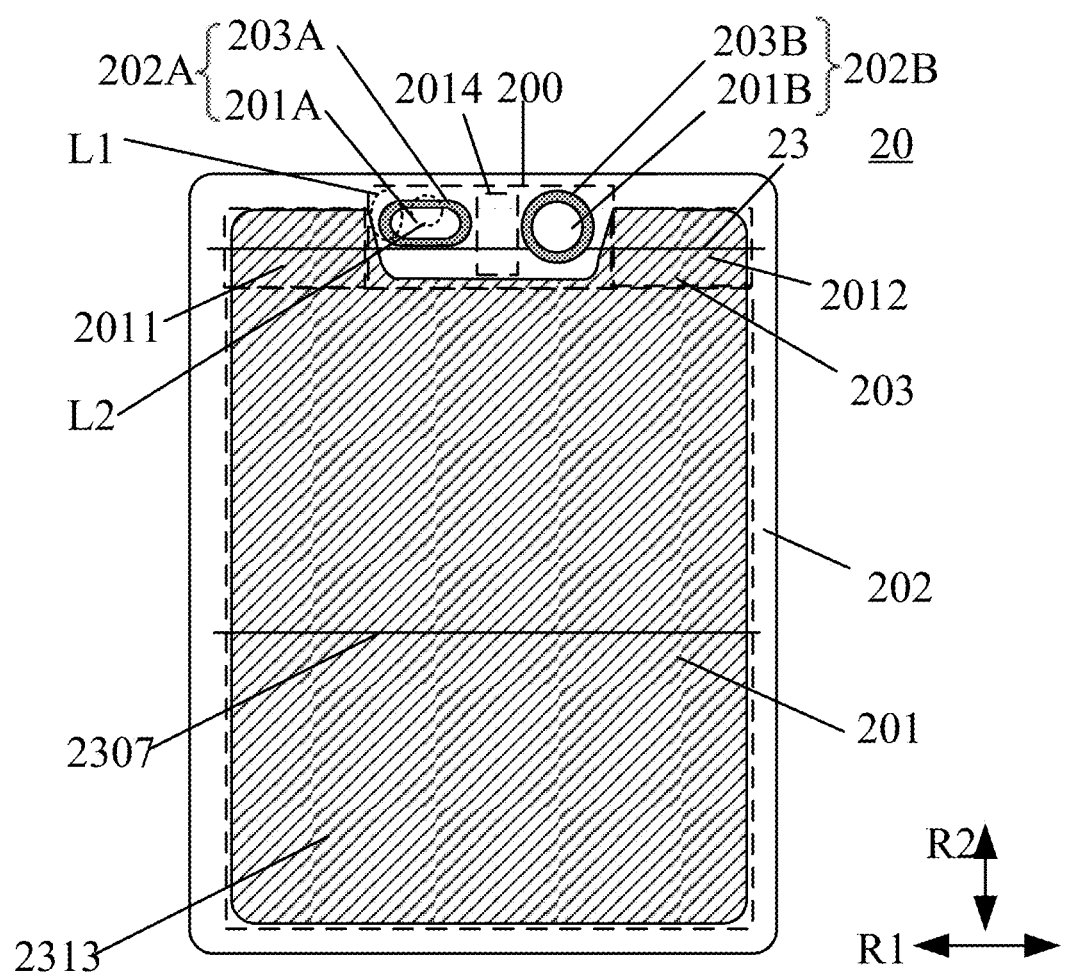
FIG. 15 is another schematic planar view of the display substrate provided by an embodiment of the present disclosure.

The planar shape of the first opening region of the display substrate provided by at least one embodiment of the present disclosure is not limited to a circle, but may also be a regular pattern such as a rectangle or an ellipse, or an irregular pattern such as a racetrack shape (for example, as shown in FIG. 15) or a water drop shape. In these cases, the arrangement principles and technical effects of the first signal line and the second signal line are the same as or similar to those of the above circular example.

Figure 2C:
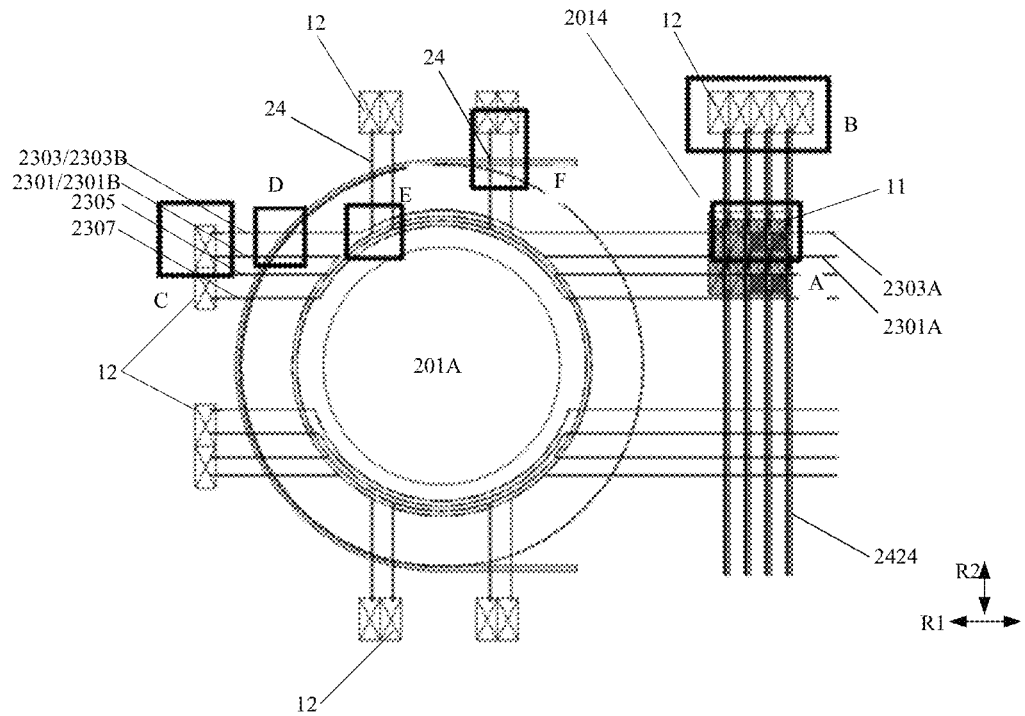
FIG. 2C is a partially enlarged schematic diagram including a first opening region and an inter-opening region in FIG. 2A.

At least one selected from a group consisting of the inter-opening region 2014, the first opening peripheral region 203A, and the second opening peripheral region 203B includes a first virtual sub-pixel. For example, as shown in FIG. 2C, the present embodiment takes the case that the inter-opening region 2014 includes a first virtual sub-pixel 11 as an example, that is, the first virtual sub-pixel 11 is located in the portion A in FIG. 2C, and the structure of the first virtual sub-pixel will be described in detail later. Of course, the first virtual sub-pixel 11 may also be located in the first opening peripheral region 203A or/and the second opening peripheral region 203B.

Next, the structure of sub-pixels in the display region, such as the sub-pixels 12 in the portion B and the portion C in FIG. 3C, will be described.

Figure 3A:
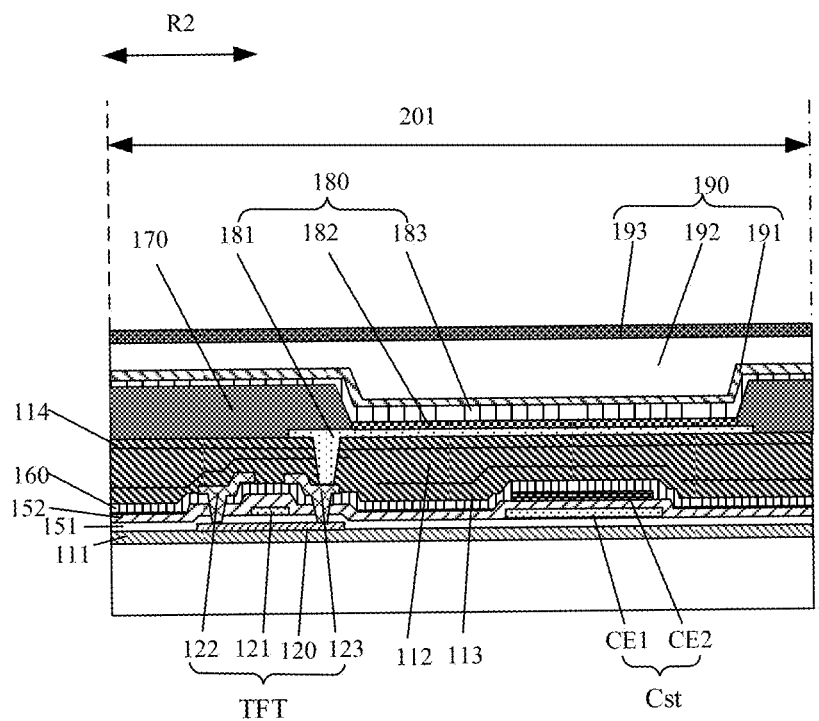
FIG. 3A is a schematic cross-sectional view of sub-pixels in a display region of a display substrate.

FIG. 3A is a schematic cross-sectional view of sub-pixels in a display region of a display substrate. As shown in FIG. 3A, the pixel circuit of each sub-pixel in the display region 201 of the display substrate 20 includes a transistor which is described by taking a thin film transistor (TFT) as an example, a light-emitting element 180, and a storage capacitor CST. The thin film transistor includes an active layer 120, a gate electrode 121, and a source electrode and a drain electrode 122/123. The storage capacitor CST includes a first electrode plate CE1 and a second capacitor plate CE2. The light-emitting element 180 includes a cathode 183, an anode 181, and a light-emitting layer 182 between the cathode 183 and the anode 181. The anode 181 is electrically connected with one of the source electrode and the drain electrode 122/123 of the thin film transistor TFT, for example, the drain electrode 123. For example, the light-emitting element can be an organic light-emitting diode (OLED) or a quantum dot light-emitting diode (QLED), and accordingly, the light-emitting layer 182 is an organic light-emitting layer or a quantum dot light-emitting layer.

For example, as shown in FIG. 3A, the display region 201 further includes a first gate insulation layer 151 located between the active layer 120 and the gate electrode 121, a second gate insulation layer 152 located above the gate electrode 121, and an interlayer insulation layer 160. The second gate insulation layer 152 is located between the first electrode plate CE1 and the second capacitor plate CE2, so that the first electrode plate CE1, the second gate insulation layer 152, and the second capacitor plate CE2 constitute a storage capacitor CST. The interlayer insulation layer 160 covers the second capacitor plate CE2.

For example, as shown in FIG. 3A, the display region 201 further includes an insulation layer 113 (e.g., a passivation layer) covering the pixel circuit and a first planarization layer 112. The display region 201 further includes a pixel defining layer 170 configured to define a plurality of sub-pixels and spacers (not shown) on the pixel defining layer 170. As shown in FIG. 3A, in some embodiments, an insulation layer 113 is located above the source electrode and the drain electrode 122/123 (for example, a passivation layer formed of silicon oxide, silicon nitride, or silicon oxynitride, etc.), a first planarization layer 112 is arranged above the insulation layer 113, and the anode 181 is electrically connected with the drain electrode 123 through a via hole penetrating through the first planarization layer 112 and the insulation layer 113.

For example, as shown in FIG. 3A, the first opening peripheral region 203A of the display substrate 20 further includes an encapsulation layer 291, an encapsulation layer 292, and an encapsulation layer 293. The display region 201 further includes an encapsulation layer 190, and the encapsulation layer 190 includes a plurality of encapsulation sub-layers 191/192/193. Of course, the encapsulation layer 190 is not limited to three layers, but can also be two layers, or four layers, five layers, or more layers. For example, the first encapsulation layer 291 is arranged on the same layer as the first encapsulation sub-layer 191 in the encapsulation layer 190, the second encapsulation layer 292 is arranged on the same layer as the second encapsulation sub-layer 192 in the encapsulation layer 190, and the third encapsulation layer 293 is arranged on the same layer as the third encapsulation sub-layer 193 in the encapsulation layer 190. For example, both the first encapsulation layer 291 and the third encapsulation layer 293 may include inorganic encapsulation materials such as silicon oxide, silicon nitride or silicon oxynitride, and the second encapsulation layer 292 may include organic materials such as resin materials. The multilayer packaging structure of the display region 201 and the first opening peripheral region 203A can achieve better packaging effect so as to prevent impurities such as water vapor or oxygen from penetrating into the display substrate 20.

In some embodiments, as shown in FIG. 3A, the display substrate further includes a buffer layer 111 on the base substrate 210, and the buffer layer 111 serves as a transition layer, which can prevent harmful substances in the base substrate 210 from invading the interior of the display substrate 20, and can also increase the adhesion of layers in the display substrate 20 on the base substrate 210. For example, the materials of the buffer layer 111 may include a single-layer structure or a multi-layer structure formed of insulation materials such as silicon oxide, silicon nitride, and silicon oxynitride, etc.

Figure 3B:
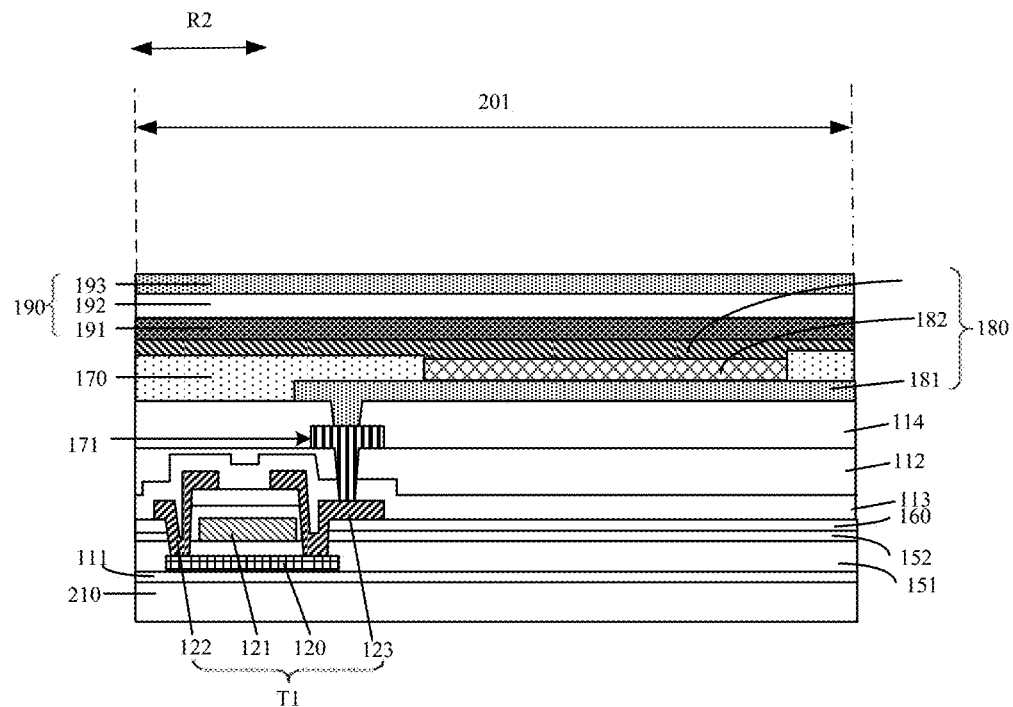
FIG. 3B is another schematic cross-sectional view of sub-pixels in the display region of the display substrate.

FIG. 3B is another schematic cross-sectional view of sub-pixels in the display region of the display substrate. Unlike the display region as shown in FIG. 3A, in the display region shown in FIG. 3B, the anode 181 of the light-emitting element 180 is electrically connected with the drain electrode 123 of the thin film transistor TFT through a transfer connection electrode 171. Under this case, the transfer connection electrode 171 is covered by a second planarization layer 114. For example, the second planarization layer 114 is above the first planarization layer 112.

For example, in some other embodiments, the display region of the display substrate may not have the insulation layer 113 and the second planarization layer 114.

For example, in at least one embodiment of the present disclosure, the base substrate 210 may be a glass substrate, a quartz substrate, a metal substrate, or a resin substrate. For example, the materials of the base substrate 210 may include organic materials, such as polyimide, polycarbonate, polyacrylate, polyetherimide, polyethersulfone, polyethylene terephthalate, polyethylene naphthalate, and other resin materials. For example, the base substrate 210 may be a flexible substrate or a non-flexible substrate, which is not limited by embodiments of the present disclosure.

For example, a material of anyone selected from a group consisting of the first gate insulation layer 151, the second gate insulation layer 152, the interlayer insulation layer 160, the first planarization layer 112, the pixel defining layer 170, and the spacer may include inorganic insulation materials such as silicon oxide, silicon nitride, and silicon oxynitride, or may include organic insulation materials such as polyimide, polyimide, phthalamide, acrylic resin, benzocyclobutene, or phenolic resin. The embodiments of the present disclosure do not specifically limit the materials of the first gate insulation layer 151, the second gate insulation layer 152, the interlayer insulation layer 160, the first planarization layer 112, the pixel defining layer 170, and the spacer. For example, the materials of the first gate insulation layer 151, the second gate insulation layer 152, the interlayer insulation layer 160, the first planarization layer 112, the second planarization layer 114, the pixel defining layer 170, and the spacers may be the same or partially the same as each other, or they may be different from each other, which is not limited by embodiments of the present disclosure.

For example, as shown in FIG. 2B, the display substrate 20 may further include a barrier wall 28 which is located in the first opening peripheral region 203A and at least partially surrounds the first opening 201A. For example, in the direction perpendicular to the base substrate 210, the barrier wall 28 at least partially overlaps with the first signal line and the second signal line. The barrier wall 28 can provide barrier and support functions in the first opening peripheral region 203A, maintain the stability of the first opening 201A, protect photoelectric sensing apparatus such as cameras in the first opening 201A, and prevent harmful impurities such as water vapor and oxygen from diffusing into the display region through the first opening 201A, thereby preventing the pixel circuit in the display region from being degraded by harmful impurities.

Figure 4A:
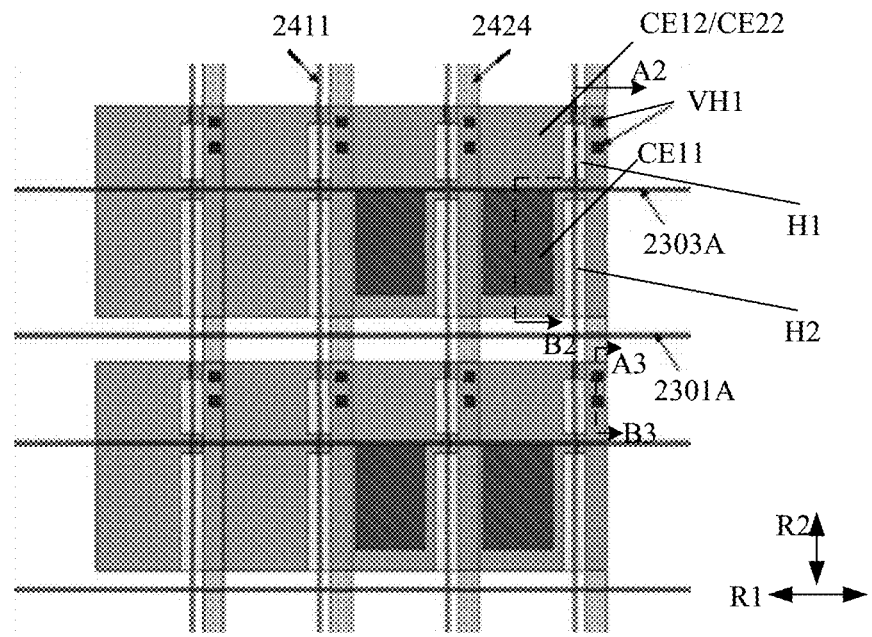
FIG. 4A is a schematic planar layout diagram of a first virtual pixel circuit in a display substrate provided by an embodiment of the present disclosure.
Figure 4B:
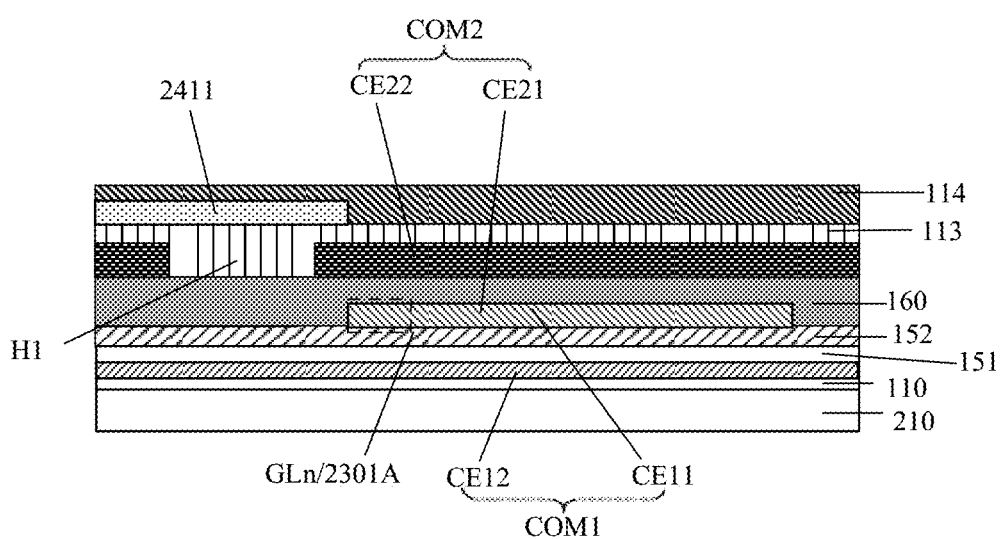
FIG. 4B is a schematic cross-sectional view taken along the line A2-B2 in FIG. 4A.
Figure 4C:
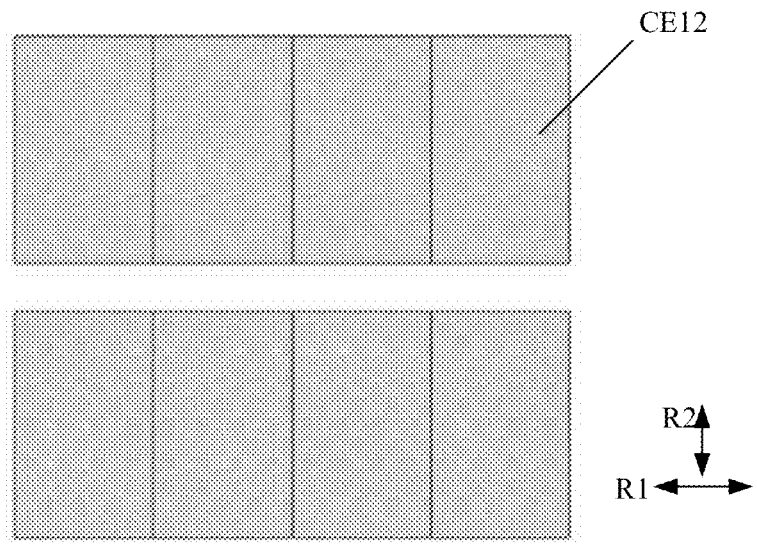
FIG. 4C-FIG. 4G are schematic diagrams of each layer of the first virtual pixel circuit of a display substrate provided by an embodiment of the present disclosure.
Figure 4D:
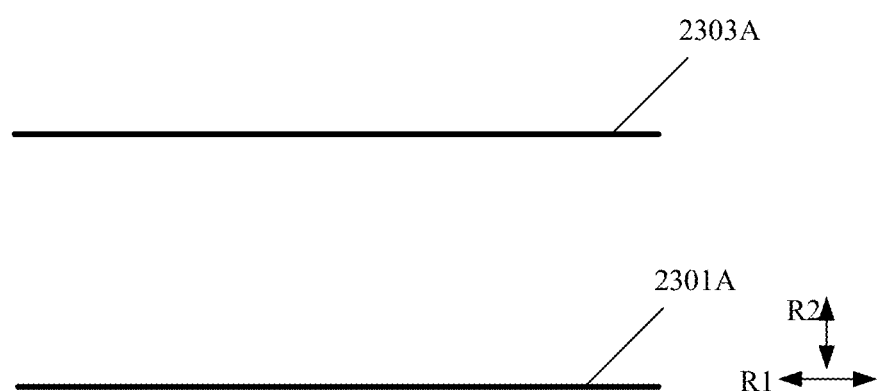

FIG. 4A is a schematic pane layout diagram of a first virtual pixel circuit in a display substrate according to an embodiment of the present disclosure, for example, the first virtual pixel circuit includes the portion A in FIG. 2C; FIG. 4B is a schematic cross-sectional view along the line A2-B2 in FIG. 4A; FIG. 4C-FIG. 4G are schematic diagrams of each layer of a first virtual pixel circuit of a display substrate according to an embodiment of the present disclosure.

With reference to FIG. 2A-FIG. 2C and FIG. 4A-FIG. 4B, the first part 2301A of the first signal line 2301 passes through the first virtual sub-pixel 11, the first virtual sub-pixel 11 includes a virtual pixel circuit, the virtual pixel circuit includes a first compensation capacitor COM1, and the first compensation capacitor COM1 includes a first electrode plate CE11 and a second electrode plate CE12. The first electrode plate CE11 of the first compensation capacitor COM1 is arranged in the same layer as the first portion 2301A of the first signal line 2301 and electrically connected with the first signal line 2301, and is in a same layer as the second electrode plate CE2 of the storage capacitor CST. The second electrode plate CE12 of the first compensation capacitor COM1 is arranged in different layers and insulated from the first electrode plate CE11 of the first compensation capacitor COM1. The orthographic projection of the second electrode plate CE12 of the first compensation capacitor COM1 on the base substrate 210 at least partially overlaps with the orthographic projection of the first electrode plate CE11 of the first compensation capacitor COM1 on the base substrate 210. The first compensation capacitor COM1 compensates the load on the first signal line 2301, thereby reducing the display difference caused by the different loads of the first signal lines connecting different rows of pixels due to the different number of pixels in different rows, making the display effects of the first display region 2011 and the second display region 2012 consistent with the display effects of the pixel rows without the first opening region 202A in the display region 201, and improving the display quality. In addition, because the first electrode plate CE11 is arranged in the same layer as the second electrode plate CE2 of the storage capacitor CST, the first electrode plate CE11 can not only form a compensation capacitor with the metal layer above the first electrode plate CE11 (in the direction away from the base substrate), but also with the semiconductor layer below the first electrode plate CE11 (in the direction close to the base substrate). If the first electrode plate CE11 is arranged in a same layer as the gate electrode 121, a TFT will be formed by the first electrode plate CE11 and the semiconductor layer.

Figure 4E:
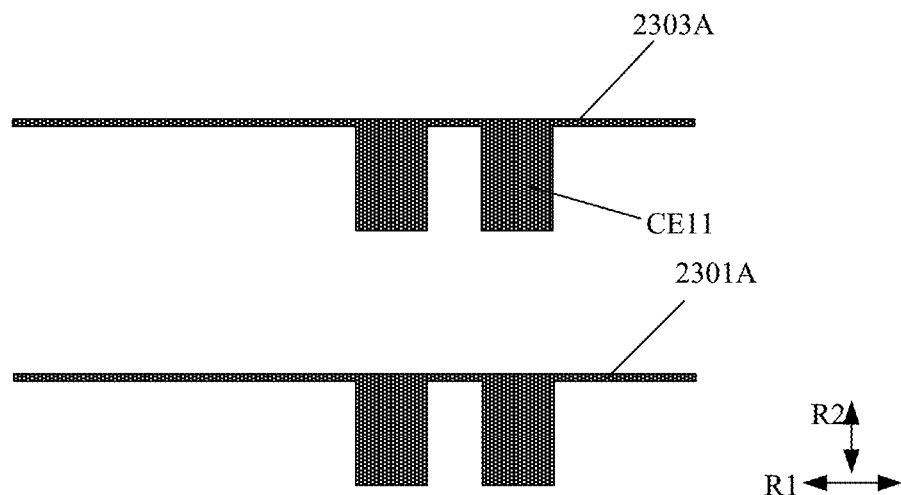

For example, as shown in FIG. 4B and FIG. 4E, the first electrode plate CE11 of the first compensation capacitor COM1 is integral with the first signal line 2301.

For example, as shown in FIG. 4B, the material of the second electrode plate CE12 of the first compensation capacitor COM1 includes a semiconductor material and is a conductor, and the second electrode plate CE12 is arranged in the same layer as the active layer 120. For example, the material of the second electrode plate CE12 of the first compensation capacitor COM1 includes the same material as the material of the active layer 120, such as a-Si, polysilicon, and the like. For example, the second electrode plate CE12 of the first compensation capacitor COM1 is heavily doped to enhance its conductivity and make the second electrode plate CE12 a conductor, which may be performed while the active layer 120 is doped, for example, and heavy doping is realized because the second electrode plate CE12 of the first compensation capacitor COM1 cannot be shielded. For example, the doping material is boron (B). A voltage signal is applied to the second electrode plate CE12, and the semiconductor material is equivalent to a conductor, so that the second electrode plate CE12 can serve as a capacitor plate, the existing layer is fully utilized, and the second electrode plate CE12 may be formed at the same time with the active layer 120 through one same patterning process. The one same patterning process refers to performing one patterning process using one same mask plate by one same exposure.

As shown in FIG. 4A-FIG. 4B, the virtual pixel circuit further includes a second compensation capacitor COM2, and the second compensation capacitor COM2 includes a first electrode plate CE21 and a second electrode plate CE22. The first electrode plate CE21 of the first compensation capacitor COM1 is multiplexed as the first electrode plate CE21 of the second compensation capacitor COM2. The second electrode plate CE22 is arranged in a different layer from and insulated from the first electrode plate CE21 of the second compensation capacitor COM2, and is arranged in the same layer as the above-mentioned source electrode and drain electrode 122/123. The orthographic projection of the second electrode plate CE22 of the second compensation capacitor COM2 on the base substrate 210 at least partially overlaps with the orthographic projection of the first electrode plate CE21 of the second compensation capacitor CE22 on the base substrate 210. The second compensation capacitor further compensates the load on the first signal line 2301, thereby reducing the display difference caused by the different loads of the first signal lines connecting different rows of pixels due to the different numbers of pixels in different rows, enabling the display effects of the first display region 2011 and the second display region 2012 to be consistent with the display effects of the pixel rows in the display region 201 without the first opening region 202A, and improving the display quality. Moreover, by utilizing the existing layer, that is, the conductive layer where the source electrode and the drain electrode 122/123 are located, the second compensation capacitor CE22 can be formed at the same time with the source electrode and the drain electrode 122/123 by performing one patterning process on one same layer, thus simplifying the manufacturing process of the display plate and saving the cost.

For example, the second electrode plate CE22 of the second compensation capacitor COM2 is electrically connected with the second electrode plate CE12 of the first compensation capacitor COM1, so that the first compensation capacitor and the second compensation capacitor are connected in parallel, providing more effective compensation and a larger compensation range.

Figure 4F:
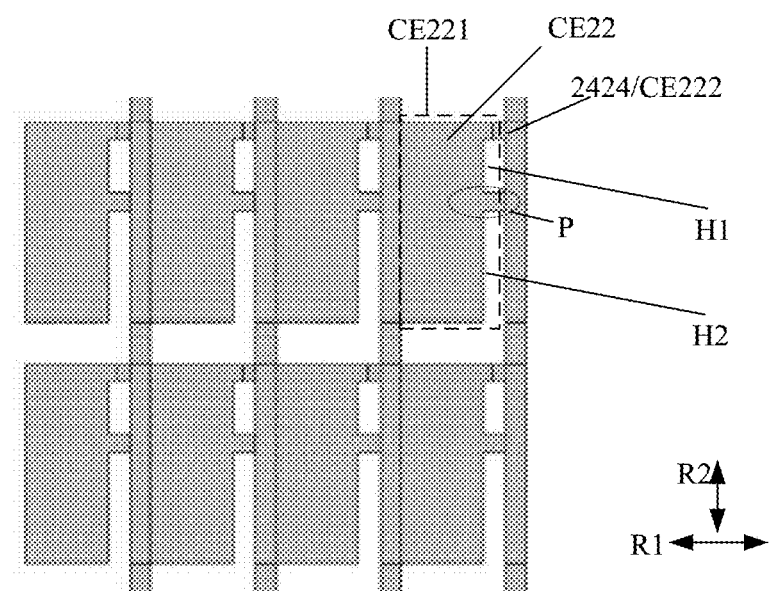
Figure 4G:
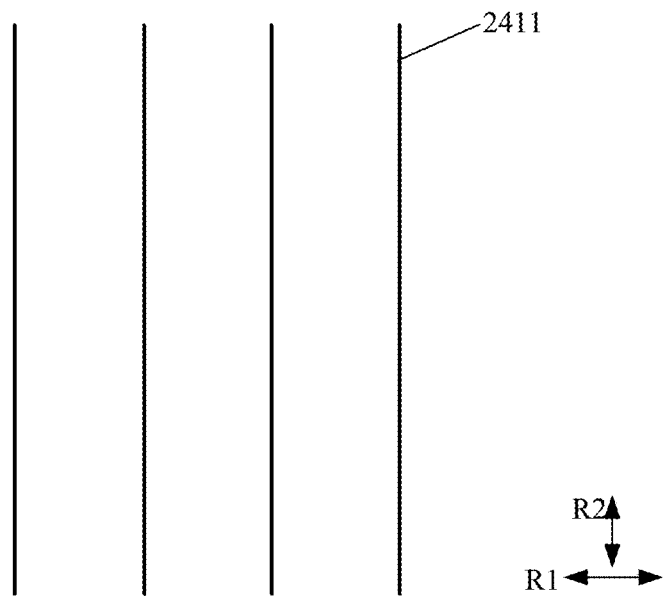
Figure 4H:
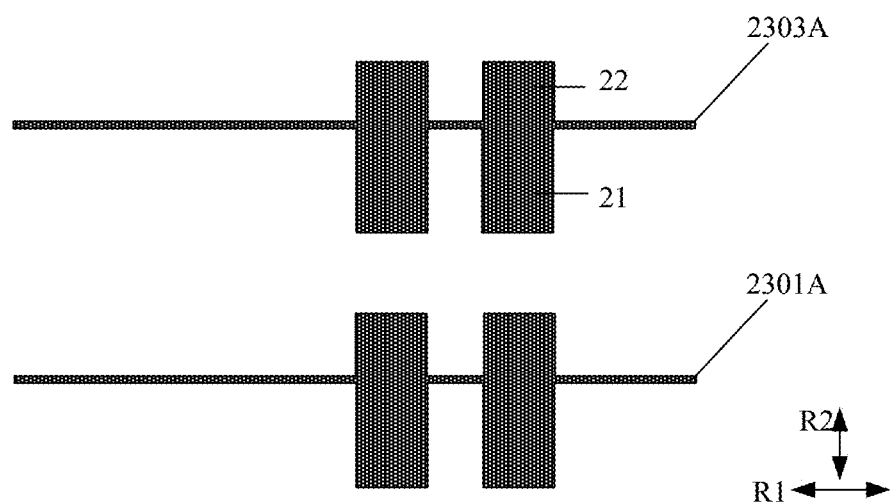
FIG. 4H is a schematic diagram of a first electrode plate of a first compensation capacitor of another display substrate provided by an embodiment of the present disclosure.

FIG. 4H is a schematic diagram of the first electrode plate of the first compensation capacitor of another display substrate provided by at least one embodiment of the present disclosure. As shown in FIG. 4H, the first electrode plate CE11 of the first compensation capacitor COM1 includes a first extension portion 21 and a second extension portion 22. The first extension portion 21 is connected with the first portion 2301A of the first signal line 2303, extends from the first portion 2301A of the first signal line 2303, and is at a first side of the first portion 2301A of the first signal line 2303 in a second direction R2. The second direction R2 intersects with the first direction R1, for example, the second direction R2 is perpendicular to the first direction R1, which is not limited to this case. The second extension portion 22 is connected with the first portion 2301A of the first signal line 2303, extends from the first portion 2301A of the first signal line 2303, and is at a second side of the first portion 2301A opposite to the first side in the second direction R2. Therefore, the area of the first electrode plate of the first compensation capacitor can be increased, and a larger compensation range can be provided as required.

For example, the first extension portion 21, the second extension portion 22, and the first portion 2301A of the first signal line 2303 are integral.

For example, the display substrate further includes a first power supply line. The first power supply line is connected with the first voltage terminal, is configured to provide a first power supply voltage to the pixel circuit, and is connected with the second electrode plate CE2 of the storage capacitor CST. The first power supply line includes a plurality of first sub-routing lines extending along the first direction and a plurality of second sub-routing lines extending along the second direction, and the plurality of second sub-routing lines are electrically connected with the plurality of first sub-routing lines. The first part of second sub-routing lines 2424 among the plurality of second sub-routing lines passes through the inter-opening region 2014 and passes through the first virtual sub-pixel 11. As shown in FIG. 4F, the second electrode plate CE22 of the second compensation capacitor COM2 includes a first portion CE221 and a second portion CE222. The first part of second sub-routing lines 2424 is arranged in a same layer as the first portion CE221 of the second electrode plate of the second compensation capacitor and is electrically connected with the first portion CE221, so as to serve as the second portion CE222 of the second electrode plate of the second compensation capacitor, and the first part of second sub-routing lines 2424 is electrically connected with the second electrode plate CE12 of the first compensation capacitor COM1, thereby realizing the electrical connection between the second electrode plate CE22 of the second compensation capacitor COM2 and the second electrode plate CE12 of the first compensation capacitor COM1.

For example, the first portion of the second sub-routing line 2424 is integral with the second electrode plate CE22 of the second compensation capacitor COM2.

Figure 4I:
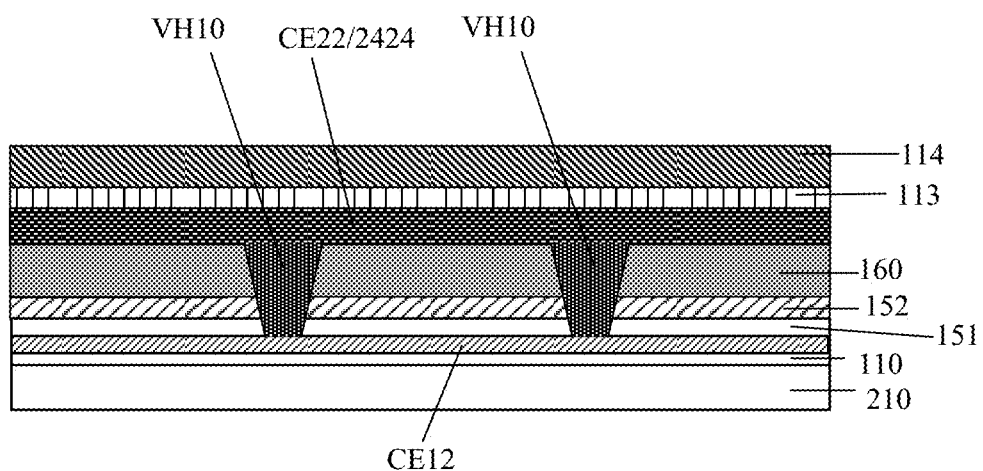
FIG. 4I is a schematic cross-sectional view taken along the line A3-B3 in FIG. 4A.

FIG. 4I is a schematic cross-sectional view taken along the line A3-B3 in FIG. 4A. For example, as shown in FIG. 4I, the display substrate 20 further includes a first insulation layer 151 (e.g., the first gate insulation layer mentioned above) between the second electrode plate CE12 of the first compensation capacitor COM1 and the gate electrode 121, a second insulation layer 152 (e.g., the second gate insulation layer mentioned above) between the gate electrode 121 and the first electrode plate CE11 of the first compensation capacitor COM1, and a third insulation layer 160 (for example, the interlayer insulation layer mentioned above) between the first electrode plate CE11 of the first compensation capacitor COM1 and the second electrode plate CE22 of the second compensation capacitor COM2. The first part of the second sub-routing lined 2424 is electrically connected with the second electrode plate CE12 of the first compensation capacitor COM1 through a first via hole VH10 which penetrates through the first insulation layer 151, the second insulation layer 152, and the third insulation layer 160 and exposes the second electrode plate CE12 of the first compensation capacitor COM1.

For example, as shown in FIG. 2C, the display substrate 20 further includes a plurality of second signal lines 24. The plurality of second signal lines 24 are configured to provide a second display signal to the plurality of sub-pixels. The first part of second signal lines 2411 among the plurality of second signal lines 24 passes through the inter-opening region 2014 and passes through the first virtual sub-pixel 11 along the second direction R2. Combining FIG. 4B, the first part of second signal lines 2411 is on a side of the second electrode plate CE22 of the second compensation capacitor COM2 away from the base substrate 210. With reference to FIG. 4A and FIG. 4B, the first portion 21 of the second electrode plate CE22 of the second compensation capacitor COM2 has a hollow region H1, and an orthographic projection of, the first part of second signal lines 2411 which pass through the first virtual sub-pixel 11 where the second electrode plate CE22 of the second compensation capacitor COM2 is located, on the base substrate 210, at least partially overlaps with an orthographic projection of the hollow region H1 on the base substrate 210, so as to reduce the overlapping area of the first part of second signal lines 2411 and the second electrode plate CE22 of the second compensation capacitor COM2, thereby reducing the load of the first part of second signal lines 2411.

For example, referring to FIG. 4A and FIG. 4B, the second electrode plate CE22 of the second compensation capacitor COM2 has a plurality of the hollow regions H1/H2. In the present embodiment, the case that the second electrode plate CE22 includes two hollow regions H1 is taken as an example, and the plurality of hollow regions are arranged at intervals along the second direction R2. Therefore, the load of the first part of second signal lines 2411 can be adjusted by gradient according to different needs.

For example, referring to FIG. 4A and FIG. 4F, a plurality of hollow regions include a first hollow regions H1 and a second hollow regions H2 that are adjacent to each other. The length of the first hollow regions H1 in the second direction R2 is different from the length of the second hollow regions H2, and the load of the first part of second signal lines 2411 can be adjusted differently according to the different loads of different portions of each second signal line 2411 among the first part of second signal lines 2411.

For example, with reference to FIG. 4A and FIG. 4F, a portion P of the second electrode plate CE22 of the second compensation capacitor COM2 between the first hollow region H1 and the second hollow region H2 is continuous along the first direction R1. The second electrode plate CE22 of the second compensation capacitor COM2 includes a first edge and a second edge that are opposite to each other in the second direction R2, and at least one selected from a group consisting of the first edge and the second edge is disconnected (broken) by the hollow region.

For example, the first signal line includes a gate scan signal line and a reset signal line. For example, the first signal line 2303 includes a gate scan signal line and is configured to provide a gate scan signal to the sub-pixels, and correspondingly, the first display signal is a gate scan signal. The first signal line 2301 includes a reset signal line and is configured to provide a reset voltage signal to the sub-pixels, and correspondingly, the first display signal is a reset voltage signal. For example, the second signal line 24 is a data line and is configured to provide a data signal, for controlling the emission gray scale of the sub-pixels, to the sub-pixels.

For example, in some embodiments, in a first virtual sub-pixel 11, the second electrode plate CE12 of the first compensation capacitor COM1 covers an entirety of the first virtual sub-pixel 11, and an orthographic projection of the first electrode plate CE11 of the first compensation capacitor COM1 on the base substrate 210 is located within an orthographic projection of the second electrode plate CE12 of the first compensation capacitor COM1 on the base substrate 210. The size of the first compensation capacitor COM1 is smaller than the size of the second compensation capacitor COM2. In addition, the effective size of each electrode plate of the first compensation capacitor COM1 and the second compensation capacitor COM2 may be adjusted as required to adjust the capacity of the first compensation capacitor COM1 and the capacity of the second compensation capacitor COM2.

Figure 4J:
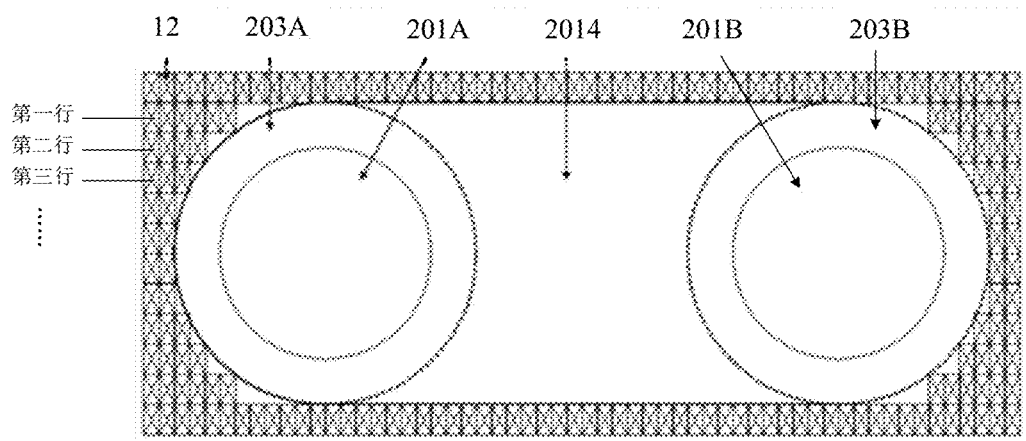
FIG. 4J is a partial view of a display substrate.

For example, as shown in FIG. 2A and FIG. 2B, the display region 201 includes a first display region 2011 and a second display region 2012. The first display region 2011 is located at the side of the first opening region 202A away from the inter-opening region 2014. The second display region 2012 is located at the side of second opening region 202B away from inter-opening region 2014. Both the first display region 2011 and the second display region 2012 include a plurality of pixels. As shown in FIG. 4J, the whole of the first display region 2011 and the second display region 2012 includes a plurality of pixel rows extending along the first direction R1, such as a first row, a second row, a third row. etc. The plurality of pixel rows are disconnected (broken) by the whole of the first opening region 202A, the inter-opening region 2014, and the second opening region 202B. For example, the number of pixels in the first row is different from the number of pixels in the second row, and the number of first compensation capacitors in the first virtual pixel row corresponding to the first row of pixels is different from the number of first compensation capacitors in the second virtual pixel row corresponding to the second row of pixels so as to make the loads of first signal lines in different rows of pixels uniform.

As shown in FIG. 2B, the first signal line 2303 sequentially passes through the first display region 2011, the first opening peripheral region 203A, the inter-opening region 2014, the second opening peripheral region 203B, and the second display region 2012 along the first direction R1. The first signal line 2303 further includes a second portion 2303B passing through the first display region 2011 and a third portion 2303C passing through the second display region 2012, and the second portion 2303B and the third portion 2303C are arranged in the same layer as the gate electrode 121. Therefore, the second portion 2303B and the first portion 2303A need to undergo a layer change so that the second portion 2303B and the first portion 2303A are respectively in different layers, and the first portion 2303A and the third portion 2303C need to undergo a layer change so that the first portion 2303A and the third portion 2303C are respectively in different layers.

Figure 5A:
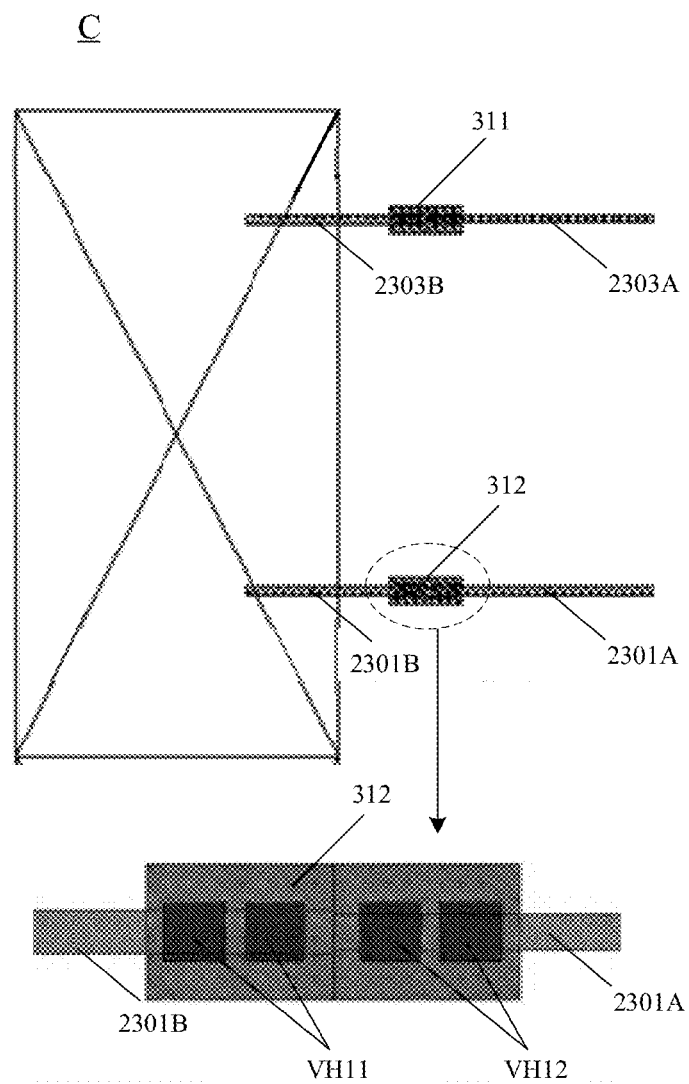
FIG. 5A is an enlarged schematic diagram of the portion C in FIG. 2C.
Figure 5B:
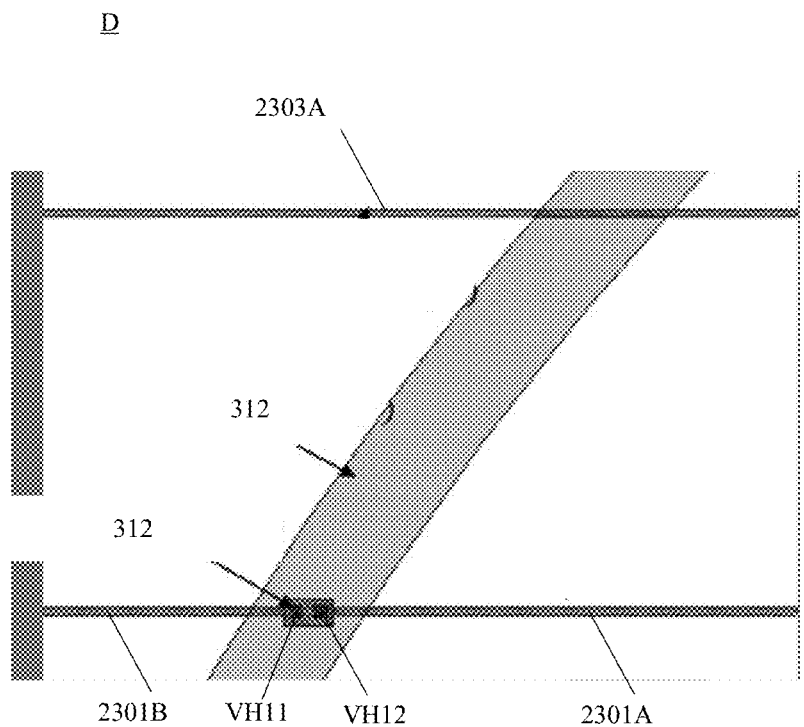
FIG. 5B is an enlarged schematic diagram of the portion D in FIG. 2C.
Figure 5C:
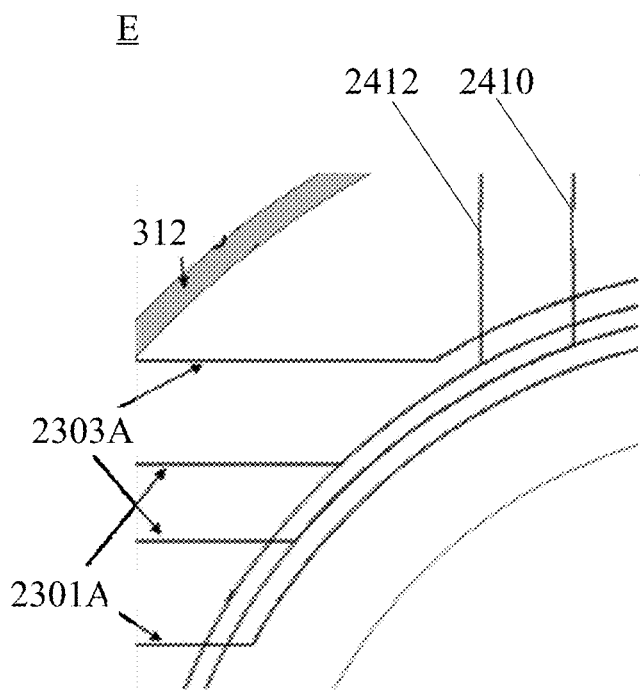
FIG. 5C is an enlarged schematic diagram of the portion E in FIG. 2C.
Figure 5D:
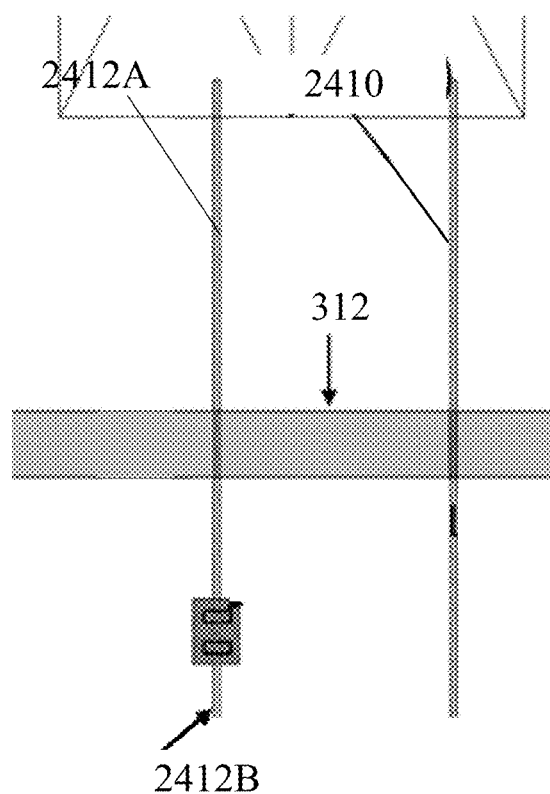
FIG. 5D is an enlarged schematic diagram of the portion F in FIG. 2C.
Figure 5E:
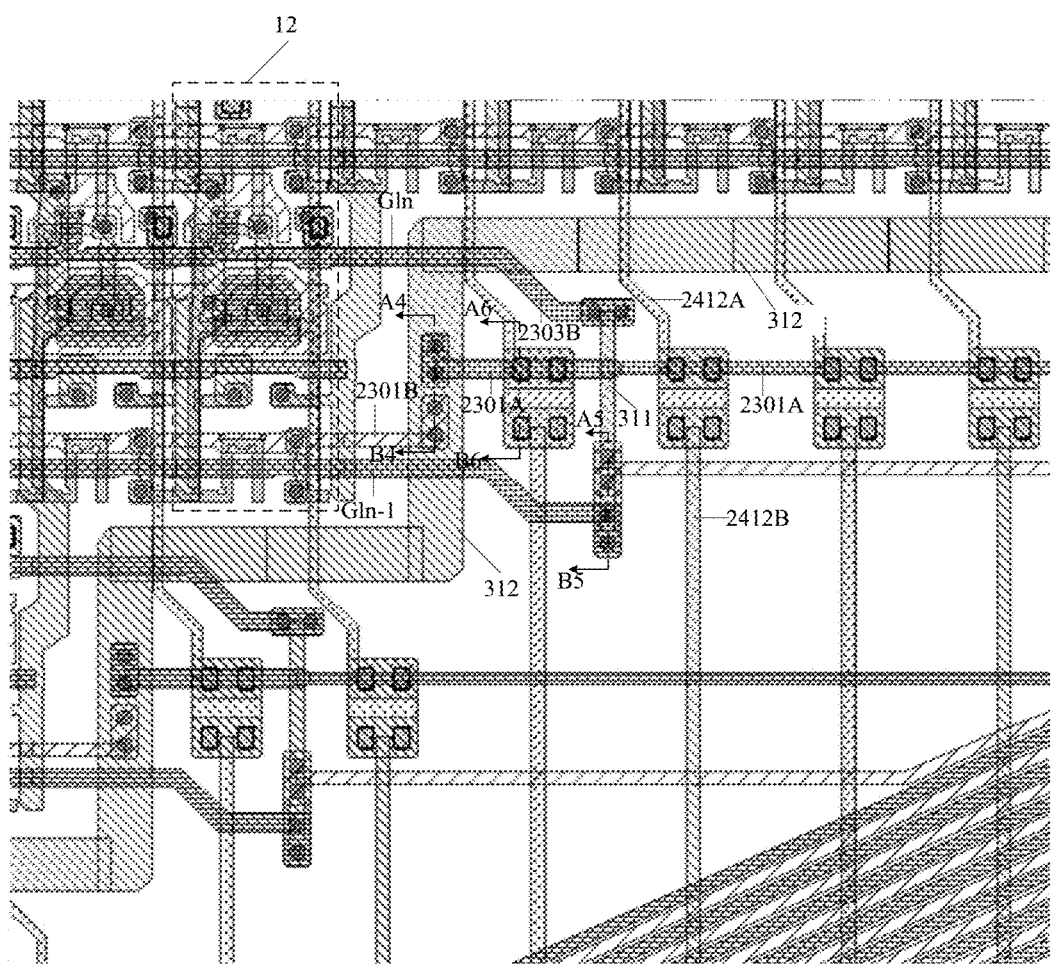
FIG. 5E is an enlarged schematic diagram of the area where a first signal line and a second signal line undergo a layer change.
Figure 5F:
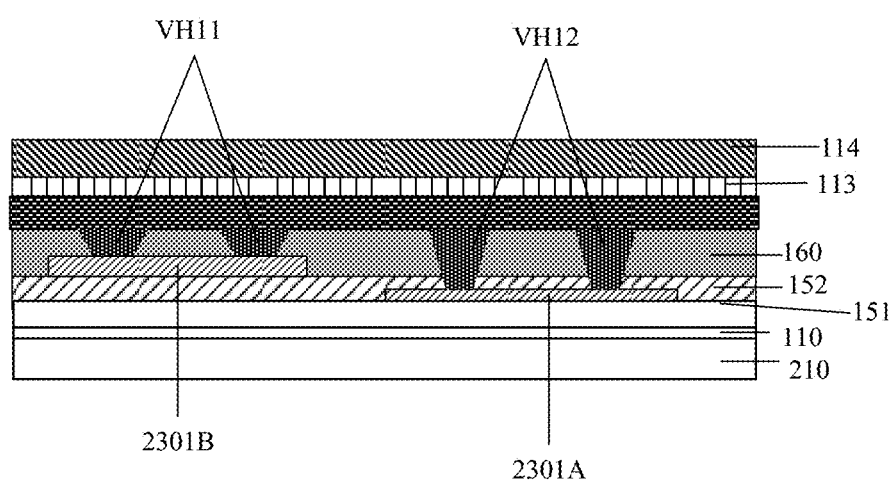
FIG. 5F-FIG. 5H are schematic cross-sectional views respectively taken along the line A4-B4, the line A5-B5, and the line A6-B6 in FIG. 5E.
Figure 5G:
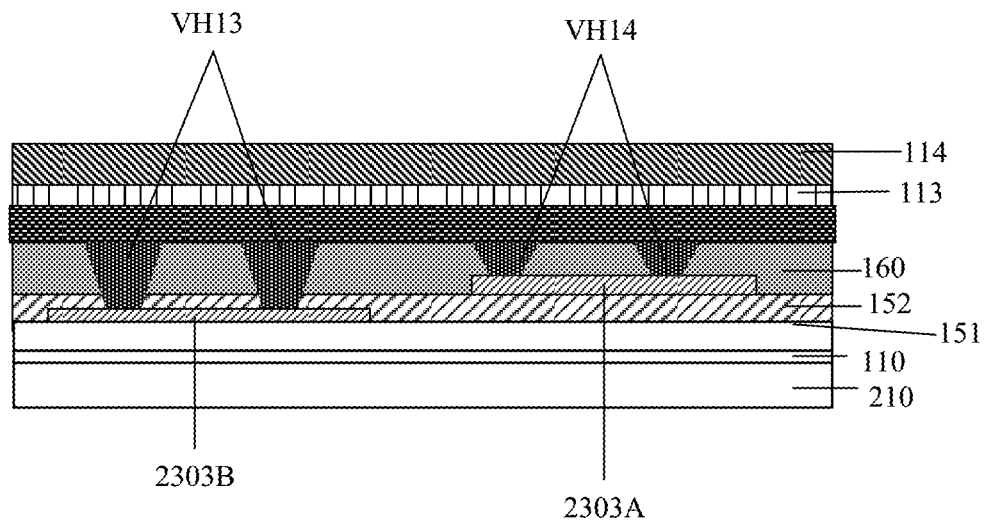
Figure 5H:
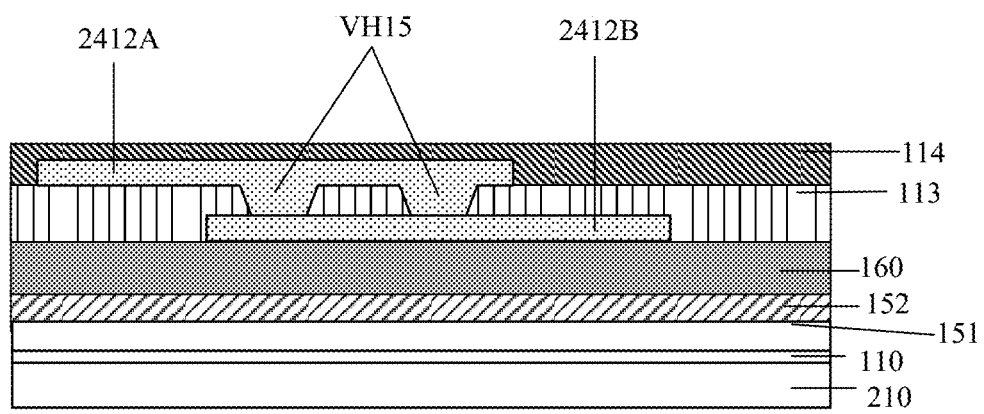

FIG. 5A is an enlarged schematic diagram of the portion C in FIG. 2C, FIG. 5B-FIG. 5D are enlarged schematic diagrams of the portion D, the portion E, and the portion F in FIG. 2C, FIG. 5E is an enlarged schematic diagram of the region where the first signal line and the second signal line undergo a layer change, and FIG. 5F-FIG. 5H are cross-sectional schematic diagrams taken along the line A4-B4, the line A5-B5, and the line A6-B6 in FIG. 5E, respectively.

Referring to FIG. 5A-FIG. 5B, and FIG. 5E, the display substrate 20 further includes a first connection structure, for example, the first connection structure includes a first sub-connection structure 311 and a second sub-connection structure 312. For example, the first connection structures 311/312 are located in the first opening peripheral region 203A, for example, at the junction position of the first opening peripheral region 203A and the first display region 2011, and are arranged in different layers from both the second portion 2303B/2301B of the first signal line and the first portion 2303A/2301A of the first signal line. The second portion 2303B/2301B of the first signal line are respectively electrically connected with the first connection structures 311/312, and first portions 2303A/2301A of the first signal line are respectively electrically connected with the first connection structures 311/312, thus realizing the layer change at the position where the first signal lines 2303/2301 enter the first opening peripheral region 203A from the first display region 2011.

For example, the first signal line 2303 is a gate scan signal line and the first signal line 2301 is a reset signal line. With reference to FIG. 5E and FIG. 5F, the second portion 2301B of the reset signal line is arranged in a different layer from the first portion 2301A of the reset signal line, and the second portion 2301B of the reset signal line is electrically connected with the second sub-connection structure 312 through the via hole VH11. The first portion 2301A of the reset signal line is electrically connected with the second sub-connection structure 312 through the via hole VH12, so that the second portion 2301B of the reset signal line is electrically connected with the first portion 2301A of the reset signal line, and the reset signal line 2301 surrounds the first opening after the layer change.

Similarly, with reference to FIG. 5E and FIG. 5G, the second portion 2303B of the gate scan signal line is arranged in a different layer from the first portion 2303A of the gate scan signal line, and the second portion 2303B of the gate scan signal line is electrically connected with the first sub-connection structure 311 through a via hole VH13. The first portion 2303A of the gate scan signal line is electrically connected with the first sub-connection structure 311 through a via hole VH14, so that the second portion 2303B of the gate scan signal line is electrically connected with the first portion 2303A of the gate scan signal line, and the gate scan signal line 2303 surrounds the first opening after the layer change.

For example, the first connection structure and the second connection structure are arranged in a same layer as the source electrode and the drain electrode 122/123.

The display substrate 20 further includes a second connection structure. For example, the second connection structure is located at the second opening peripheral region 203B, for example, at the junction position of the second opening peripheral region 203B and the first display region. The second connection structure is in a different layer from the first portion 2303A/2301A of the first signal line and the third portion 2303C/2301C of the first signal line. The first portion 2303A/2301A of the first signal line is electrically connected with the second connection structure (not shown in the figure), and the third portion 2303C/2301C of the first signal line is electrically connected with the second connection structure, so that the layer where the first signal line 2303 is located is changed again, that is, the layer change is performed at the position where the first signal line 2303 enters the second display region 2012 from the second opening peripheral region 203B. For example, the second connection structure includes a third sub-connection structure and a fourth sub-connection structure that are respectively arranged corresponding to the gate scan signal line 2303 and the reset signal line 2301, and are respectively configured for realizing another layer change of the gate scan signal line 2303 and the reset signal line 2301. For example, the arrangement mode of the third sub-connection structure and the fourth sub-connection structure can refer to the arrangement mode of the first sub-connection structure and the second sub-connection structure. For example, in some embodiments, the third sub-connection structure and the fourth sub-connection structure are substantially symmetrical with the first sub-connection structure and the second sub-connection structure.

For example, as shown in FIG. 5E, the first gate line GLn and the second gate line GLn−1, which provide gate scan signals to a same row of sub-pixels 12, undergo a layer change through one same first sub-connection structure 311 to save space. For example, reset signal lines that provide reset voltage signals to a plurality of rows of sub-pixels undergo a layer change by one same second connection structure 312 to save space. For example, the one same second connection structure 312 passes along the junctional region between the first display region and the peripheral region of the first opening an is a fold line, so as to reasonably utilize the space and leave enough space for setting other structures such as the first connection structure and the second connection structure. Of course, in other embodiments, the layer change may be performed by a plurality of second connection structures 312 separated from each other.

With reference to FIG. 5C-FIG. 5D, and FIG. 5E, a part of second signal lines 2410 enters the peripheral region of the first opening from the display region (the same is true for the second opening, taking the first opening as an example), and are always located at the side of the source electrode and the drain electrode 122/123 away from the base substrate 210, and no layer change is performed on this part of second signal lines 2410. A part of second signal lines 2412 enters the peripheral region of the first opening from the display region (the same is true for the second opening, taking the first opening as an example), and the second signal line 2412 includes a first portion 2412A passing through the display region and a second portion 2412B passing through the first opening peripheral region 203A; the first portion 2412A of the second signal line 2412 is located at the side of the source electrode/the drain electrode 122/123 away from the base substrate 210, and the second portion 2412B of the second signal line 2412 is arranged in the same layer as the source electrode/the drain electrode 122/123. Therefore, the second signal line 2412 needs to undergo a layer change.

With reference to FIG. 5E and FIG. 5H, the first portion 2412A of the second signal line 2412 is directly connected with the second portion 2412B of the second signal line 2412 through a via hole VH15 passing through the insulation layer 113, and no additional connection electrode is required to simplify the manufacturing process of the display substrate.

For example, the data line 2410 without the layer change is adjacent to the data line 2412 with the layer change in the first direction.

Figure 6:
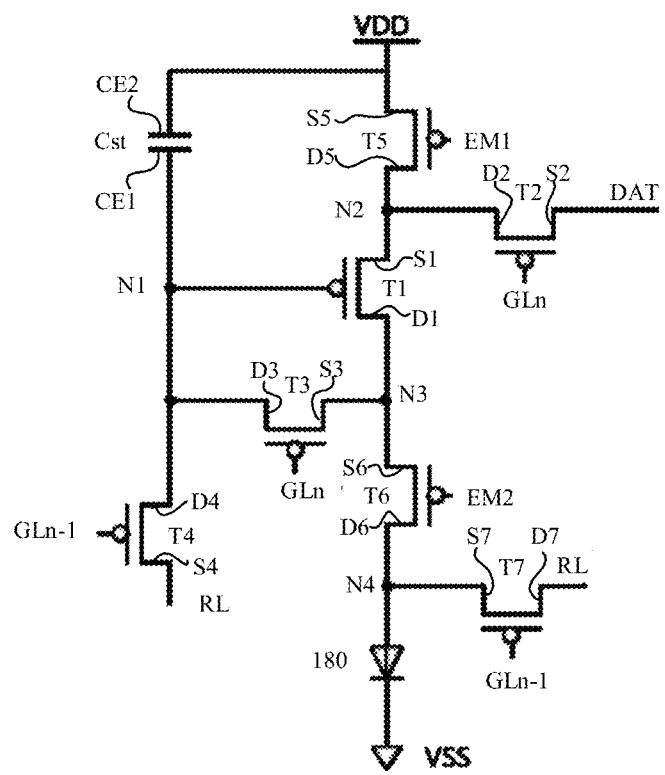
FIG. 6 is an equivalent circuit diagram of a pixel circuit in an array substrate provided by an embodiment of the present disclosure.
Figure 7A:
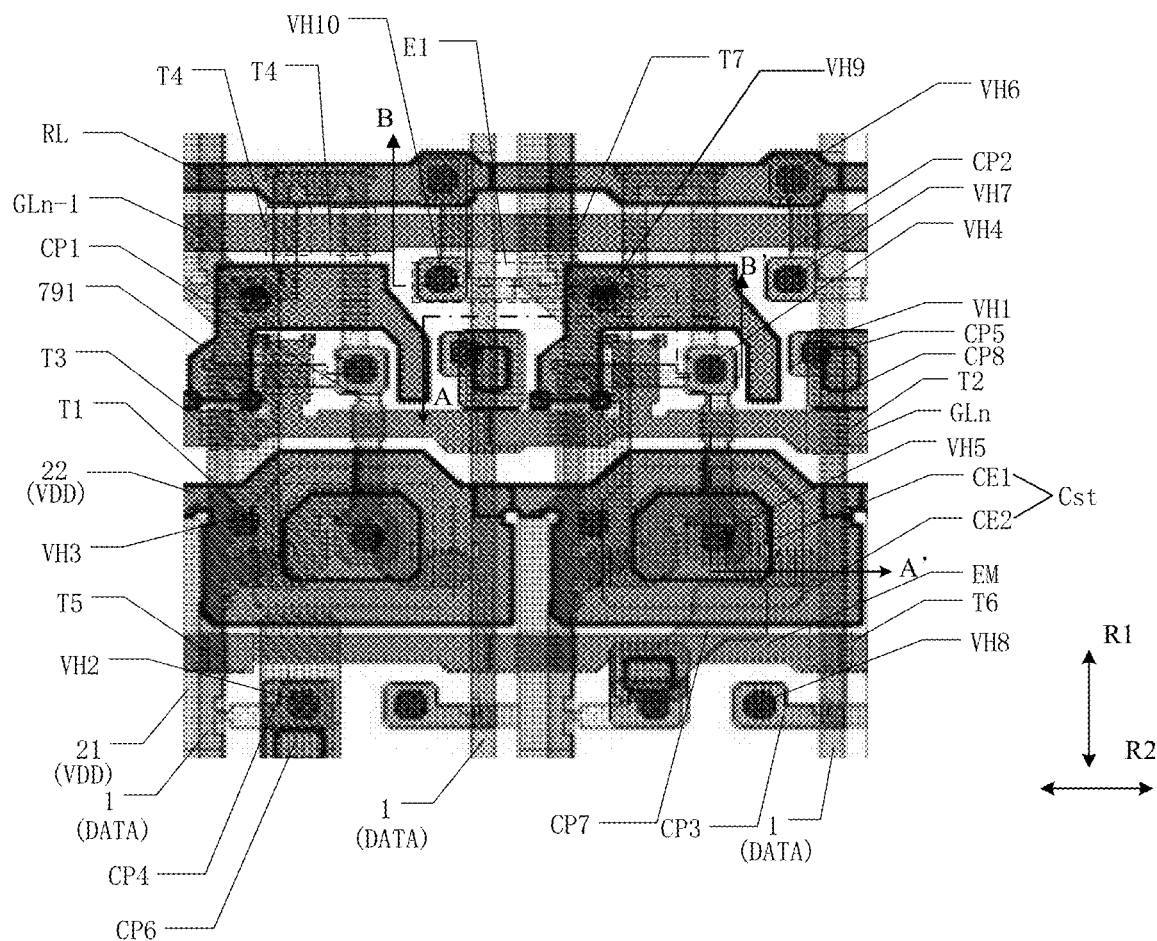
FIG. 7A is a schematic planar layout diagram of a pixel circuit in an array substrate provided by an embodiment of the present disclosure.

FIG. 6 is an equivalent circuit diagram of a pixel circuit in an array substrate provided by an embodiment of the present disclosure; FIG. 7A is a schematic planar layout diagram of a pixel circuit in an array substrate provided by an embodiment of the present disclosure. FIG. 7A takes the layer structure of pixel circuits in two adjacent sub-pixels as an example.

The data line 1 below is an example of the second signal line 24 described above.

Each of the plurality of sub-pixels 1030 includes a pixel circuit, and the pixel circuit includes a light-emitting device, a storage capacitor CST, a drive transistor T1 (hereinafter referred to as the first transistor), and a data writing transistor T2 (hereinafter referred to as the second transistor), as well as a data line 1 and a first connection structure CP1. Each of the drive transistor T1 and the data writing transistor includes an active layer, a gate electrode, a first electrode, and a second electrode, and the drive transistor T1 is configured to control the light-emitting device to emit light, for example, to control a drive current for driving the light-emitting device to emit light. The data line 1 is connected with the first electrode of the data writing transistor T2 and configured to supply the data writing transistor T2 with a data signal for controlling the display gray scale of the sub-pixel 1030. The data writing transistor T2 is configured to write a data signal to the gate electrode of the drive transistor T1 in response to a first scan signal applied to the gate electrode of the data writing transistor T2. The first connection structure CP1 is connected with the gate electrode of the drive transistor T1 and the first electrode plate of the storage capacitor CST. The first connection structure CP1 and the data line 1 are arranged in different layers, that is, the first connection structure CP1 and the data line 1 are respectively arranged in different layers, and an insulation layer exists between the first connection structure CP1 and the data line 1 in the direction perpendicular to the base substrate 210. In the pixel circuits shown in FIG. 6 and FIG. 7A, under the case where the first connection structure CP1 and the data line 1 are arranged in a same layer, the distance between the first connection structure CP1 and the data line 1 is small, which leads to a large parasitic capacitance between the first connection structure CP1 and the data line 1 in the transverse direction, and especially in the high-resolution display panel, this phenomenon is particularly serious. This parasitic capacitance directly leads to an unsatisfactory display effect. And the parasitic capacitance formed between the first connection structure CP1 and the data line 1 is unstable, because the data signal on the data line 1 is constantly changing during the display process as the data signal is written into the gate of the driving transistor T1, that is, the data signal is written into the Node N1 in FIG. 6, thereby causing the Node N1 signal to jump, thus affecting the fluctuation of the current flowing through the Node N1 and affecting the display effect. The first connection structure CP1 is the actual structure corresponding to the Node N1 in FIG. 6. Therefore, in the array substrate provided by the embodiments of the present disclosure, the parasitic capacitance formed between the first connection structure CP1 and the data line 1 can be reduced or avoided, thereby improving or avoiding the adverse effects on the display effect and achieving a more ideal display effect.

It should be noted that because of the array arrangement of pixels, the parasitic capacitance (hereinafter referred to as parasitic capacitance 1) is formed between the data line 1 and the first connection structure CP1 corresponding to the same sub-pixel 1030, and the parasitic capacitance (hereinafter referred to as parasitic capacitance 2) is also formed between the data line 1 and the first connection structure CP1 corresponding to two adjacent sub-pixels. According to the simulation test, in the case where the first connection structure CP1 and the data line 1 are arranged on the same layer, the value of the parasitic capacitance 1 can reach 0.07971 fF, and the value of the parasitic capacitance 2 can reach 0.05627 fF, and the crosstalk degree between the first connection structure CP1 and the data line 1 is 0.678%. The larger the value of crosstalk degree, the greater the interference and the greater the adverse effect on display.

In the array substrate provided by the embodiments of the present disclosure, the value of the parasitic capacitance 1 is about 0.0321 fF, and the value of parasitic capacitance 2 can reach 0.0242 fF, and the crosstalk degree between the parasitic capacitance 1 and the parasitic capacitance 2 to the Node N1 is 0.218%. It can be seen that the values of parasitic capacitance 1 and parasitic capacitance 2 in the array substrate provided by the embodiments of the present disclosure are obviously reduced compared with the case where the parasitic capacitance 1 and the parasitic capacitance 2 are arranged in the same layer, and the crosstalk degree generated to the Node N1 is obviously reduced, so that the adverse effects on the display are obviously improved.

As shown in FIG. 6, in some embodiments, the pixel circuit includes a plurality of thin film transistors: a first transistor T1, a second transistor T2, a third transistor T3, a fourth transistor T4, a fifth transistor T5, a sixth transistor T6, and a seventh transistor T7, a plurality of signal lines connected to the thin film transistors T1, T2, T3, T4, T5, T6, and T7, and a storage capacitor CST, that is, the pixel circuit in the present embodiment includes a 7T1C structure. Accordingly, the plurality of signal lines include gate lines GLn/GLn−1 (i.e., scan signal lines), light-emitting control lines EM, reset signal lines RL, data lines DAT, and first power supply lines VDD. The gate lines GLn/GLn−1 may include a first gate line GLn and a second gate line GLn−1. For example, the first gate line GLn is configured to transmit the gate scan signal, and the second gate line GLn−1 is configured to transmit the reset voltage signal. The light-emitting control line EM is configured to transmit the light-emitting control signal, for example, is connected to the first light-emitting control terminal EM1 and the second light-emitting control terminal EM2. The gate electrode of the fifth transistor T5 is connected with the first light-emitting control terminal EM1 or serves as the first light-emitting control terminal EM1 to receive the first light-emitting control signal. The gate electrode of the sixth transistor T6 is connected with the second light-emitting control terminal EM2 or is used as the second light-emitting control terminal EM2 to receive the second light-emitting control signal.

It should be noted that the embodiments of the disclosure include but are not limited to the pixel circuit with the 7T1C structure described above, and the pixel circuit can also adopt other types of circuit structures, such as 7T2C structure or 9T2C structure, and the embodiments of the disclosure are not limited to this.

For example, as shown in FIG. 6, the first gate electrode of the first thin film transistor T1 is electrically connected with the third drain electrode D3 of the third thin film transistor T3 and the fourth drain electrode D4 of the fourth thin film transistor T4. The first source electrode S1 of the first thin film transistor T1 is electrically connected with the second drain electrode D2 of the second thin film transistor T2 and the fifth drain electrode D5 of the fifth thin film transistor T5. The first drain electrode D1 of the first thin film transistor T1 is electrically connected with the third source electrode S3 of the third thin film transistor T3 and the sixth source electrode S6 of the sixth thin film transistor T6.

For example, as shown in FIG. 6, the second gate electrode of the second thin film transistor T2 is configured to be electrically connected with the first gate line GLn to receive the gate scan signal. The second source electrode S2 of the second thin film transistor T2 is configured with be electrically connected with the data line DAT to receive the data signal. The second drain electrode D2 of the second thin film transistor T2 is electrically connected with the first source electrode S1 of the first thin film transistor T1.

For example, as shown in FIG. 6, the third gate electrode of the third thin film transistor T3 is configured to be electrically connected with the first gate line GLn. The third source electrode S3 of the third thin film transistor T3 is electrically connected with the first drain electrode D1 of the first thin film transistor T1. The third drain electrode D3 of the third thin film transistor T3 is electrically connected with the first gate electrode of the first thin film transistor T1.

For example, as shown in FIG. 6, the fourth gate electrode of the fourth thin film transistor T4 is configured to be electrically connected with the second gate line GLn−1 to receive the reset voltage signal. The fourth source electrode S4 of the fourth thin film transistor T4 is configured to be electrically connected with the reset signal line RL to receive the reset voltage signal. The fourth drain electrode D4 of the fourth thin film transistor T4 is electrically connected with the first gate electrode of the first thin film transistor T1.

For example, as shown in FIG. 6, the fifth gate electrode of the fifth thin film transistor T5 is configured to be electrically connected with the light-emitting control line EM to receive the light-emitting control signal, the fifth source electrode S5 of the fifth thin film transistor T5 is configured to be electrically connected with the first power supply line VDD to receive the first power supply signal, and the fifth drain electrode D5 of the fifth thin film transistor T5 is electrically connected with the first source electrode S1 of the first thin film transistor T1.

Figure 7B:
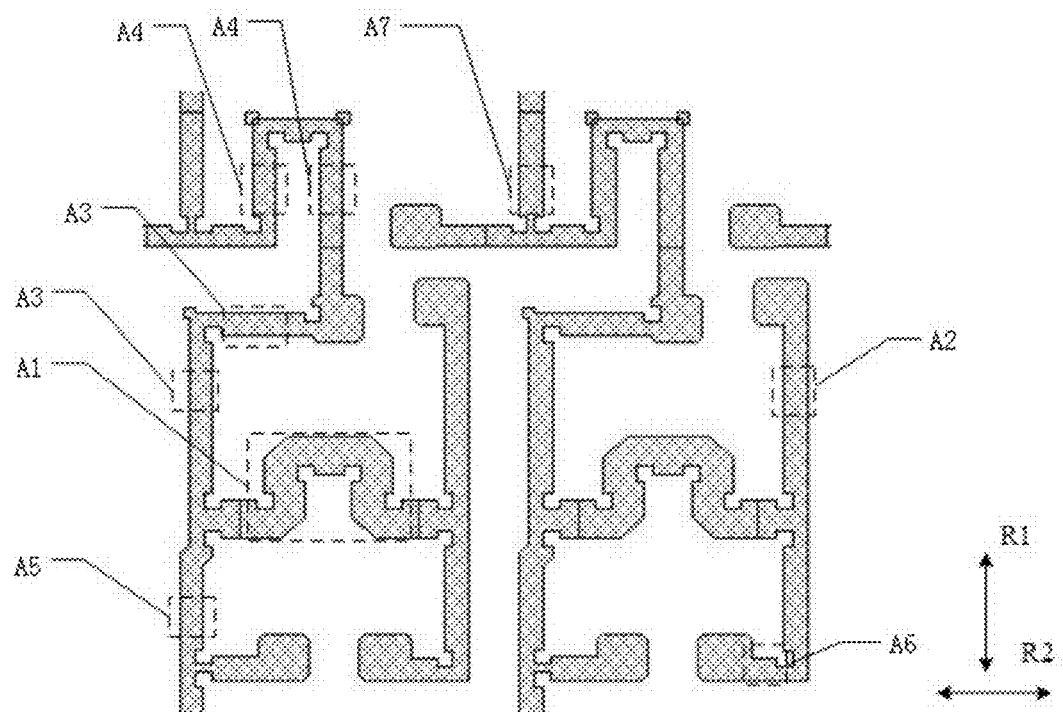
FIG. 7B-FIG. 7K are schematic diagrams of each layer of the pixel circuit of an array substrate provided by an embodiment of the present disclosure.
Figure 7C:
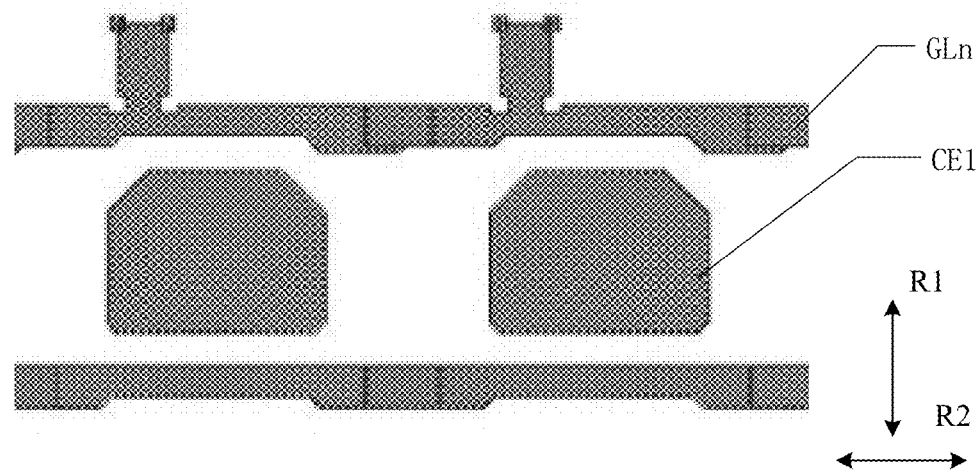

For example, as shown in FIG. 6, the sixth gate electrode of the sixth thin film transistor T6 is configured to be electrically connected with the light-emitting control line EM to receive the light-emitting control signal. A sixth source electrode S6 of the sixth thin film transistor T6 is electrically connected with the first drain electrode D1 of the first thin film transistor T1. The sixth drain electrode D6 of the sixth thin film transistor T6 is electrically connected with the first display electrode (for example, the anode 181 as shown in FIG. 6) of the light-emitting device (for example, the light-emitting device 180 as shown in FIG. 6). The thin film transistor TFT in FIG. 7A-FIG. 7C is the sixth thin film transistor T6.

For example, as shown in FIG. 6, the seventh gate electrode of the seventh thin film transistor T7 is configured to be electrically connected with the second gate line GLn−1 to receive the reset voltage signal. The seventh source electrode S7 of the seventh thin film transistor T7 is electrically connected with the first display electrode (for example, the anode 181 as shown in FIG. 6) of the light-emitting device. A seventh drain electrode D7 of the seventh thin film transistor T7 is configured to be electrically connected with the reset signal line RL to receive a reset voltage signal. For example, the seventh drain electrode D7 of the seventh thin film transistor T7 may be electrically connected with the reset signal line RL by being connected with the fourth source electrode S4 of the fourth thin film transistor T4.

In the present embodiment, the fourth transistor T4 and the seventh transistor T7 are reset transistors configured to provide reset signals to the sub-pixels.

It should be noted that the gate scan signal and the reset voltage signal may be a same signal.

It should be noted that the transistors adopted in the embodiments of the present disclosure can be thin film transistors, field effect transistors, or other switching devices with the same characteristics, and the thin film transistors can include oxide semiconductor thin film transistors, amorphous silicon thin film transistors, or polysilicon thin film transistors, etc. In the embodiment of the present disclosure, the first electrode of any transistor is the source electrode, and the second electrode is the drain electrode. Or, if the first electrode of any transistor is the drain electrode, the second electrode is the source electrode. The source electrode and the drain electrode of each transistor can be symmetrical in structure, so that the source electrode and the drain electrode of each transistor can be indistinguishable in physical structure. In the embodiments of the present disclosure, the electrode and the drain electrode of all or a portion of the transistors can be interchanged as required.

Figure 7D:
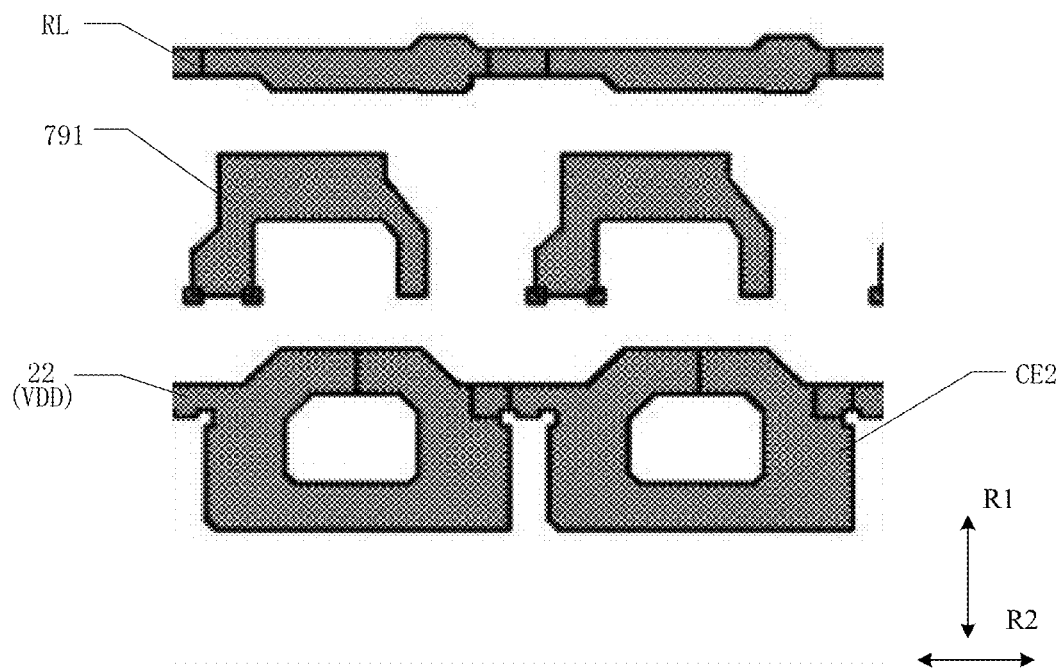
Figure 7E:
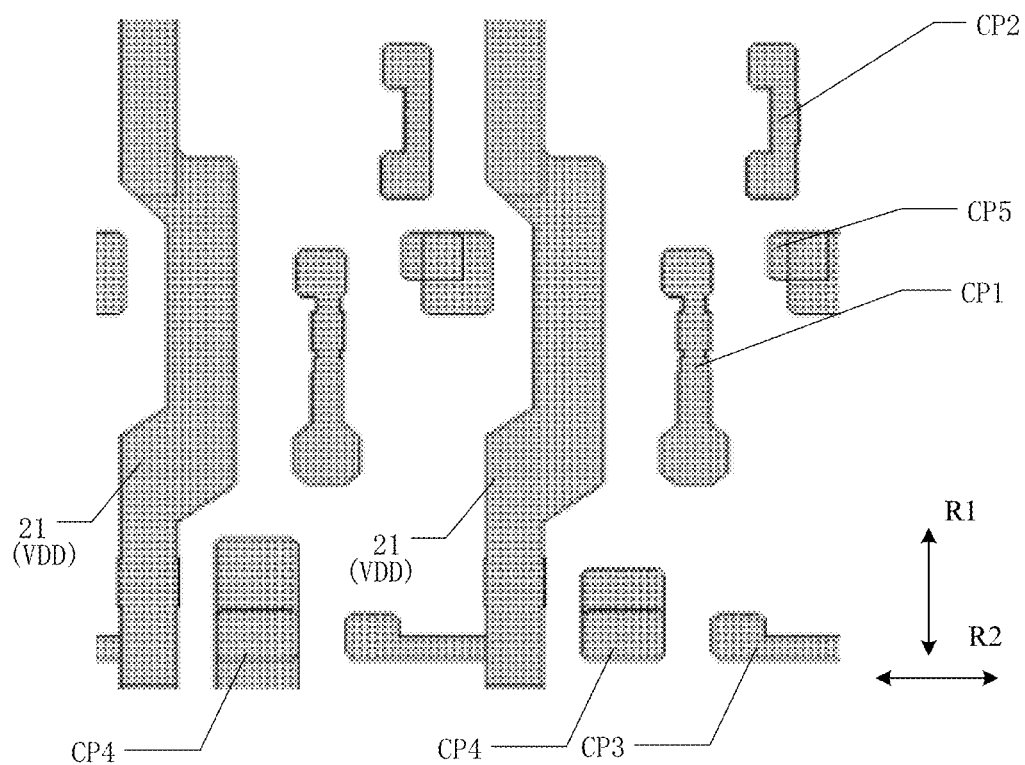
Figure 7F:
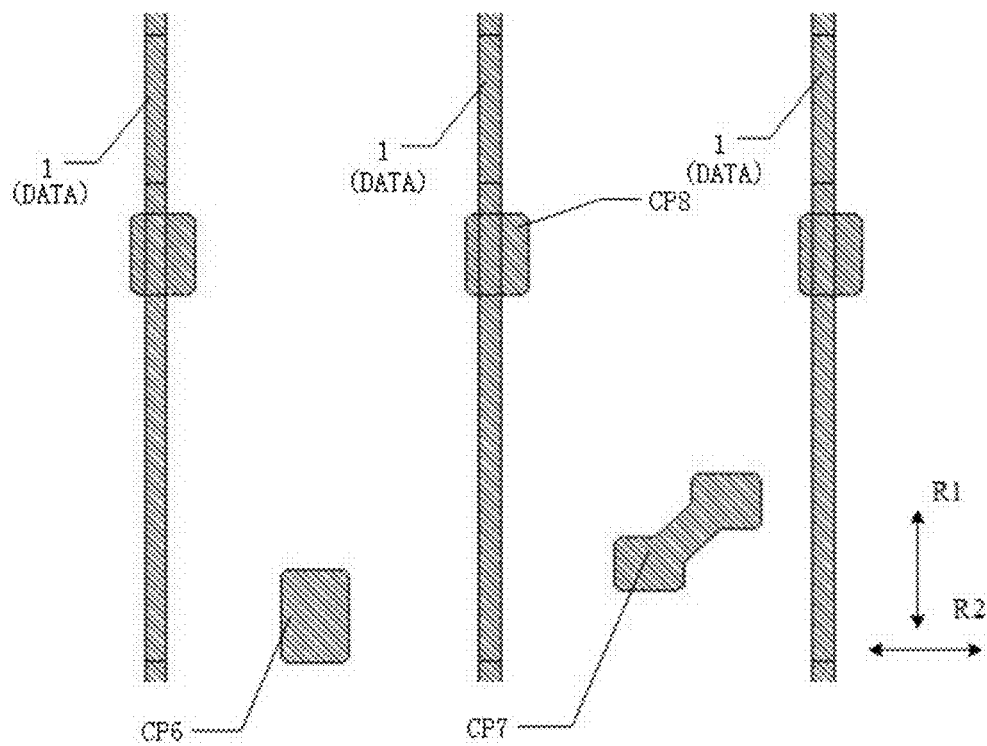

FIG. 7B-FIG. 7K are schematic diagrams of each layer of a pixel circuit of an array substrate provided by an embodiment of the present disclosure. FIG. 8A is a schematic cross-sectional view along the line A-A' in FIG. 7A.

In some embodiments, as shown in FIG. 7A, the pixel circuit includes the above-mentioned thin film transistors T3, T4, T5, T6, and T7, a storage capacitor CST, a first gate line GLn, a second gate line GLn−1, a light-emitting control line EM, a reset signal line RL, a data line DAT, and a first power supply line VDD connected with the plurality of thin film transistors T1, T2, T3, T4, T5, T6, and T7.

Next, with reference to FIG. 7A-FIG. 7K, and FIG. 8A, the specific features of the structure of the pixel circuit according to the embodiments of the present disclosure will be described.

As shown in FIG. 7A and FIG. 8A, the data line 1 and the first connection structure CP1 both extend along the first direction, and an orthographic projection of the first connection structure CP1 on the base substrate 210 and an orthographic projection of the data line 1 on the base substrate 210 are at least partially opposite to each other in the transverse direction R2, which is beneficial to the compactness of the pixel circuit structure. In this case, if the data line 1 and the first connection structure CP1 are arranged in a same layer, the parasitic capacitance between the data line 1 and the first connection structure CP1 will be particularly obvious. This arrangement provide by the embodiment of the present disclosure can not only improve or avoid the parasitic capacitance, but also realize the compactness of the pixel circuit structure, which is beneficial to realize the high resolution of the array substrate. The transverse direction R2 is parallel to the base substrate 210 and perpendicular to the first direction R1.

For example, a distance between the orthographic projection of the first connection structure CP1 on the base substrate 210 and the orthographic projection of the data line 1 on the base substrate 210 (the maximum distance between an edge of the orthographic projection of the first connection structure CP1 on the base substrate 210 close to the orthographic projection of the data line 1 on the base substrate 210 and an edge of the orthographic projection of the data line 1 on the base substrate close to the orthographic projection of the first connection structure CP1 on the base substrate 210) is less than the size of the one sub-pixel 1030 in the transverse direction, which is more conducive to the compactness of the pixel circuit structure, and even if the distance between the first connection structure CP1 and the data line 1 in the transverse direction R2 is small, the parasitic capacitance phenomenon will not occur. For example, a distance between the data line 1 and the first connection structure CP1 that correspond to one same sub-pixel 1030 is smaller than the size of one sub-pixel 1030 in the transverse direction R2, and a distance between the data line 1 and the first connection structure CP1 that respectively correspond to two adjacent sub-pixels is smaller than the size of one sub-pixel 1030 in the transverse direction R2. For example, the size of one sub-pixel 1030 in the transverse direction R2 is in a range of 30 μm to 90 μm.

Further, for example, an interval is between the orthographic projection of the first connection structure CP1 on the base substrate 210 and the orthographic projection of the data line 1 on the base substrate 210. Or, in some embodiments, there is basically no interval between the orthographic projection of the first connection structure CP1 on the base substrate 210 and the orthographic projection of the data line 1 on the base substrate 210. That is, the first connection structure CP1 and the data line 1 are basically connected, which is beneficial to the realization of a high resolution. In this case, the array substrate provided by the embodiments of the disclosure can prevent the phenomenon of the parasitic capacitance.

For example, the pixel circuit includes a semiconductor layer, a first conductive layer, a second conductive layer, and a third conductive layer. FIG. 7A shows a schematic layout diagram of a stacked positional relationship among a semiconductor layer, a first conductive layer, a second conductive layer, and a third conductive layer of pixel circuits.

FIG. 7B shows the semiconductor layer of a pixel circuit. For example, the semiconductor layer shown in FIG. 7B includes an active layer A1 of the first thin film transistor T1, an active layer A2 of the second thin film transistor T2, an active layer A3 of the third thin film transistor T3, an active layer A4 of the fourth thin film transistor T4, an active layer A5 of the fifth thin film transistor T5, an active layer A6 of the sixth thin film transistor T6, and an active layer A7 of the seventh thin film transistor T7. As shown in FIG. 7B, the semiconductor layer may be formed by a patterning process using a semiconductor material layer. The semiconductor layer may be used to form the above active layers of each transistor, and the active layers of each transistor can include a source region, a drain region, and a channel region between the source region and the drain region. For example, the semiconductor layer may be made of amorphous silicon, polysilicon, oxide semiconductor materials (e.g., indium gallium tin oxide (IGZO)), and the like. It should be noted that the source region and the drain region may be regions doped with N-type impurities or P-type impurities.

In the array substrate provided by some embodiments of the present disclosure, a first insulation layer is formed on the semiconductor layer. For the sake of clarity, the insulation layers are not shown in FIG. 7A and FIG. 7B-FIG. 7K. For example, with reference to FIG. 7B and FIG. 8A, the first insulation layer 151 of the pixel circuits is arranged on the side of the first conductive layer away from the base substrate 210.

Figure 7G:
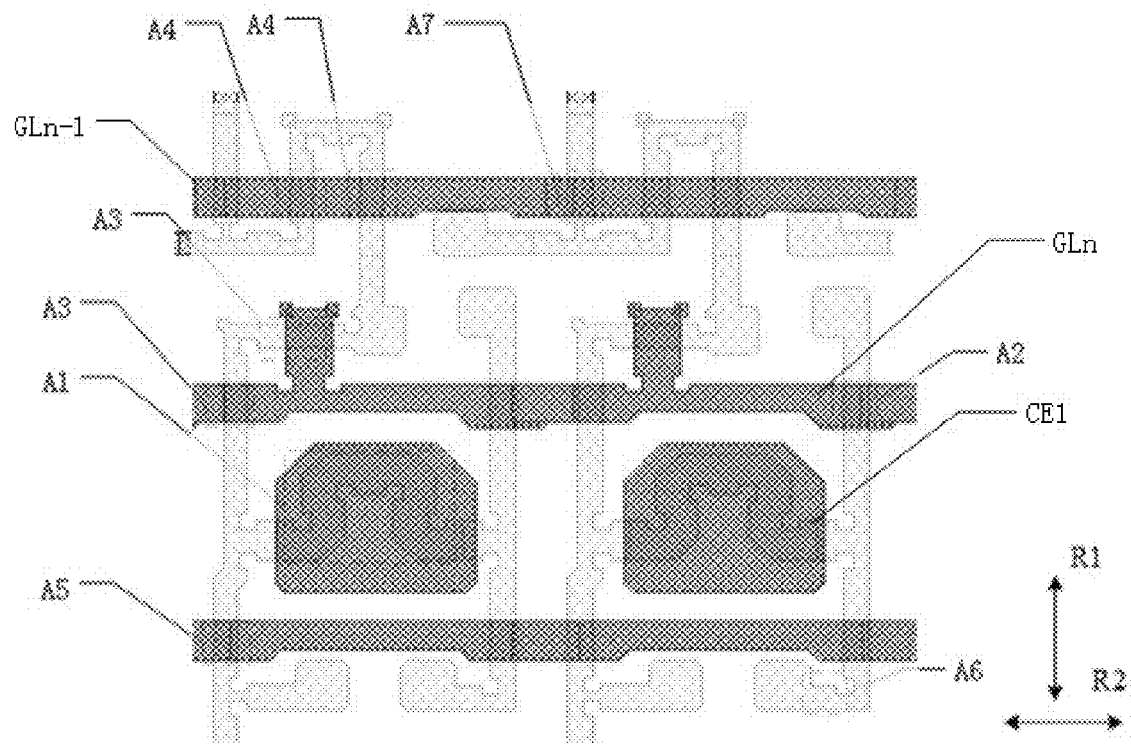
Figure 8A:
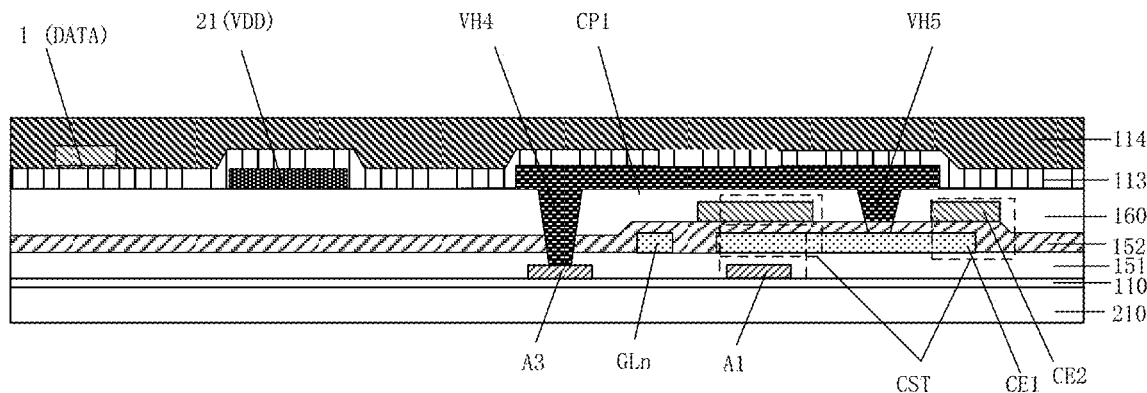
FIG. 8A is a schematic cross-sectional view taken along the line A-A' in FIG. 7A.

FIG. 7C shows the first conductive layer of the pixel circuit, and FIG. 7G shows the schematic diagram after the first conductive layer is laminated with the semiconductor layer. The first conductive layer is located on the side of the semiconductor layer away from the base substrate 210. Referring to FIG. 7C, FIG. 7G, and FIG. 8A, the first insulation layer 151 is located between the active layer of each transistor and the first conductive layer. The first conductive layer includes, for example, the first electrode plate CE1 of the storage capacitor CST, the first gate line GLn, the second gate line GLn−1, the light-emitting control line EM, and the gate electrode of the first thin film transistor T1, the gate electrode of the second thin film transistor T2, the gate electrode of the third thin film transistor T3, the gate electrode of the fourth thin film transistor T4, the gate electrode of the fifth thin film transistor T5, the gate electrode of the sixth thin film transistor T6, and the gate electrode of the seventh thin film transistor T7. Therefore, the active layers of the transistors described above are arranged in a same layer, and the gate electrodes of the transistors are arranged in the same layer as the first electrode plate CE1 of the storage capacitor CST, so that the first insulation layer 151 is located between the active layers of the transistors and the gate electrodes of the transistors and the first electrode plate CE1 of the storage capacitor CST. It can be seen that the gate electrode of the first transistor T1 (or the gate of each transistor) and the first electrode plate CE1 of the storage capacitor CST are located on the side of the active layer of the drive transistor (or the active layer of each transistor) away from the base substrate 210.

As shown in FIG. 7A-FIG. 7C, and FIG. 7G, the gate electrode of the second transistor T2, the gate electrode of the fourth transistor T4, the gate electrode of the fifth transistor T5, the gate electrode of the sixth transistor T6, and the gate electrode of the seventh transistor T7 are respectively the portions of the first gate line GLn and the second gate line GLn-1 that overlap with the semiconductor layer. In some embodiments, for example, the third thin film transistor T3 may be a thin film transistor with a double gate electrode structure, one gate electrode of the third thin film transistor T3 may be a portion where the first gate line GLn overlaps with the semiconductor layer, and the other gate electrode of the third thin film transistor T3 may be a protrusion protruding from the first gate line GLn. The gate electrode of the first thin film transistor T1 may be integral with the first electrode plate CE1, that is, the first electrode plate CE1 is multiplexed as the gate electrode of the first thin film transistor T1. For example, the fourth thin film transistor T4 may be a thin film transistor with a double gate electrode structure, and the two gate electrodes are portions of the second gate line GLn-1 that overlap with the semiconductor layer.

For example, the gate electrodes of the thin film transistors are respectively integral with the corresponding first gate line GLn or second gate line GLn-1. In this embodiment, the first gate line GLn, the second gate line GLn-1, and the gate electrodes of each thin film transistor are arranged in the same layer as the first electrode plate CE1 of the storage capacitor CST, and may be formed at the same time by one same patterning process.

For example, as shown in FIG. 7A, the array substrate 100 further includes a first power supply line VDD, the first power supply line VDD is connected with the first voltage terminal and the second electrode plate CE2 of the storage capacitor CST, and is configured to provide a first voltage to the light-emitting control transistor, that is, the first transistor T1. For example, the first power supply line VDD includes a first sub-routing line 21 extending along a first direction R1 and a second sub-routing line 22 extending along a second direction, where the first direction R1 intersects with the second direction, for example, the second direction is a transverse direction R2. The first sub-routing line 21 is electrically connected with the second sub-routing line 22.

Figure 7H:
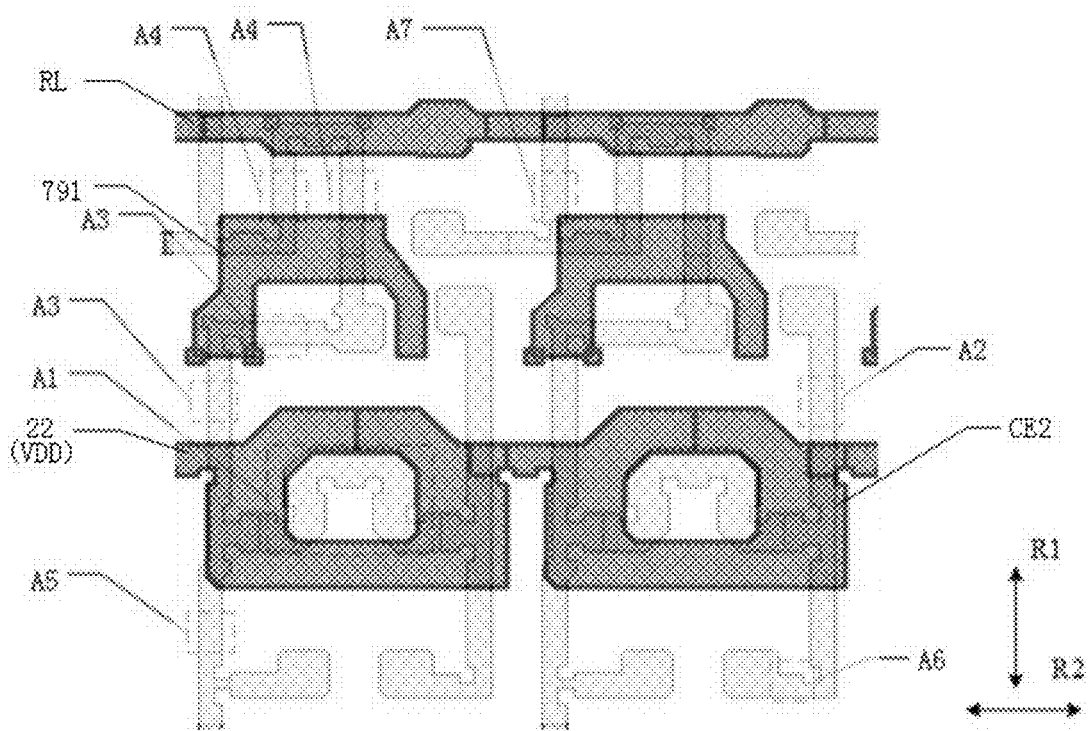

FIG. 7D shows the second conductive layer of the pixel circuit, and FIG. 7H shows the schematic diagram after the second conductive layer is laminated with the semiconductor layer. The second conductive layer is located on the side of the first conductive layer away from the base substrate 210. For example, with reference to FIG. 7D, FIG. 7H, and FIG. 8A, the second conductive layer of the pixel circuit includes the second electrode plate CE2 of the storage capacitor CST, the reset signal line RL, and the second sub-routing line 22. It can be seen that the second electrode plate CE2 of the storage capacitor CST is arranged in a same layer as the second electrode plate CE2 of the storage capacitor CST, and the second electrode plate CE2 of the storage capacitor CST is located at the gate electrode of the first transistor T1 (or the gate electrode of each transistor) which is the drive transistor and the side of the first electrode plate CE1 of the storage capacitor CST which is away from the active layer. For example, the second sub-routing line 22 is integral with the second electrode plate CE2 of the storage capacitor CST, so that the second sub-routing line 22 can be formed by the same patterning process. The second electrode plate CE2 at least partially overlaps with the first electrode plate CE1 to form a storage capacitor CST.

Figure 8B:
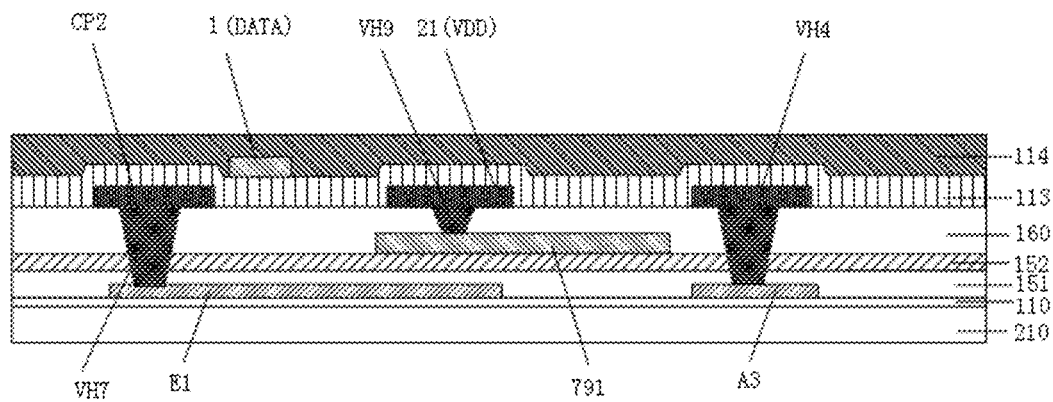
FIG. 8B is a schematic cross-sectional view taken along the line B-B' in FIG. 7A.

For example, in some embodiments, in combination with FIG. 7A and FIG. 7D, the second conductive layer may further include a light shielding portion 791. The orthographic projection of the light shielding portion 791 on the base substrate 210 covers at least portion of the active layer of the second thin film transistor T2, the active layer between the drain electrode of the third thin film transistor T3, and the drain electrode of the fourth thin film transistor T4, thereby preventing external light from affecting the active layers of the second thin film transistor T2, the third thin film transistor T3, and the fourth thin film transistor T4. The light shielding portion 791 may be electrically connected with the first power supply line VDD through a via hole VH9 penetrating through the insulation layer, as shown in FIG. 7A and FIG. 8B.

Figure 7I:
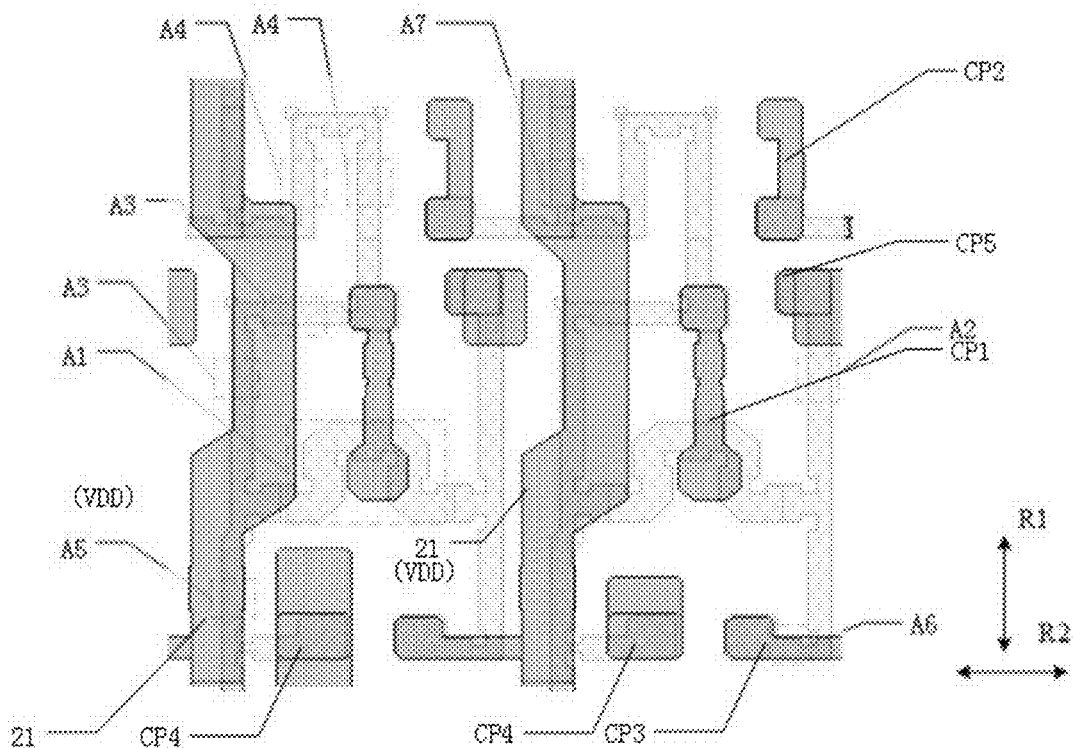
Figure 7J:
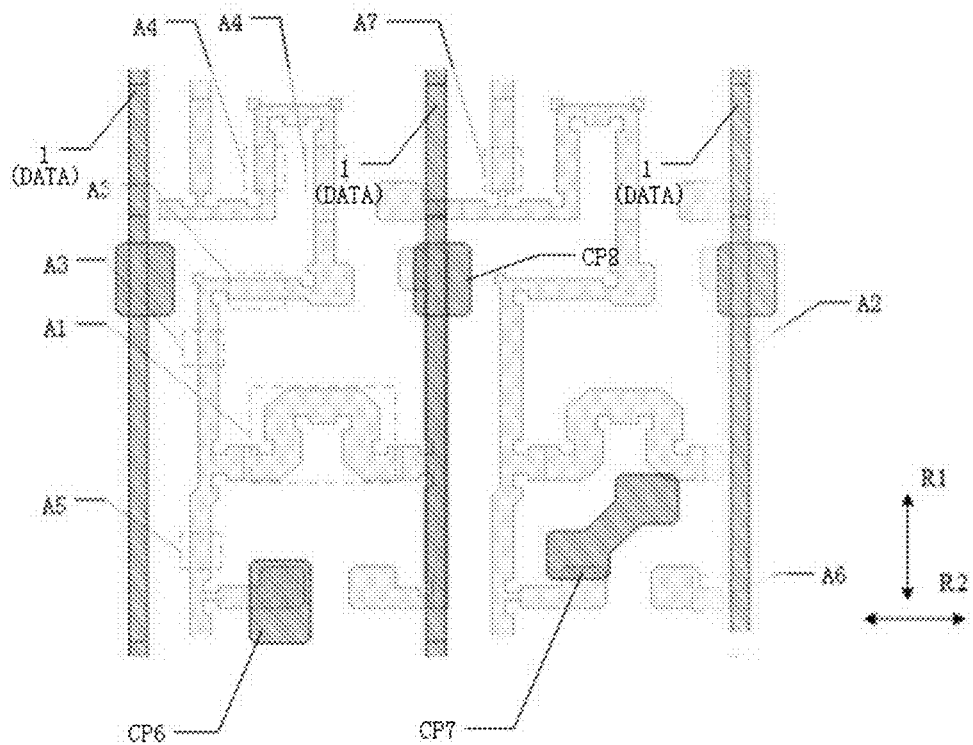
Figure 7K:
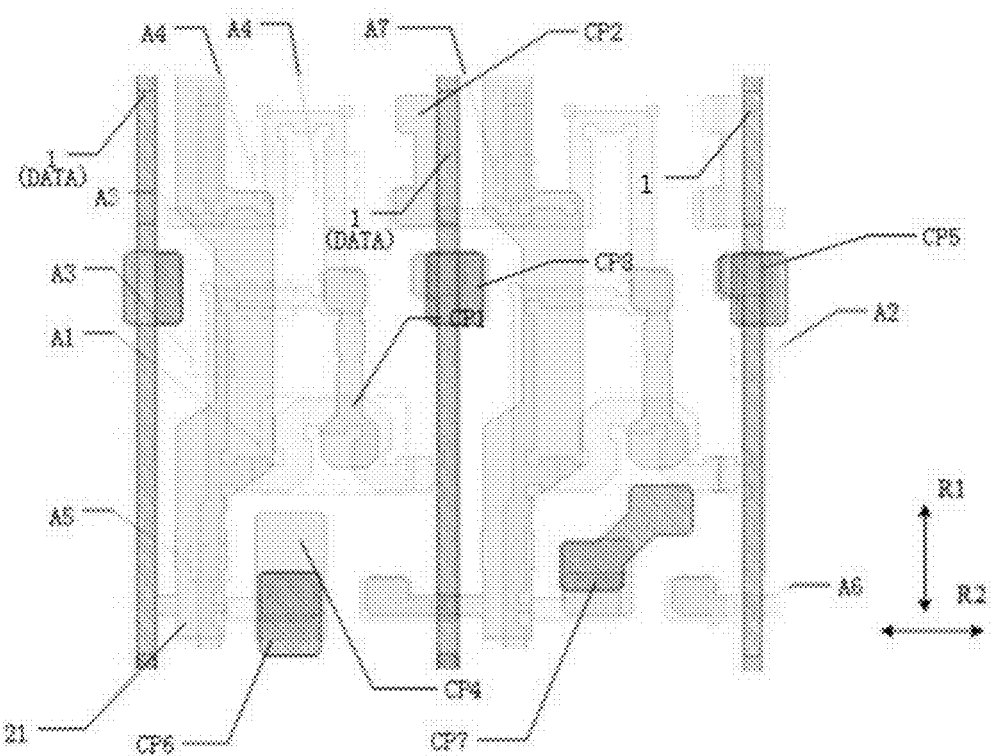

In at least one embodiment of the present disclosure, as shown in FIG. 7A and FIG. 7K, for example, in one sub-pixel, in the transverse direction R2, the first connection structure CP1 is located between the first sub-routing line 21 and the data line 1 (a pixel circuit belonging to one same sub-pixel as the first connection structure CP1 and the first sub-routing line 21). In this case, in the transverse direction, there is no structure extending along the first direction R1 between the first connection structure CP1 and the data line 1, so that the distance between the first connection structure CP1 and the data line 1 is smaller, which leads to more obvious parasitic capacitance between the first connection structure CP1 and the data line 1 in the transverse direction. Therefore, in this case, in the array substrate provided by the embodiment of the present application, arranging the first connection structure CP1 and the data line 1 in different layers has a more obvious effect of reducing the signal interference of the data line 1 to the first connection structure CP1.

In addition, compared with the case where the first sub-routing line 21 is located between the first connection structure CP1 and the data line (which belongs to the same sub-pixel pixel circuit as the first connection structure CP1 and the first sub-routing line 21), the length of the first connection structure CP1 in the first direction R1 is smaller, and the width of the first connection structure CP1 in the transverse direction R2 is also smaller. Therefore, by utilizing the second conductive layer including the above-mentioned light shielding portion 791, the active layer of the second thin film transistor T2, the active layer of the third thin film transistor T3, and the active layer of the fourth thin film transistor T4 are shielded, and this can be achieved by using the second conductive layer, thus simplifying the manufacturing process of the array substrate.

For example, as shown in FIG. 8A, the array substrate 100 further includes a second insulation layer 152 arranged between the first electrode plate CE1 of the storage capacitor CST and the second electrode plate CE2 of the storage capacitor CST, that is, between the first conductive layer and the second conductive layer. For clarity, the second insulation layer 152 is also not shown in FIG. 7B-FIG. 7F.

The array substrate 100 further includes a second power supply line VSS. For example, the first power supply line VDD is a power supply line that provides a high voltage to the pixel circuit, and the second power supply line VSS is connected with the second voltage terminal, which provides a power supply line with a low voltage (lower than the above high voltage) for the pixel circuit. In the embodiment as shown in FIG. 6, the first power supply line VDD provides a constant first power supply voltage which is a positive voltage. The second power supply line VSS provides a constant second power supply voltage, and the second power supply voltage may be a negative voltage or the like. For example, in some examples, the second power supply voltage may be a ground voltage.

In some embodiments, for example, as shown in FIG. 8A, the data line 1 (DATA) is at a side of the first connection structure CP1 away from the base substrate 210. In this case, for example, FIG. 7E shows the third conductive layer of the pixel circuit, and FIG. 7I shows a schematic diagram after the third conductive layer is laminated with the semiconductor layer. The third conductive layer is located on the side of the second conductive layer away from the base substrate 1. For example, as shown in FIG. 7E and FIG. 7I, the third conductive layer of the pixel circuit includes a first connection structure CP1 and a first sub-routing line 21 of the first power supply line VDD, that is, the first connection structure CP1 and the first sub-routing line 21 are arranged in the same layer. As shown in FIG. 8A, the array substrate 100 further includes a third insulation layer 160 between the second electrode plate CE2 of the storage capacitor CST and the first connection structure CP1, that is, between the second conductive layer and the third conductive layer.

For example, the first sub-routing line 21 is electrically connected with the second sub-routing line 22 through a via hole (e.g., via hole VH3) penetrating the third insulation layer 160.

For example, in combination with FIG. 7A, FIG. 7E, FIG. 8A, and FIG. 8B, the third conductive layer further includes a second connection structure CP2, a third connection structure CP3, and a fourth connection structure CP4. One end of the first connection structure CP1 is connected with the first electrode plate CE1 of the storage capacitor CST through a via hole (for example, a via hole VH5) penetrating through the second insulation layer 152 and the third insulation layer 160 and exposing portion of the first electrode plate CE1 of the storage capacitor CST. The other end of the first connection structure CP1 is connected with the semiconductor layer, for example, to the drain region electrode of the third thin film transistor T3 in the semiconductor layer through at least one via hole (for example, a via hole VH4) penetrating through the first insulation layer 151, the second insulation layer 152, and the third insulation layer 160. One end of the second connection structure CP2 is connected with the reset signal line RL through a via hole (e.g., a via hole VH6) penetrating the third insulation layer 160, and the other end of the second connection structure CP2 is connected with the semiconductor layer through at least one via hole (e.g., a via hole VH7) penetrating the first insulation layer 151, the second insulation layer 152, and the third insulation layer 160. For example, the source region of the seventh thin film transistor T7 and the source region of the fourth thin film transistor T4 in the semiconductor layer are connected. The third connection structure CP3 is connected with the drain region of the sixth thin film transistor T6 in the semiconductor layer through at least one via hole (e.g., a via hole VH8) penetrating through the first insulation layer 151, the second insulation layer 152, and the third insulation layer 160. The fourth connection structure CP4 is connected with the drain region of the fifth thin film transistor T5 in the semiconductor layer through at least one via hole (for example, a via hole VH2) penetrating through the first insulation layer 151, the second insulation layer 152, and the third insulation layer 160. The fifth connection structure CP5 is connected with the drain region of the third thin film transistor T3 in the semiconductor layer through at least one via hole (e.g., a via hole VH1) penetrating through the first insulation layer 151, the second insulation layer 152, and the third insulation layer 160 and exposing portion of the semiconductor layer.

For example, FIG. 7F shows a fourth conductive layer of a pixel circuit, FIG. 7J shows a schematic diagram after the fourth conductive layer and the semiconductor layer are laminated, and FIG. 7K shows a schematic diagram after the fourth conductive layer, the third conductive layer and the semiconductor layer are laminated. For example, as shown in FIG. 7A, FIG. 7E-FIG. 7F, FIG. 7J-FIG. 7K and FIG. 8A, the fourth conductive layer is located on the side of the third conductive layer away from the base substrate 210. The fourth conductive layer includes a data line 1 (DATA), a sixth connection structure CP6, and a seventh connection structure CP7. The array substrate 100 further includes a fourth insulation layer 113 between the third conductive layer and the fourth conductive layer, that is, between the first connection structure CP1 and the data line 1 (DATA). For example, the fourth insulation layer 113 is a flat layer. The via hole VH1 also penetrates through the fourth insulation layer 113 to expose at least portion of the fifth connection structure CP5, and the data line 1 (DATA) is electrically connected with the fifth connection structure CP5 through the via hole VH1, so that the data line 1 (DATA) is electrically connected with the drain region of the third thin film transistor T3 in the semiconductor layer. For example, the seventh connection structure CP7 is in direct contact with the data line 1 to realize the electrical connection between the seventh connection structure CP7 and the data line 1. Because the line width of the data line 1 is smaller, for example, significantly smaller than the line width of the first sub-routing line 21, the seventh connection structure CP7 can widen the portion of the data line 1 that needs to be connected with the semiconductor layer. For example, the whole of the data line 1 and the seventh connection structure CP7 is electrically connected with the fifth connection structure CP5 through the via hole VH1, so that the data line 1 (DATA) is electrically connected with the drain region of the third thin film transistor T3 in the semiconductor layer. For example, the seventh connection structure CP7 is integral with the data line 1. For example, the via hole VH2 further penetrates through the fourth insulation layer 113 to expose at least portion of the fourth connection structure CP4, and the sixth connection structure CP6 is electrically connected with the fourth connection structure CP4 through the via hole VH2, so that the sixth connection structure CP6 is connected with the drain region corresponding to the fifth thin film transistor T5 in the active layer as the drain electrode of the fifth thin film transistor T5, for example, the sixth connection structure CP6 is configured to connect with the anode of the light-emitting device (for example, the anode 181 as shown in FIG. 6). For example, in different sub-pixels 1030, for example, in two adjacent sub-pixels 1030 as shown in FIG. 7A, the shape, the size, and the position of the sixth connection structure CP6 may not be completely the same so as to meet the requirements of anode positions corresponding to different sub-pixels. For example, the shape, the size, and the position of the sixth connection structure CP6 in the left sub-pixel 1030 as shown in FIG. 7A are respectively different from the shape, the size, and the position of the sixth connection structure CP6 in the right sub-pixel 1030. This is because the position of the anode in these two sub-pixels is different, and the shape, the size, and the position of the sixth connection structure CP6 extend along the direction intersecting the first direction R1 and the transverse direction R2, and the upper end (the end not connected with the fourth connection structure CP4) of the sixth connection structure CP6 is so located as to be connected with the anode located at the upper end.

For example, the thickness of fourth insulation layer 113 in a direction perpendicular to base substrate 210 is greater than at least one selected from the group consisting of the thickness of the first insulation layer 151 in the direction perpendicular to the base substrate 210, the thickness of the second insulation layer 152 in the direction perpendicular to the base substrate 210, the thickness of the third insulation layer 160 in the direction perpendicular to the base substrate 210, and the thickness of the fourth insulation layer 113 in the direction perpendicular to the base substrate 210 to enhance the insulation effect of the fourth insulation layer 113 and better reduce or avoid the parasitic capacitance between the data line 1 and the first connection structure CP1.

For example, the thickness of the fourth insulation layer 113 in the direction perpendicular to the base substrate 210 is several microns, for example, less than 5 μm to 10 μm. This thickness range can achieve a better effect of reducing or avoiding parasitic capacitance between the data line 1 and the first connection structure CP1, without excessively thickening the size of the array substrate 100.

In the above embodiments, the first sub-routing lines 21 and the data line 1 are respectively arranged in different layers. Because the adjacent distance between the first sub-routing lines 21 and the data line 1 is relatively small, this design can avoid parasitic capacitance between the first sub-routing lines 21 and the data line, thus avoiding the parasitic capacitance from affecting the display effect. For example, the adjacent first sub-routing lines 21 and the data lines 1 respectively correspond to two adjacent sub-pixels.

Referring to FIG. 7A and FIG. 8A, for example, the orthographic projection of the first connection structure CP1 on the base substrate 210 does not overlap with the orthographic projection of the data line 1 on the base substrate 210, and the orthographic projection of the first routing line 21 on the base substrate 210 does not overlap with the orthographic projection of the data line 1 on the base substrate 210. Compared with the above case that the signal lines overlap in the direction perpendicular to the base substrate 210, the scheme of the embodiments of the present disclosure can better prevent crosstalk between signals on these signal lines.

For example, in order to reduce the resistance of the data line and the first connection structure, the materials of the data line 1 and the first connection structure CP1 are all metal materials. For example, the fourth conductive layer forming the data line 1 adopts a laminated structure Ti/Al/Ti including three layers of metal.

FIG. 8B is a schematic cross-sectional view along the line B-B' in FIG. 7A. The plurality of sub-pixels includes a first sub-pixel and a second sub-pixel adjacent to the first sub-pixel. FIG. 7A shows two adjacent sub-pixels, the first sub-pixel is the sub-pixel at the left side in FIG. 7A, and the second sub-pixel is the sub-pixel at the right side in FIG. 7A, that is, the first sub-pixel and the second sub-pixel are adjacent in a transverse direction. Of course, in other embodiments, the first sub-pixel and the second sub-pixel can also be adjacent in a longitudinal direction, and the directions and positions of other structures can be adaptively adjusted. Referring to FIG. 7A, FIG. 7G and FIG. 8B, the first reset transistor T4 includes an active layer A4, a gate electrode (a portion of the second gate line GLn-1 overlapping with the active layer A4), a first electrode (for example, a source electrode), and a second electrode (for example, a drain electrode). The second reset transistor T7 includes an active layer A7, a gate electrode (a portion of the second gate line GLn-1 overlapping with the active layer A7), a first electrode (for example, a source electrode), and a second electrode (for example, a drain electrode). The active layer of the reset transistor of the first reset transistor T4 includes a channel region (a portion of the active layer A4 overlapping with the gate line GLn-1) and an electrode region E1. The active layer A7 of the second reset transistor T7 includes a channel region (a portion of the active layer A7 overlapping with the gate line GLn-1), and an electrode region E1. The first reset transistor T4 and the second reset transistor T7 share the same electrode region E1. For example, the second connection structure CP2 extends along the first direction R1 and includes a first end and a second end opposite to each other in the first direction RE The second connection structure CP2 of the pixel circuit of the second sub-pixel is located at a side of the channel region of the active layer of the first reset transistor T4 and the channel region of the active layer of the second reset transistor T7 of the pixel circuit of the first sub-pixel close to the data line 1 of the pixel circuit of the first sub-pixel in the transverse direction R2. The first end of the second connection structure CP2 is electrically connected with the reset signal line RL through a via hole VH6, and the second end of the second connection structure CP2 is electrically connected with the electrode region E1 of the active layer of the reset transistors (T4 and T7) of the pixel circuit of the second sub-pixel through a via hole VH7. Therefore, the second connection structure CP2 constitutes the first electrode and the second electrode of the first reset transistor T4 and the second reset transistor T7.

With reference to FIG. 7A, FIG. 7J, and FIG. 8B, the electrode region E1 of the active layer of the first reset transistor T4 and the second reset transistor T7 of the pixel circuit of the second sub-pixel extend laterally from the first sub-pixel to the adjacent second sub-pixel, and the orthographic projection of the electrode region E1 of the active layer of the first reset transistor T4 and the second reset transistor T7 of the pixel circuit of the second sub-pixel on the base substrate at least partially overlaps with the orthographic projection of the data line 1 belonging to the pixel circuit of the first sub-pixel on the base substrate. That is, the electrode region E1 of the active layer of the first reset transistor T4 and the second reset transistor T7 intersect with the data line 1 so as to fully and flexibly utilize the limited pixel area and form the required semiconductor layer pattern, which is convenient for connection with other structures. Because the electrode region E1 of the active layer overlapping with the orthographic projection of the data line 1 is far away from the second conductive layer where the data line 1 is located in the direction perpendicular to the base substrate, the intersection of the electrode region E1 and the data line 1 in the direction perpendicular to the base substrate cannot interfere with signals of each other.

It should be noted that FIG. 7A, FIG. 7F, FIG. 7J, and FIG. 7K respectively show three data lines 1, and the three data lines 1 belong to pixel circuits of three adjacent sub-pixels. The data line 1 at located in the middle belongs to the pixel circuit of the first sub-pixel, and the data line 1 located in the right belongs to the pixel circuit of the second sub-pixel.

Figure 9:
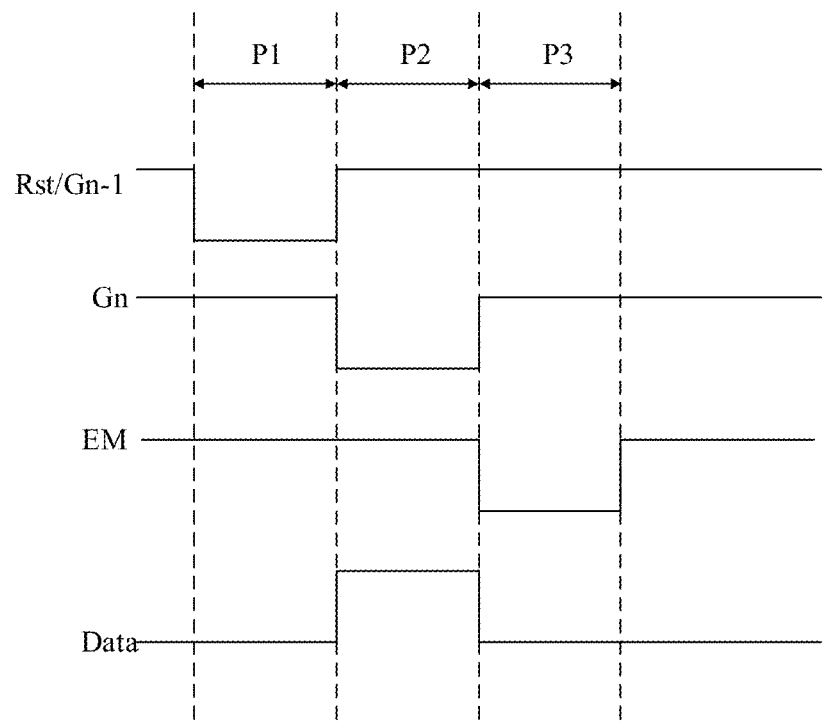
FIG. 9 is a signal timing diagram of the operation process of the pixel circuit shown in FIG. 6.

FIG. 9 is a signal timing diagram of the pixel circuit as shown in FIG. 6. The working principle of the pixel circuit as shown in FIG. 6 will be explained with reference to the signal timing diagram as shown in FIG. 9. For example, the first light-emitting control line EM1 and the second light-emitting control line EM2 in FIG. 6 are the same common light-emitting control line. In other embodiments, the first light-emitting control line EM1 and the second light-emitting control line EM2 may also be different signal lines, respectively providing different first light-emitting control signals and second light-emitting control signals.

In addition, the transistors as shown in FIG. 9 are all P-type transistors as an example. The gate electrode of each P-type transistor is turned on in the case where the low level is turned on and turned off in the case where the high level is switched on. The following embodiments are the same and will not be described again.

As shown in FIG. 9, the working process of the pixel circuit includes three stages, namely, a reset stage P1, a data writing and compensation stage P2, and a light-emitting stage P3. The time sequence waveform of each signal in each stage is shown in the figure.

In the reset phase P1, the second gate line Gn−1 provides a reset signal Rst, the fourth transistor T4 and the seventh transistor T7 are turned on by the low level of the reset signal. The reset signal (a low-level signal, for example, it may be a grounded signal or be other low-level signals) is applied to the first gate electrode of the first transistor T1, and the reset signal is applied to the node N4, that is, the light-emitting element 180 is reset, so that the light-emitting element 180 can be displayed in a black state without emitting light before the light-emitting phase P3, and the display effect such as contrast of the display device adopting the pixel circuit is improved. At the same time, the second transistor T2, the third transistor T3, the fifth transistor T5, and the sixth transistor T6 are turned off by the respective high-level signals.

In the data writing and compensation phase P2, the first gate line GLn provides the scan signal Gn−1, the data line DAT provides the data signal data, and the second transistor T2 and the third transistor T3 are turned on. Under this case, the fourth transistor T4, the fifth transistor T5, the sixth transistor T6, and the seventh transistor T7 are turned off by respective high-level signals. After passing through the second transistor T2, the first transistor T1 and the third transistor T3, the Data signal data charges the first node N1 (i.e., charges the storage capacitor CST), that is, the potential of the first node N1 gradually increases. It can be easily understood that because the second transistor T2 is turned on, the potential of the second node N2 is kept at Vdata, and according to the characteristics of the first transistor T1, in the case where the potential of the first node N1 increases to Vdata+Vth, the first transistor T1 is turned off and the charging process ends. It should be noted that Vdata represents the voltage value of the data signal DATA, and Vth represents the threshold voltage of the first transistor T1. In this embodiment, the first transistor T1 is described by taking a P-type transistor as an example, so the threshold voltage Vth here can be negative.

After the data writing and compensation stage P2, the potentials of the first node N1 and the third node N3 are both Vdata+Vth, that is, the voltage information with the data signal data and the threshold voltage Vth is stored in the storage capacitor CST for providing grayscale display data and compensating the threshold voltage of the first transistor T1 in the subsequent light-emitting stage.

In the light-emitting phase P3, the light-emitting control line provides the light-emitting control signal EM, and the fifth transistor T5 and the sixth transistor T6 are turned on by the low level of the light-emitting control signal EM. The second transistor T2, the third transistor T3, the fourth transistor T4, and the seventh transistor T7 are turned off by their respective high levels, respectively. Under this case, the potential Vdata+Vth of the first node N1 and the potential of the second node N2 are VDD, thus the first transistor T1 also keeps conducting at this stage. The anode and cathode of the light-emitting element 180 are respectively connected with a first power supply voltage (high voltage) and a second voltage VSS (low voltage) provided by the first power supply line VDD, so that the light-emitting element 180 emits light under the action of the driving current flowing through the first transistor T1.

For example, the display substrate further includes a third signal line extending in the first direction, the third signal line includes a first portion passing through the first opening peripheral region, the inter-opening region, and the second opening peripheral region, and is configured to provide a third display signal to the pixel circuit. The first portion of the third signal line is arranged in the same layer as the gate electrode mentioned above. For example, the third display signal is a light-emitting drive scan signal (EM line).

For example, the display substrate further includes a second virtual sub-pixel, the second virtual sub-pixel includes a second virtual pixel circuit as shown in FIG. 16. The second virtual pixel circuit comprises a virtual semiconductor layer, and the virtual semiconductor layer is arranged in the same layer as the active layer and electrically connected with the first part of second sub-routing lines; an orthographic projection of the first portion of the third signal line on the base substrate at least partially overlaps with an orthographic projection of the virtual semiconductor layer on the base substrate to constitute a third compensation capacitor.

Figure 16A:
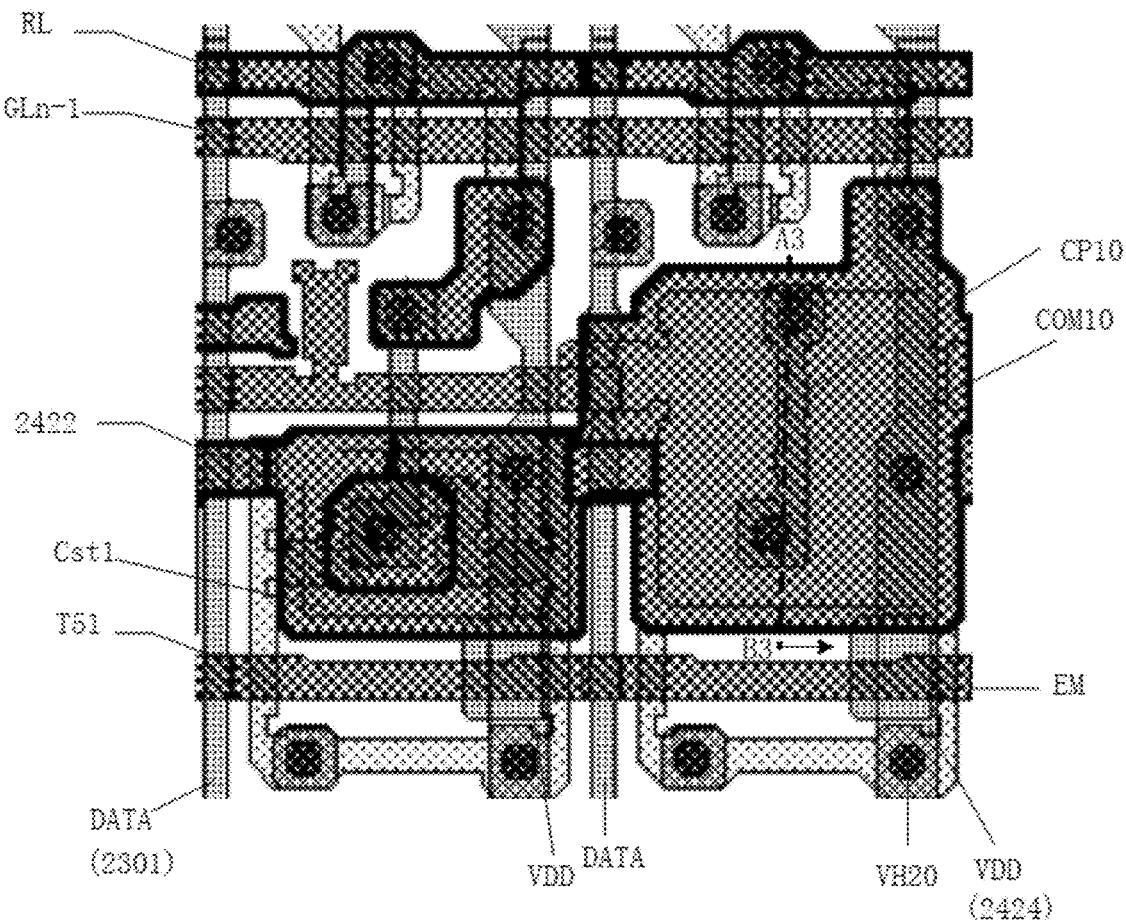
FIG. 16A is a schematic planar layout diagram of a second virtual pixel circuit in a second virtual sub-pixel in the display substrate provided by an embodiment of the present disclosure.
Figure 16B:
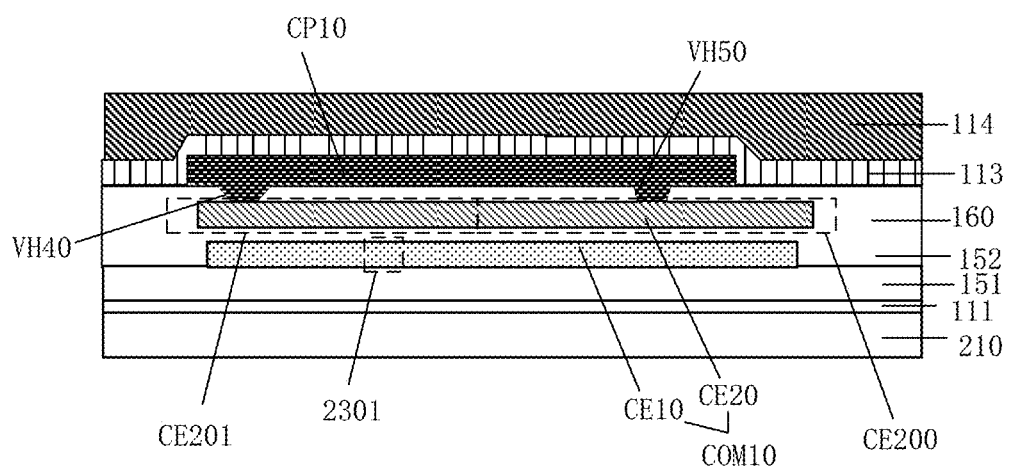
FIG. 16B is a schematic cross-sectional view taken along the line A3-B3 in FIG. 16A.

FIG. 16A is a schematic layout diagram of a second virtual pixel circuit in a second virtual sub-pixel (the sub-pixel at right side in the figure is the virtual sub-pixel) in a display substrate provided by an embodiment of the present disclosure. FIG. 16B is a schematic cross-sectional view along the line A3-B3 in FIG. 16A. FIG. 16C-FIG. 16F are schematic diagrams of each layer of a second virtual pixel circuit of a display substrate provided by an embodiment of the present disclosure.

In some embodiments, for example, the inter-opening region 2014 further includes a second virtual sub-pixel, and the second virtual sub-pixel includes a second virtual pixel circuit, as shown in FIG. 16A. The second virtual pixel circuit includes a second compensation capacitor COM10, and the second compensation capacitor COM10 includes a first electrode plate CE10 and a second electrode plate CE20.

Figure 16C:
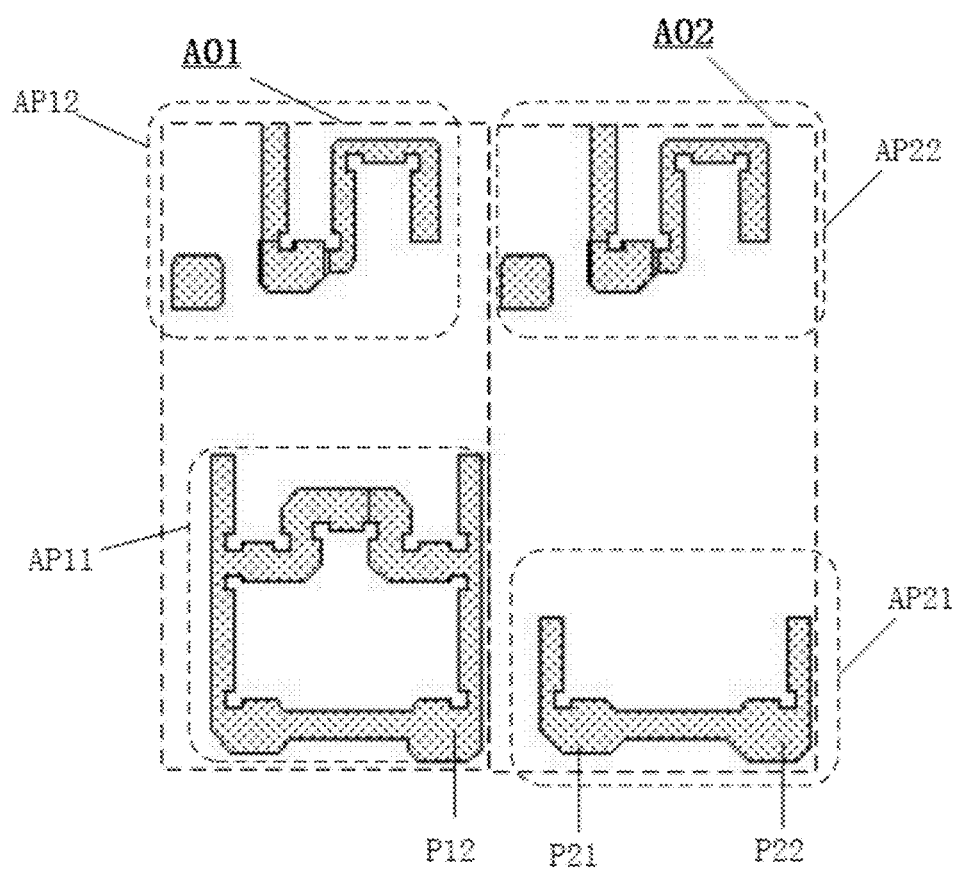
FIG. 16C-FIG. 16F are schematic diagrams of each layer of the second virtual pixel circuit of the display substrate provided by an embodiment of the present disclosure.
Figure 16D:
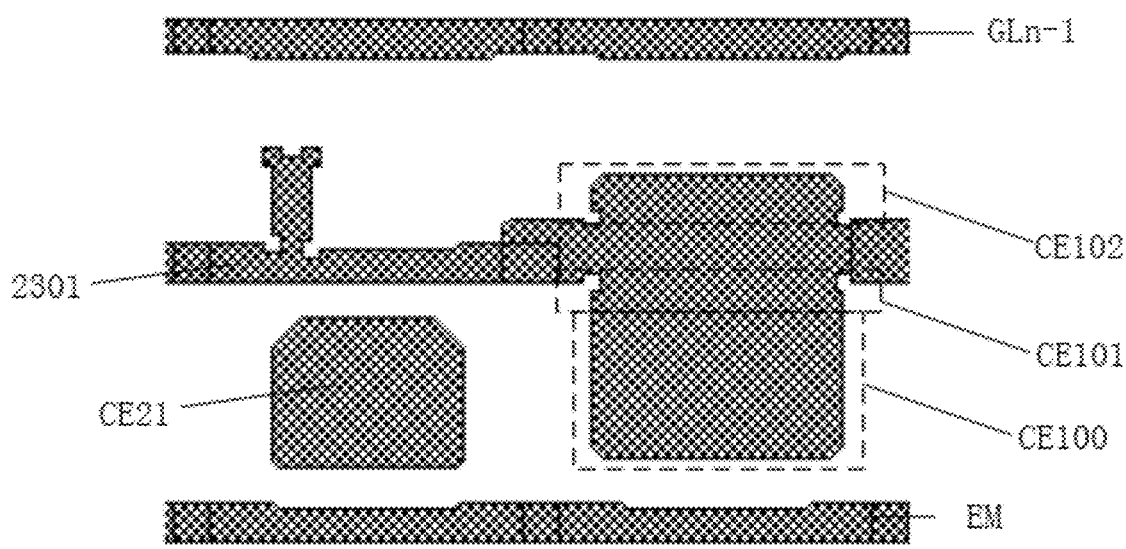
Figure 16E:
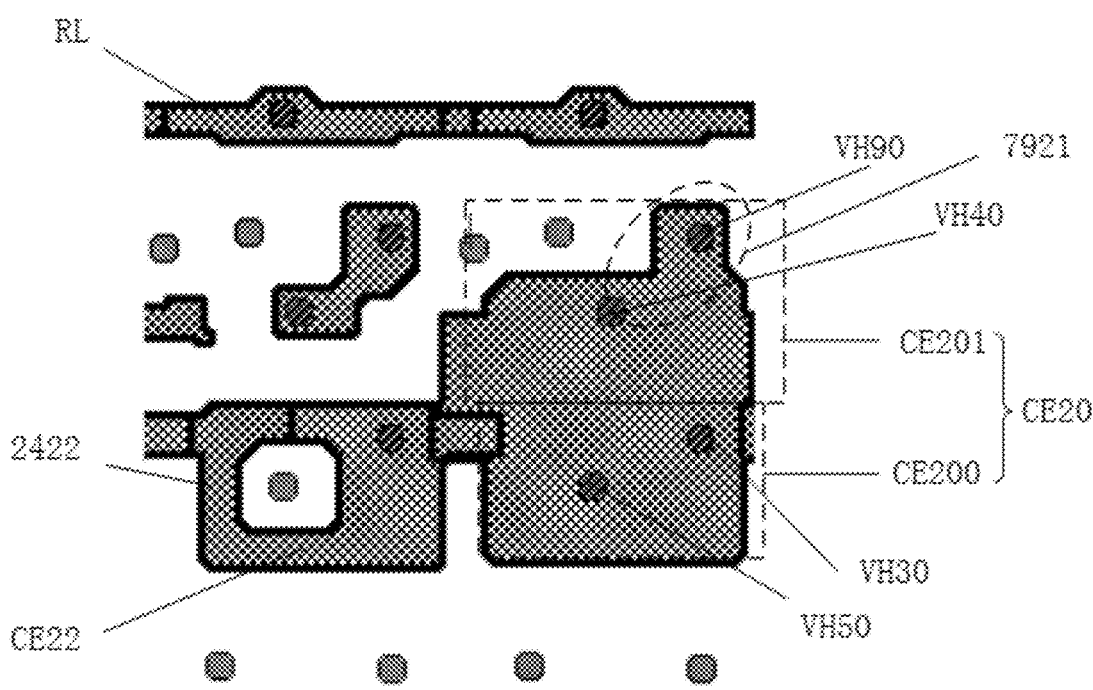

FIG. 16D shows a structure of the second dummy pixel circuit located on the first conductive layer, and FIG. 16E shows a structure of the second dummy pixel circuit located on the second conductive layer.

With reference to FIG. 16A-FIG. 16B and FIG. 16D-FIG. 16E, the first electrode plate CE10 of the fourth compensation capacitor COM10 is arranged in a same layer as the first signal line 2301, for example, both of the first electrode plate CE10 and the first signal line 2301 are in the first conductive layer, and the first electrode plate CE10 of the fourth compensation capacitor COM10 is electrically connected with the first signal line 2301. An orthographic projection of the first signal line 2301 on the base substrate 210 at least partially overlaps with an orthographic projection of the second electrode plate CE20 of the fourth compensation capacitor COM10 on the base substrate 210.

As shown in FIG. 16D, the first electrode plate CE10 of the fourth compensation capacitor COM10 includes a second main body portion CE100 and a third extension portion CE101. The second main body portion CE100 is located at a first side of the first signal line 2301 in the second direction R2. The third extension portion CE101 extends from the second main body portion CE100 toward the first signal line 2301 in the second direction R2, and is located at the first side of the first signal line 2301 in the second direction and is between the second main body portion CE100 and the first signal line 2301. The second main body portion CE100 is electrically connected with the first signal line 2301 through the third extension CE101. For example, the first electrode plate CE20 of the fourth compensation capacitor COM10 includes the fourth extension portion CE102. The fourth extension portion CE102 extends from the first signal line 2301 in a direction away from the second main body portion CE100, is located at the second side of the first signal line 2301 in the second direction R2, and is electrically connected with the first signal line 2301. The second side of the first signal line 2301 is opposite to the first side of the first signal line 2301, thereby further increasing the area of the first electrode plate CE10 of the fourth compensation capacitor COM10, and if the area of the second electrode plate of the fourth compensation capacitor COM10 is increased under this case, the fourth compensation capacitor COM10 can be further increased to meet the requirements of different compensation degrees for the first signal line.

For example, the second main body portion CE100, the third extension portion CE101, the first signal line 2301, and the fourth extension portion CE102 are integral, so that these structures can be formed by the same patterning process, and the manufacturing process of the display substrate is simplified.

Combining FIG. 16A-FIG. 16B with FIG. 16E, the second electrode plate CE20 of the fourth compensation capacitor COM10 includes a third main body portion CE200 and a fifth extension portion CE201. The third main body portion CE200 is located at the first side of the first signal line 2301 in the second direction R2. The fifth extension portion CE201 extends from the third main body portion CE200 in the second direction R2 toward the first signal line 2301, and the orthographic projection of the first signal line 2301 on the base substrate 210 at least partially overlaps with an orthographic projection of the fifth extension portion CE201 on the base substrate 210.

For example, as shown in FIG. 16B, the orthographic projection of the first electrode plate CE10 of the fourth compensation capacitor COM10 on the base substrate 210 is located within the orthographic projection of the second electrode plate CE20 of the fourth compensation capacitor COM10 on the base substrate 210, so as to maximize the area of the first electrode plate CE10 of the fourth compensation capacitor COM10 and form the required fourth compensation capacitor utilizing the limited space.

For example, as shown in FIG. 16E, the position and the pattern of a portion 7921 of the second electrode plate CE20 of the fourth compensation capacitor COM10 may be respectively the same as the position and the pattern of the light shielding portion in the pixel circuit of the display region to maintain etching uniformity.

For example, the second virtual sub-pixel includes a second virtual semiconductor layer, and the second virtual semiconductor layer is located at a side of the first electrode plate of the fourth compensation capacitor close to the base substrate. FIG. 16C shows the pattern of the second virtual sub-pixel, and the second virtual sub-pixel is the virtual sub-pixel A02 at the right side in FIG. 16C. As shown in conjunction with FIG. 16A and FIG. 16C, the second virtual semiconductor layer includes a first portion AP21 and a second portion AP22 that are spaced apart from each other, so as not to be connected with each other. The first portion AP21 is located at a first side of the first signal line 2301, and the second portion AP22 is located at a second side of the first signal line 2301. The orthographic projection of the first signal line 2301 on the base substrate 210 does not overlap with the orthographic projection of the first virtual semiconductor layer on the base substrate 210, so that there is no real thin film transistor in the second virtual pixel circuit and the display function is not realized. For example, the orthographic projection of the fourth compensation capacitor COM10 on the base substrate 210 does not overlap with the orthographic projection of the first virtual semiconductor layer on the base substrate.

Figure 16F:
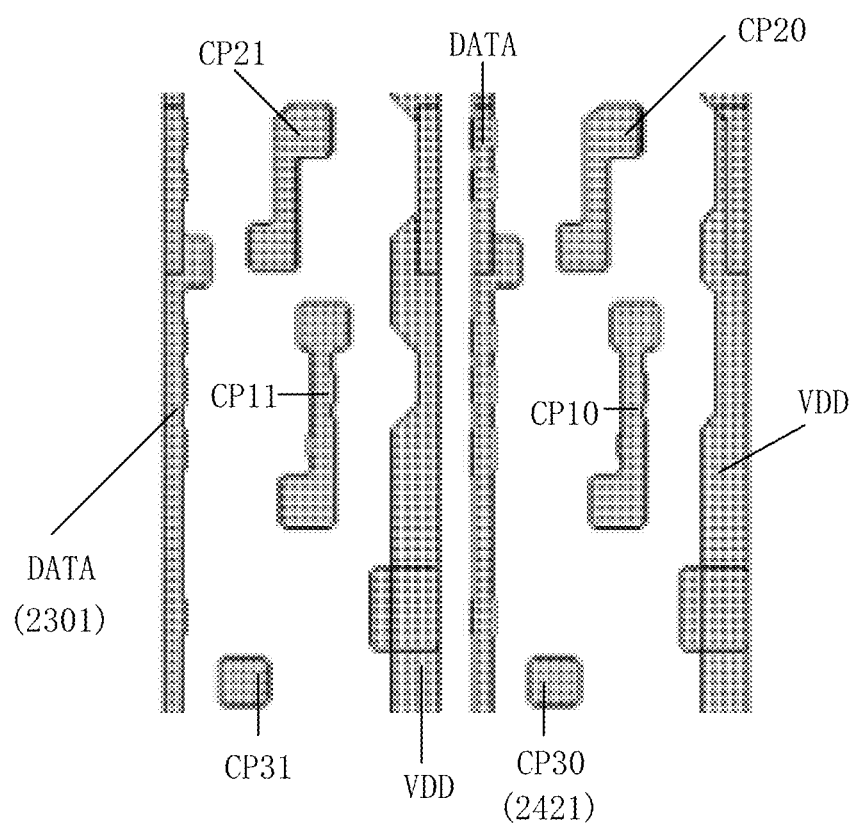

FIG. 16F shows the structure of the second dummy pixel circuit in the third conductive layer. Referring to FIG. 16A-FIG. 16B, FIG. 16E, and FIG. 16F, the second dummy pixel circuit includes a second transfer connection electrode CP10. The second transfer connection electrode CP10 is arranged in a same layer as the transfer connection electrode of the first virtual pixel circuit and the first connection portion CP1 of the pixel circuit in the display region, for example, both located on the third conductive layer and electrically connected with the second electrode plate CE20 of the fourth compensation capacitor COM10. For example, the second transfer connection electrode CP10 is electrically connected with the second electrode plate CE20 of the fourth compensation capacitor COM10 through a via hole VH40 and a via hole VH50, so as to maintain the etching uniformity with other positions such as the display region of the display substrate.

For example, with reference to FIG. 16A-FIG. 16B, and FIG. 16E, the second electrode plate CE20 of the fourth compensation capacitor COM10 is connected with the first power supply line VDD through the via hole VH40 and the via hole VH50, for example, connected with the first routing line 2424 of the first power supply line VDD so as to provide the first power supply voltage to the second electrode plate CE20 of the fourth compensation capacitor COM10 to form the fourth compensation capacitor COM10.

For example, the second portion AP22 of the second virtual semiconductor layer is configured to be given an electrical signal through the second virtual pixel circuit. The first portion AP21 of the first dummy semiconductor layer has a first end P21 and a second end P22 opposite to each other in the first direction R1. The second end P22 is configured to receive the electrical signal through the second virtual pixel circuit, and the first end P21 is connected with the second terminal P22, so that the electrical signal from the second end P2 can be transmitted to the first end P21, and the signal drift caused by no signal input at the first end P21 is prevented. For example, as shown in FIG. 16A, the second end P22 is electrically connected with the second sub-routing line 2424 of the first power supply line VDD, for example, through the via hole VH20, thereby transmitting the first power supply voltage from the second sub-routing line 2424 of the first power supply line VDD to the second end P22 and the first end P21. The structure of the first power supply line VDD is not limited to the case in FIG. 16A-FIG. 16F, as long as the first power supply line VDD is connected with the second end P22.

For example, as shown in FIG. 16A, an orthographic projection of the first portion of the third signal line, such as the light-emitting scan signal line EM, on the base substrate 210 at least partially overlaps with an orthographic projection of the virtual semiconductor layer on the base substrate 210 to form a third compensation capacitor, so as to compensate the load of the third signal line and obtain a more uniform display effect.

Of course, the second dummy pixel structure is not limited to the case illustrated in FIG. 16A-FIG. 16F, and in the case illustrated in orthographic projection of the virtual semiconductor layer on the base substrate 210, the data lines are in the same layer as the source electrode and the drain electrode 122/123. For example, in the case where the data lines are located at a side of, the source electrode and the drain electrode 122/123, away from the base substrate, the dummy semiconductor layer may also be arranged to overlap with a third signal line, such as a light-emitting scan signal line EM, to form a third compensation capacitor. The embodiments of the present disclosure are not limited to this.

In the embodiment shown in FIG. 2B and FIG. 2C, the second opening region 202B and the first opening region 202A are arranged along the first direction R1, so that the inter-opening region 2014 is located between the first opening region 202A and the second opening region 202B in the first direction R1. The first display region 2011 is located at the side of the first opening region 202A away from the inter-opening region 2014, and the second display region 2012 is located on the side of the second opening region 202B away from the inter-opening region 2014. In this case, the first display region 2011 is located at the first side of the first opening region 202A, and the second display region 2012 is located at the second side of the second opening region 201B. That is, the first display region, the first opening region, the inter-opening region, the second opening region, and the second display region are sequentially arranged along the first direction. With respect to the first opening region 202A and the second opening region 201B, it is still satisfied that the first display region 2011 is at the first side of the first opening region 202A, the second display region 2012 is located at the second side of the first opening region 202A, and the first side and the second side are opposite to each other in the first direction R1. The first signal line 23 sequentially passes through the first display region 2011, the first opening peripheral region 203A, the inter-opening region 2014, the second opening peripheral region 203B, and the second display region 2012 along the first direction R1.

As shown in FIG. 2B, the first signal line 2301 includes a first lead portion E1A1/E2A2 located in the first opening peripheral region 203A (i.e., taking one first signal line as an example, for example, the first lead portions are straight lines E1A1 and E2A2 in FIG. 2B) and a transverse winding portion A1A2 located in the first opening peripheral region 203A (i.e., the transverse winding portions is the curved line A1A2 in FIG. 2B). The transverse winding portion A1A2 is partially disposed around the first opening 201A. The second signal line 24 is configured to provide a second display signal to the first pixel array, passes through the first opening peripheral region 203A along a second direction R2 intersecting with the first direction R1, and includes a longitudinal winding portion C1C2 located in the first opening peripheral region 203A, that is, the longitudinal winding portion is a curved segment C1C2 in FIG. 2B. The longitudinal winding portion C1C2 partially surrounds the first opening 201A. The orthographic projection of the first lead portions E1A1/E2A2 on the base substrate and the orthographic projection of the second signal line 24 on the base substrate respectively have a first overlapping region S1/S2, that is, an area where the first lead portions E1A1/E2A2 and the first overlapping region S1/S2 cross. The orthographic projection of the transverse winding portion A1A2 on the base substrate and the orthographic projection of the longitudinal winding portion C1C2 on the base substrate have a second overlapping region, for example, they overlap in the A1C1 section and the D1A2 section, and the second overlapping region is the area represented by A1C1 and D1A2. In this way, due to the formation of the first overlapping region and the second overlapping region, a compensation capacitor is formed between the first signal line 2301 and the second signal line 24 overlapping each other in the direction perpendicular to the base substrate, which compensates the load on the first signal line, so that the display difference caused by different loads of first signal lines connecting different rows of pixels in the first pixel array is reduced, and the display effects of the first display region 2011 and the second display region 2012 are consistent with those of pixel rows in the display region 201 without the first opening region 202A, and the display quality of the first display region 2011 and the second display region 2012 is improved. Under this case, the above routing mode can also reduce the arrangement space of the first signal line and the second signal line, and minimize the area occupied by the first opening peripheral region 203A as much as possible. Therefore, for example, in the case where the off-screen camera shooting function is realized through the first opening region 202A, the influence of the first opening region 202A on the display effect of this area can be reduced, or in other embodiments, in the case where the first opening peripheral region 203A is located in the frame region 204, the width of the frame region 204 can also be reduced, thereby contributing to the realization of the narrow frame and large screen design of the display substrate 20. For example, as shown in FIG. 2B, the orthographic projection of the lead portion E1A1 of the first signal line 2301 on the BASE substrate and the orthographic projection of the longitudinal winding portion of the second signal line 24 on the base substrate have a first overlapping region. That is, each of the plurality of first signal lines sequentially passes through the first display region, the first opening peripheral region and the second display region along the first direction, and includes a first lead portion and a transverse winding portion located in the first opening peripheral region, where the transverse winding portion partially surrounds the first opening, and the first lead portion is connected with the transverse winding portion. The orthographic projections of the transverse winding portions of the first signal lines on the base substrate have overlapping regions with the orthographic projections of the longitudinal winding portions of the second signal lines on the base substrate respectively.

Figure 17:
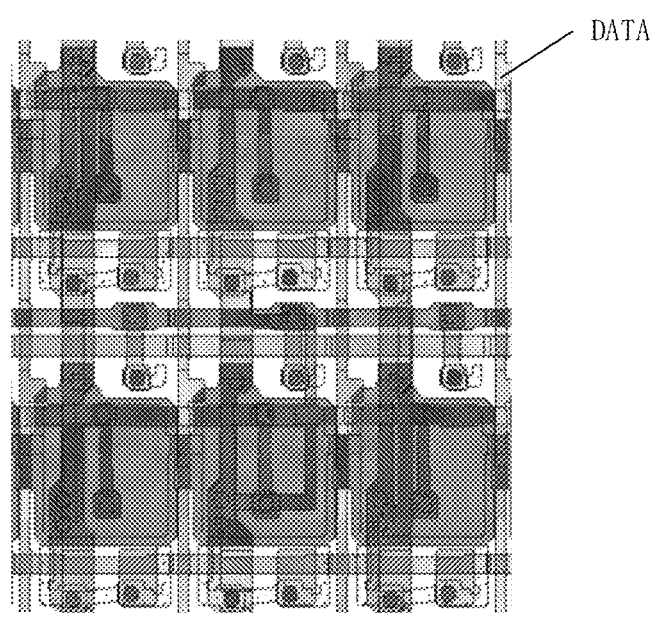
FIG. 17 is a schematic planar layout diagram of the second virtual pixel circuit in a second virtual sub-pixel in the display substrate provided by an embodiment of the present disclosure.

FIG. 17 is a schematic layout diagram of a second virtual pixel circuit in a second virtual sub-pixel in a display substrate according to an embodiment of the present disclosure. The main difference between FIG. 17 and FIG. 16A is that the data line DATA is located at the side of the source electrode and the drain electrode 122/123 away from the base substrate, and the position of the data line DATA in the first direction relative to the first power line VDD is different. Other structures of the embodiment illustrated FIG. 17 may be referred to FIG. 16A.

Figure 10A:
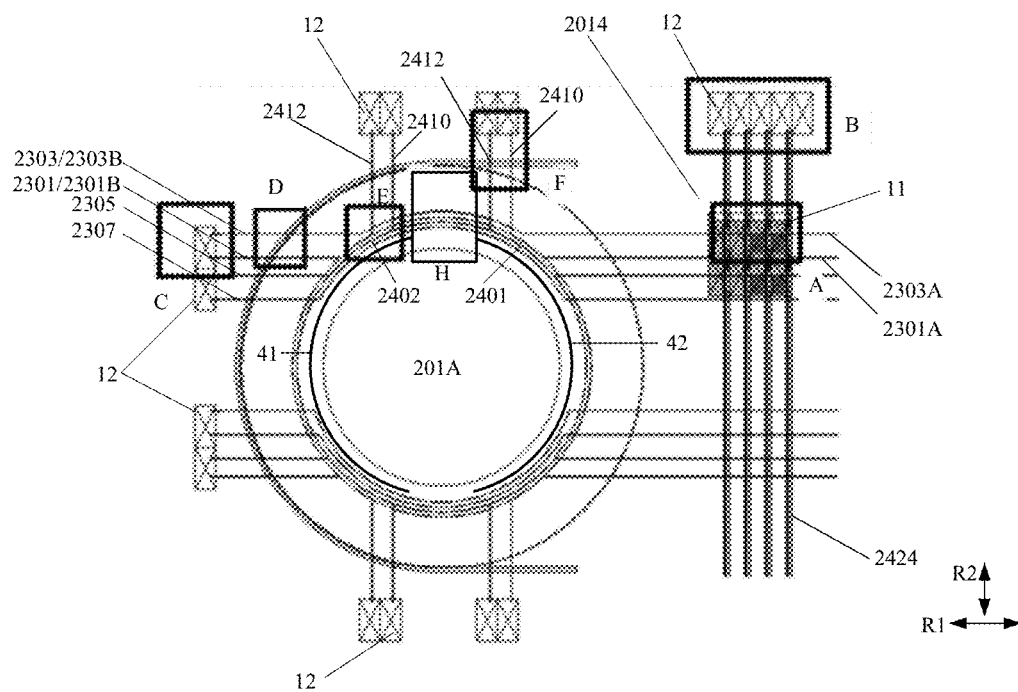
FIG. 10A is an enlarged schematic diagram of a first opening region of the display substrate provided by an embodiment of the present disclosure.

FIG. 10A is an enlarged schematic diagram of a first opening region of a display substrate according to an embodiment of the present disclosure. A difference between FIG. 10A and FIG. 2B-FIG. 2C is that the display substrate further includes a first floating electrode 41/42. The longitudinal winding portion closest to the first opening 201A among the longitudinal winding portions of the plurality of second signal lines is an edge longitudinal winding portion 2401/2402, and the first floating electrodes 41/42 are arranged in the same layer as the edge longitudinal winding portion and are located at a side of the edge longitudinal winding portion 2401/2402 close to the first opening 201A. The first floating electrodes 41/42 are arranged in the same layer as the edge longitudinal winding portions and are located at a side of the edge longitudinal winding portions 2401/2402 close to the first opening 201A, thereby avoiding the etching difference of the edge longitudinal winding portions and increasing the etching uniformity. The first floating electrode is not loaded with any electrical signal, and cannot interfere with other signal lines around the first floating electrode.

For example, as shown in FIG. 10, the plurality of pixels includes a first pixel column and a second pixel column that respectively extend along the second direction R2. The first opening 201A includes a first side and a second side that are opposite to each other in the first direction R2, and a third side and a fourth side that are opposite to each other in the second direction R2. The display substrate includes two edge longitudinal winding portions corresponding to the first opening 201A, and the two edge longitudinal winding portions include an edge longitudinal winding portion configured to provide a second display signal to the first pixel column and an edge longitudinal winding portion configured to provide a second display signal to the second pixel column. The edge longitudinal winding portion that provides the second display signal to the first pixel column partially surrounds the first opening at a first side of the first opening. The edge longitudinal winding portion that provides the second display signal to the second pixel column partially surrounds the first opening at the second side of the first opening. The first floating electrode includes a first portion 41 and a second portion 42. The first portion 41 is located at a side, of the edge longitudinal winding portion that provides the second display signal to the first pixel column, close to the first opening 201A. The second portion 42 is located at a side, of the edge longitudinal winding portion that provides the second display signal to the second pixel column, close to the first opening 201A.

For example, the line width and extension direction of the first floating electrode and the line width of the edge longitudinal winding portion are basically the same, so as to further increase the etching uniformity of the edge longitudinal winding portion.

For example, a first interval is between two adjacent second signal lines, for example, there is a first interval between the edge longitudinal winding portions of two adjacent second signal lines, and the interval between the first floating electrode and the edge longitudinal winding portion is basically equal to the first interval so as to further increase the etching uniformity of the edge longitudinal winding portion.

For example, in some embodiments, as shown in FIG. 10A, the first portion 41 of the first floating electrode and the second portion 42 of the first floating electrode are spaced apart from each other. In other embodiments, as shown in FIG. 10B and FIG. 10C, the first portion 41 of the first floating electrode is integral with the second portion of the first floating electrode.

Figure 10B:
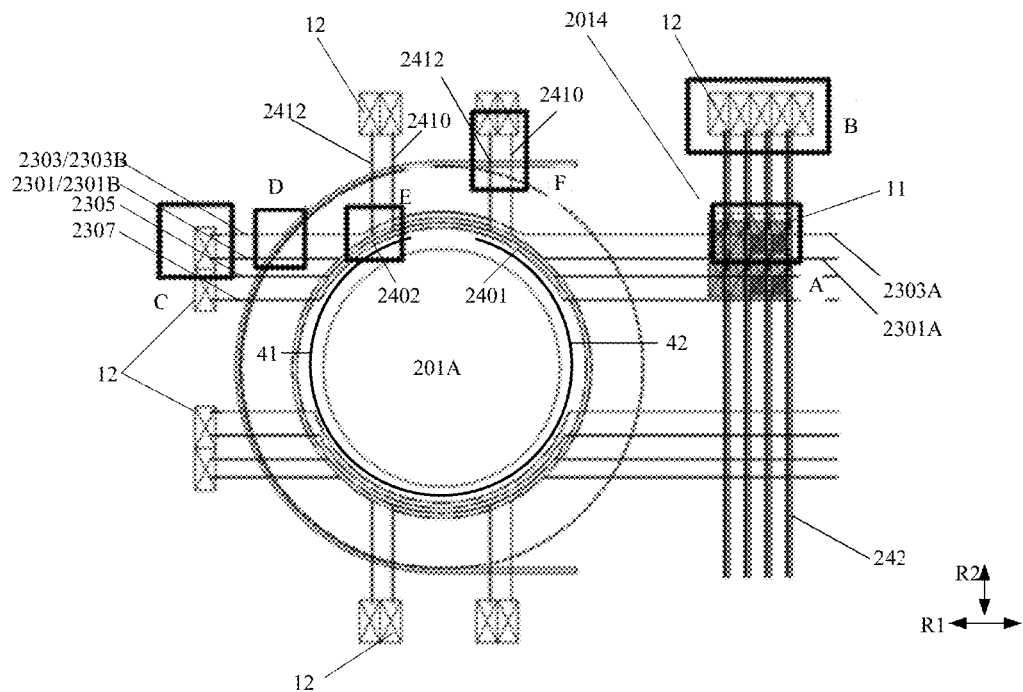
FIG. 10B is another enlarged schematic diagram of the first opening region of the display substrate provided by an embodiment of the present disclosure.
Figure 10C:
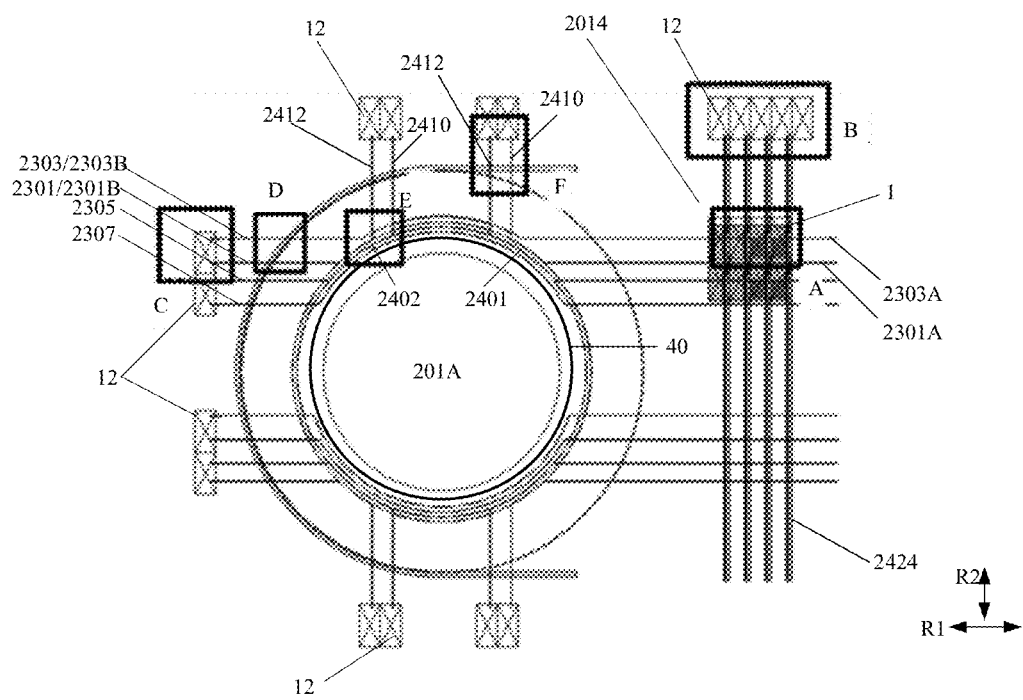
FIG. 10C is another enlarged schematic diagram of the first opening region of the display substrate provided by an embodiment of the present disclosure.

For example, as shown in FIG. 10B, an overall planar shape of a whole constituted by the first portion 41 of the first floating electrode and the second portion 42 of the first floating electrode is an unclosed ring around the first opening 201A, and the unclosed ring has an opening that can better release accumulated charges and avoid signal interference to peripheral signal lines around. Of course, in some embodiments, for example, as shown in FIG. 10C, the overall planar shape of the first portion 41 of the first floating electrode and the second portion 42 of the first floating electrode may also be a closed ring.

Figure 11:
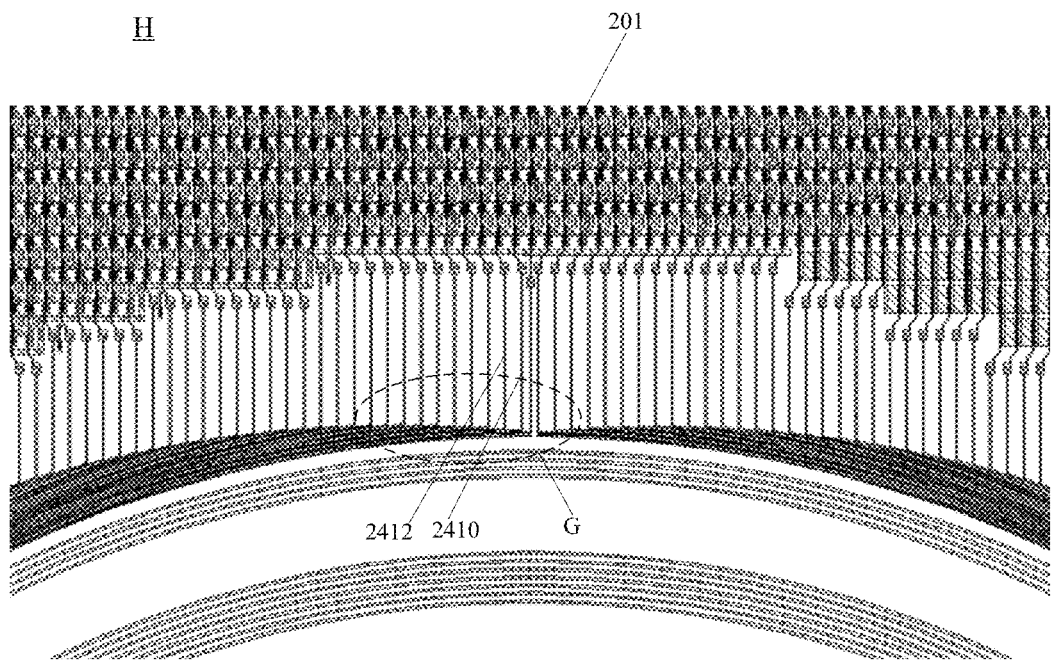
FIG. 11 is an enlarged schematic view of the portion H in FIG. 10A.
Figure 12:
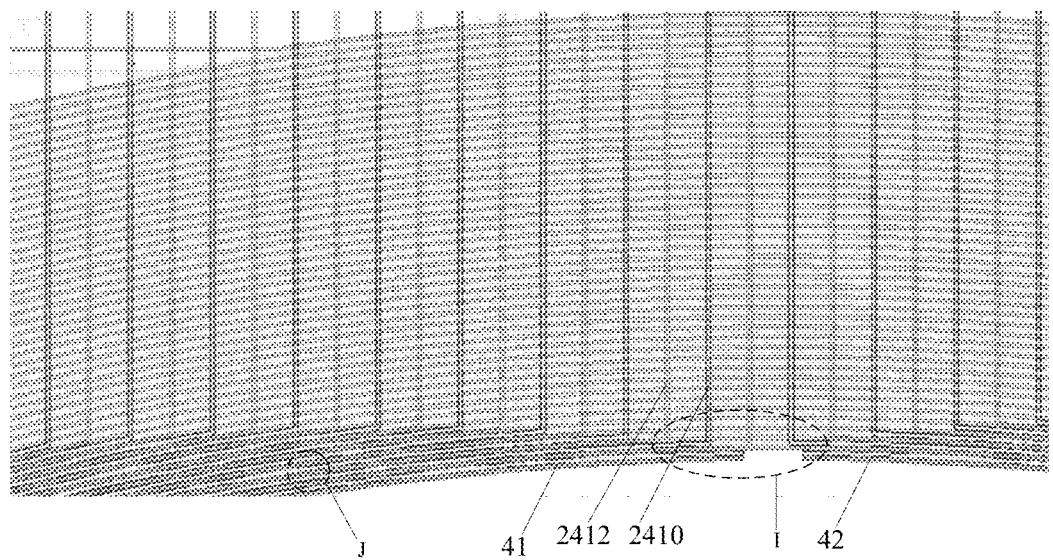
FIG. 12 is an enlarged schematic view of the portion G in FIG. 11.
Figure 13:
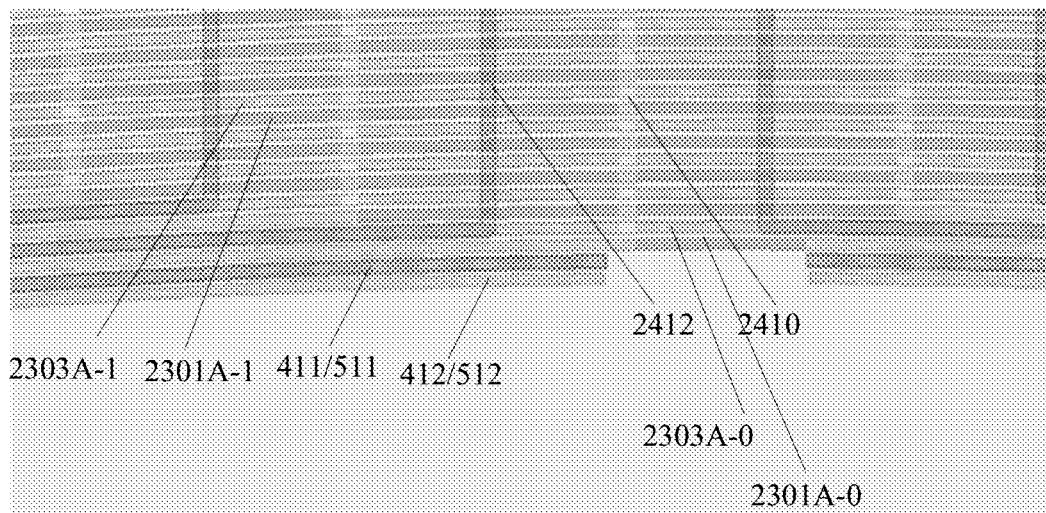
FIG. 13 is an enlarged schematic view of the portion I in FIG. 16.
Figure 14:
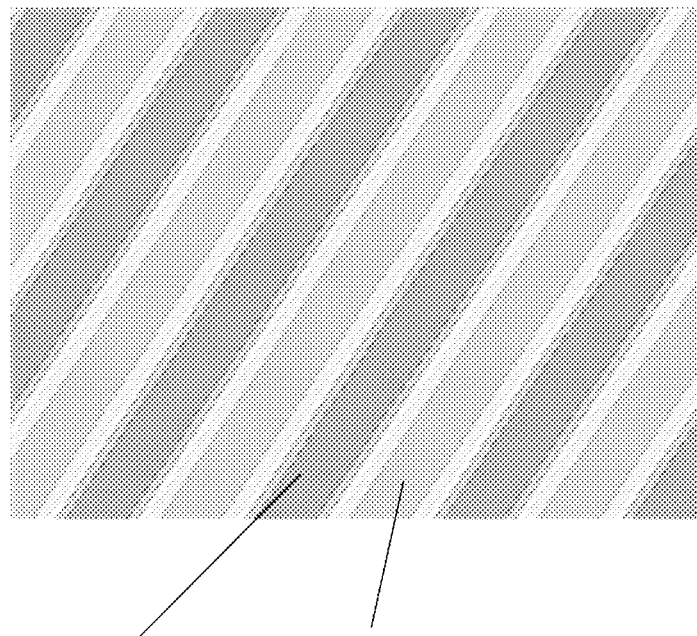
FIG. 14 is an enlarged schematic view of the portion J in FIG. 13.

FIG. 11 is an enlarged schematic diagram of the portion H in FIG. 10A, FIG. 16 is an enlarged schematic diagram of portion g in FIG. 11, FIG. 13 is an enlarged schematic diagram of portion I in FIG. 16, and FIG. 14 is an enlarged schematic diagram of portion J in FIG. 13. The display substrate further includes a second floating electrode, the transverse winding portion closest to the first opening 201A among the transverse winding portions of the plurality of first signal lines is an edge transverse winding portion, and the second floating electrode is arranged in the same layer as the edge transverse winding portion and in a different layer from the first floating electrode. The second floating electrode is located at a side of the edge transverse winding portion close to the first opening, and the orthographic projection of the second floating electrode on the base substrate 210 and the orthographic projection of the first floating electrode on the base substrate 210 have overlapping regions, thereby avoiding the etching difference of the edge transverse winding portion and increasing the etching uniformity. Similar to the first floating electrode, the line width and extension direction of the second floating electrode are basically the same as those of the edge transverse winding portion so as to further increase the etching uniformity of the edge transverse winding portion.

For example, a second interval is between two adjacent second signal lines among the plurality of first signal lines, for example, the second interval is between the edge transverse winding portions of two adjacent first signal lines, and an interval between the second floating electrode and the edge transverse winding portion is basically equal to the second interval so as to further increase the etching uniformity of the edge transverse winding portion.

For example, the first signal line includes a plurality of gate scan signal lines and a plurality of reset signal lines. As shown in FIG. 13, the gate scan signal line 2303A (this portion is the first portion 2303A of the gate scan signal line in this case) and the reset signal line 2301A (this portion is the first portion 2301A of the gate scan signal line in this case) are respectively arranged in different layers. In addition, the transverse winding portions 2303A-1 of the gate scan signal line 2303A and the transverse winding portions 2301A-1 of the reset signal line 2301a are alternately arranged in the second direction. The gate scan signal line 2303A closest to the first opening 201A is an edge gate scan signal line 2303A-0, and the reset signal line closest to the first opening 201A is an edge reset signal line 2301A-0. The second floating electrode includes a first sub-floating electrode 511 and a second sub-floating electrode 512. The first sub-floating electrode 511 is arranged in the same layer as the gate scan signal line and is located at a side of the edge gate scan signal line 2303A close to the first opening 201A. The second sub-floating electrode 512 is arranged in the same layer as the reset signal line 2301A-0 and is located at a side of the edge reset signal line 2301A-0 close to the first opening 201A. The edge gate scan signal line 2303A-0 is farther away from the first opening 201A than the edge reset signal line 2301A-0, and the first sub-floating electrode 511 is farther away from the first opening 201A than the second sub-floating electrode 512. The orthographic projection of the first floating electrode on the base substrate at least has an overlapping region with the first sub-floating electrode, which can solve the etching uniformity problem of the edge reset signal line 2301A-0 and the edge reset signal line 2301A-0. Or, the edge reset signal line 2301A-0 is farther away from the first opening 201A than the edge gate scan signal line 2303A-0, and the second sub-floating electrode 512 is farther away from the first opening 201A than the first sub-floating electrode 511. The orthographic projection of the first floating electrode on the base substrate at least has an overlapping region with the second sub-floating electrode, which can also solve the problem of etching uniformity both the edge reset signal line 2301A-0 and the edge reset signal line 2301A-0.

In some embodiments, for example, as shown in FIG. 13, the part of the plurality of second signal lines include a first part of second signal lines 2410 and a second part of second signal lines 2412, and the first part of second signal lines 2410 and the second part of second signal lines 2412 are respectively arranged in different layers and alternately arranged in the first direction. Please refer to the previous description for their layers. The second signal line closest to the first opening in the first part of second signal lines 2410 is an edge first sub-data signal line, and the second signal line closest to the first opening in the second part of second signal lines 2412 is an edge second sub-data signal line. An orthographic projection of the longitudinal winding portion of each second signal line among the first part of second signal lines on the base substrate 210 and an orthographic projection of the transverse winding portion of one gate drive scan signal line on the base substrate have an overlapping region, and an orthographic projection of the longitudinal winding portion of each second signal line among the second part of second signal lines on the base substrate and an orthographic projection of the transverse winding portion of one reset signal line on the base substrate have an overlapping region. The first floating electrode includes a third sub-floating electrode 411 and a fourth sub-floating electrode 412. The third sub-floating electrode 411 is arranged in a same layer as the first part of second signal lines 2410 and is located at a side of the edge first sub-data signal line close to the first opening. The fourth sub-floating electrode 412 is arranged in the same layer as the second part of second signal lines 2412 and is located at a side of the edge second sub-data signal line close to the first opening 201A. An orthographic projection of the third sub-floating electrode 411 on the base substrate has an overlapping region with an orthographic projection of the first sub-floating electrode 511 on the base substrate, and the orthographic projection of the fourth sub-floating electrode 412 on the base substrate has an overlapping region with the second sub-floating electrode 512.

For example, the first part of second signal lines 2410 (here referred to as its longitudinal winding portion) is arranged in the same layer as the source electrode and the drain electrode 122/123, and the second part of second signal lines 2412 (here referred to as its longitudinal winding portion) is located at a side of the first part of second signal lines 2410 away from the base substrate. The plurality of gate scan signal lines are arranged in the same layer as the second electrode plate of the storage capacitor, and the reset signal lines are arranged in the same layer as the first electrode plate CE1 of the storage capacitor CST. Or, the plurality of gate scan signal lines are arranged in the same layer as the first electrode plate CE1 of the storage capacitor CST, and the plurality of reset signal lines are arranged in the same layer as the second electrode plate CE2 of the storage capacitor CST.

In the above embodiments, both the gate scan signal line and the reset signal line are wound at the first opening instead of being disconnected (broken) at the first opening.

For example, in some embodiments, the plurality of first signal lines include a plurality of gate scan signal lines and a plurality of reset signal lines, and the gate scan signal lines and the reset signal lines are arranged in different layers. Each of the gate scan signal lines sequentially passes through the first display region, the first opening peripheral region, and the second display region along the first direction, and includes a first lead portion and a transverse winding portion located in the first opening peripheral region; the transverse winding portion partially surrounds the first opening, and the first lead portion is connected with the transverse winding portion. Each reset signal line includes a first portion and a second portion. The first portion passes through the first display region in the first direction; the second portion passes through the second display region along the first direction and is separated from the first portion by the first opening region. That is, the gate scan signal line performs the wire wounding at the first opening, and the reset signal line is disconnected (broken) at the first opening.

For example, in some embodiments, the plurality of first signal lines include a plurality of gate scan signal lines and a plurality of reset signal lines, and the gate scan signal lines and the reset signal lines are arranged in different layers. Each of the gate scan signal lines sequentially passes through the first display region, the first opening peripheral region, and the second display region along the first direction, and includes a first lead portion and a transverse winding portion located in the first opening peripheral region; the transverse winding portion partially surrounds the first opening, and the first lead portion is connected with the transverse winding portion. Each gate scan signal line includes a first portion and a second portion. The first part passes through the first display region in the first direction; the second portion passes through the second display region along the first direction, and is spaced apart from the first opening region of the first portion; That is, the reset scan signal line performs the wire wounding at the first opening, and the gate signal line is disconnected (broken) at the first opening.

For example, in some embodiments, the plurality of first signal lines include a plurality of gate scan signal lines and a plurality of reset signal lines, and the gate scan signal lines and the reset signal lines are arranged in different layers. Each of the gate scan signal lines includes a first portion and a second portion; the first portion of the gate signal line passes through the first display region in the first direction; the second portion of the gate signal line passes through the second display region along the first direction of the gate signal line and is spaced apart from the first portion of the gate signal line by the first opening region. And each reset signal line comprises a first portion and a second portion, and the first portion of the reset signal line passes through the first display region along the first direction; the second portion of the reset signal line passes through the second display region along the first direction and is spaced apart from the first portion of the reset signal line by the first opening region. That is, both the gate scan signal line and the reset signal line are disconnected (broken) at the first opening.

In the case where the gate scan signal line and/or the reset signal line are disconnected at the first opening, the disconnected signal line can be loaded with drive signals from both sides of the base substrate in the first direction in a bilateral drive manner, with specific reference to the conventional technology.

For example, in some embodiments, the display substrate may further include an outer floating electrode. The longitudinal winding portion farthest from the first opening among the longitudinal winding part of the plurality of second signal lines is an outer edge longitudinal winding portion. The outer floating electrode is arranged in the same layer as the outer edge longitudinal winding portion and is located at a side of the outer edge longitudinal winding portion away from the first opening so as to increase the etching uniformity of the outer edge longitudinal winding portion.

For example, each of the second signal lines of the part of the plurality of second signal lines further includes a second lead portion. The second lead portion extends along the second direction and is connected with the longitudinal winding portion. The arrangement density of the second lead portions is larger than the arrangement density of the longitudinal winding portions. The line width of the second lead portion is basically equal to that of the longitudinal winding portion. Because of the difference of arrangement density and the limitation of etching process, the design line width of the second lead portion is smaller than the design line width of the longitudinal winding portion in the manufacturing process, so that the final line widths of the two portions can be basically equal. Or, if the difference of the line width is not designed, the line width of the second lead portion is smaller than the line width of the longitudinal winding portion.

At least one embodiment of the present disclosure provides a display device including any one of the display substrates described above. The display device can be, for example, an organic light-emitting diode display device, a quantum dot light-emitting diode display device, and other devices with display functions or other types of devices, which are not limited by embodiments of the present disclosure.

The structure, functions and technical effects of the display device provided by the embodiments of the present disclosure can refer to the corresponding descriptions in the display substrate provided by the embodiments of the present disclosure, and will not be described in detail here.

For example, the display device provided by at least one embodiment of the present disclosure can be any product or component with display function, such as a display panel, a mobile phone, a tablet computer, a television, a display, a notebook computer, a digital photo frame, a navigator, etc., which is not limited by the embodiments of the present disclosure.

The above are merely specific implementations of the present disclosure without limiting the protection scope of the present disclosure thereto. The protection scope of the present disclosure should be based on the protection scope of the appended claims.

What is claimed is:

1. A transparent display structure, comprising:
   a base substrate, comprising:
      a first opening region which comprises a first opening and a first opening peripheral region surrounding the first opening;
      a display region at least partially surrounding the first opening region, and comprising:
         a first display region at a first side of the first opening region, and
         a second display region at a second side of the first opening region, wherein the first side and the second side are opposite to each other in a first direction, and both the first display region and the second display region comprise a plurality of pixels;
   a plurality of first signal lines which are configured to provide a first display signal to the plurality of pixels, extend along the first direction, and pass through the first display region and the second display region;
   a plurality of second signal lines which are configured to provide a second display signal to the plurality of pixels, and extend along a second direction intersecting with the first direction, wherein a part of the plurality of second signal lines passes through the first opening peripheral region along the second direction, each second signal line of the plurality of second signal lines comprises a longitudinal winding portion in the first opening peripheral region, and the longitudinal winding portion partially surrounds the first opening; and
   a first floating electrode, wherein the longitudinal winding portion closest to the first opening among longitudinal winding part of the plurality of second signal lines is an edge longitudinal winding portion, and the first floating electrode is in a same layer as the edge longitudinal winding portion and is at a side of the edge longitudinal winding portion close to the first opening.

2. The display substrate according to claim 1, wherein a line width of the first floating electrode is basically same as that of the edge longitudinal winding portion, and an extension direction of the first floating electrode is basically same as that of the edge longitudinal winding portion.

3. The display substrate according to claim 1, wherein a first interval is between two adjacent second signal lines among the plurality of second signal lines, and an interval between the first floating electrode and the edge longitudinal winding portion is basically equal to the first interval.

4. The display substrate according to claim 1, wherein
   the plurality of pixels comprise a first pixel column and a second pixel column that respectively extend along the second direction; the first opening has a first side and a second side that are opposite to each other in the first direction, and a third side and a fourth side that are opposite to each other in the second direction;
   the display substrate further comprises two edge longitudinal winding portions corresponding to the first opening, and the two edge longitudinal winding portions comprise:
      the edge longitudinal winding portion configured to provide the second display signal to the first pixel column, wherein the edge longitudinal winding portion providing the second display signal to the first pixel column partially surrounds the first opening at the first side of the first opening; and
      the edge longitudinal winding portion configured to provide the second display signal to the second pixel column, wherein the edge longitudinal winding portion providing the second display signal to the second pixel column partially surrounds the first opening at the second side of the first opening;
   the first floating electrode comprises:
      a first portion at a side, of the edge longitudinal winding portion that provides the second display signal to the first pixel column, close to the first opening; and
      a second portion at a side, of the edge longitudinal winding portion that provides the second display signal to the second pixel column, close to the first opening.

5. The display substrate according to claim 4, wherein the first portion of the first floating electrode and the second portion of the first floating electrode are spaced apart from each other.

6. The display substrate according to claim 4, wherein the first portion of the first floating electrode is integrated with the second portion of the first floating electrode.

7. The display substrate according to claim 6, wherein a whole planar shape constituted by the first portion of the first floating electrode and the second portion of the first floating electrode is an unclosed ring surrounding the first opening or a closed ring surrounding the first opening.

8. The display substrate according to claim 1, wherein
each of the plurality of first signal lines passes sequentially through the first display region, the first opening peripheral region, and the second display region along the first direction, and comprises a first lead portion and a transverse winding portion that are in the first opening peripheral region, the transverse winding portion partially surrounds the first opening, and the first lead portion is connected with the transverse winding portion;
orthographic projections of the transverse winding portions of the plurality of first signal lines on the base substrate respectively have overlapping regions with the orthographic projections of the longitudinal winding portions of the part of the plurality of second signal lines on the base substrate;
the display substrate further comprises:
a second floating electrode, wherein the transverse winding portion closest to the first opening among the transverse winding portions of the plurality of first signal lines is an edge transverse winding portion, the second floating electrode is in a same layer as the edge transverse winding portion and is in a different layer from the first floating electrode, and the second floating electrode is at a side of the edge transverse winding portion close to the first opening.

9. The display substrate according to claim 8, wherein
the first signal lines comprise a plurality of gate scan signal lines and a plurality of reset signal lines, the plurality of gate scan signal lines are in different layer from the plurality of reset signal lines, and transverse winding portions of the gate scan signal lines and transverse winding portions of the reset signal lines are alternately arranged in the second direction;
a gate scan signal line closest to the first opening among the plurality of gate scan signal lines is an edge gate scan signal line, and a reset signal line closest to the first opening among the plurality of reset signal lines is an edge reset signal line;
the second floating electrode comprises:
a first sub-floating electrode which is in a same layer as the plurality of gate scan signal lines and is at a side of the edge gate scan signal line close to the first opening; and
a second sub-floating electrode which is in the same layer as the plurality of reset signal lines and is at a side of the edge reset signal line close to the first opening;
the edge gate scan signal line is farther from the first opening than the edge reset signal line, the first sub-floating electrode is farther from the first opening than the second sub-floating electrode, and an orthographic projection of the first floating electrode on the base substrate has at least an overlapping region with the first sub-floating electrode; or the edge reset signal line is farther from the first opening than the edge gate scan signal line, and the second sub-floating electrode is farther from the first opening than the first sub-floating electrode, and the orthographic projection of the first floating electrode on the base substrate has at least an overlapping region with the second sub-floating electrode.

10. The display substrate according to claim 9, wherein
the part of the plurality of second signal lines comprise a first part of second signal lines and a second part of second signal lines, wherein the first part of second signal lines and the second part of second signal lines are respectively in different layers and are alternately arranged in the first direction;
a second signal line closest to the first opening among the first part of second signal lines is an edge first sub-data signal line, and a second signal line closest to the first opening among the second part of second signal lines is an edge second sub-data signal line;
an orthographic projection of the longitudinal winding portion of each second signal line among the first part of second signal lines on the base substrate has an overlapping region with an orthographic projection of the transverse winding portion of one gate scan signal line among the plurality of gate scan signal lines on the base substrate, and an orthographic projection of the longitudinal winding portion of each second signal line among the second part of second signal lines on the base substrate has an overlapping region with an orthographic projection of transverse winding portion of each reset signal line among the plurality of reset signal lines on the base substrate;
the first floating electrode comprises:
a third sub-floating electrode which is in a same layer as the first part of second signal lines and is at a side of the edge first sub-data signal line close to the first opening; and
a fourth sub-floating electrode which is in a same layer as the second part of second signal lines and is at a side of the edge second sub-data signal line close to the first opening, wherein
an orthographic projection of the third sub-floating electrode on the base substrate has an overlapping region with the first sub-floating electrode, and an orthographic projection of the fourth sub-floating electrode on the base substrate has an overlapping region with the second sub-floating electrode.

11. The display substrate according to claim 10, wherein each of the plurality of pixels comprises a plurality of sub-pixels, and each of the plurality of sub-pixels comprises a pixel circuit, and the pixel circuit comprises:
a transistor comprising an active layer, a gate electrode, and a source electrode and a drain electrode;
a light-emitting element connected with one of the source electrode and the drain electrode of the transistor; and
a storage capacitor comprising a first electrode plate and a second electrode plate, wherein
the first part of second signal lines is in a same layer as the source electrode and the drain electrode, and the second part of second signal lines is at a side of the first part of second signal lines away from the base substrate;
the plurality of gate scan signal lines are in a same layer as the second electrode plate of the storage capacitor, and the plurality of reset signal lines are in a same layer as the first electrode plate of the storage capacitor; or
the plurality of gate scan signal lines are in a same layer as the first electrode plate of the storage capacitor, and the plurality of reset signal lines are in a same layer as the second electrode plate of the storage capacitor.

12. The display substrate according to claim 1, wherein the plurality of first signal lines comprise a plurality of gate scan signal lines and a plurality of reset signal lines, and the plurality of gate scan signal lines are in a different layer from the plurality of reset signal lines;
   each of the plurality of gate scan signal lines passes sequentially through the first display region, the first opening peripheral region, and the second display region along the first direction, and comprises a first lead portion and a transverse winding portion that are in the first opening peripheral region, and the transverse winding portion partially surrounds the first opening, and the first lead portion is connected with the transverse winding portion;
   each of the plurality of reset signal lines comprises:
      a first portion passing through the first display region along the first direction; and
      a second portion which passes through the second display region along the first direction and is spaced apart from the first portion by the first opening region.

13. The display substrate according to claim 1, wherein the plurality of first signal lines comprise a plurality of gate scan signal lines and a plurality of reset signal lines, and the plurality of gate scan signal lines are in a different layer from the plurality of reset signal lines;
   each of the plurality of reset signal lines passes sequentially through the first display region, the first opening peripheral region, and the second display region along the first direction, and comprises a first lead portion and a transverse winding portion that are in the first opening peripheral region, and the transverse winding portion partially surrounds the first opening, and the first lead portion is connected with the transverse winding portion;
   each of the plurality of gate scan signal lines comprises:
      a first portion passing through the first display region along the first direction; and
      a second portion which passes through the second display region along the first direction and is spaced apart from the first portion by the first opening region.

14. The display substrate according to claim 1, wherein the plurality of first signal lines comprise a plurality of gate scan signal lines and a plurality of reset signal lines, and the plurality of gate scan signal lines are in a different layer from the plurality of reset signal lines;
   each of the plurality of gate scan signal lines comprises:
      a first portion passing through the first display region along the first direction; and
      a second portion which passes through the second display region along the first direction and is spaced apart from the first portion by the first opening region; and
   each of the reset signal lines comprises:
      a first portion passing through the first display region along the first direction; and
      a second portion which passes through the second display region along the first direction and is spaced apart from the first portion by the first opening region.

15. The display substrate according to claim 1, further comprising:
   an outer floating electrode, wherein the longitudinal winding portion farthest from the first opening among the longitudinal winding part of the plurality of second signal lines is an outer edge longitudinal winding portion, and the outer floating electrode is in a same layer as the outer edge longitudinal winding portion and is at a side of the outer edge longitudinal winding portion away from the first opening.

16. The display substrate according to claim 1, wherein each second signal line of the part of the plurality of second signal lines further comprises:
   a second lead portion which extends along the second direction and is connected with the longitudinal winding portion, wherein an arrangement density of the second lead portion is larger than an arrangement density of the longitudinal winding portion;
   a line width of the second lead portion is basically equal to a line width of the longitudinal winding portion, or, the line width of the second lead portion is smaller than the line width of the longitudinal winding portion.

17. A display device, comprising the display substrate according to claim 1.

18. The display substrate according to claim 2, wherein the plurality of pixels comprise a first pixel column and a second pixel column that respectively extend along the second direction; the first opening has a first side and a second side that are opposite to each other in the first direction, and a third side and a fourth side that are opposite to each other in the second direction;
   the display substrate further comprises two edge longitudinal winding portions corresponding to the first opening, and the two edge longitudinal winding portions comprise: the edge longitudinal winding portion configured to provide the second display signal to the first pixel column, wherein the edge longitudinal winding portion providing the second display signal to the first pixel column partially surrounds the first opening at the first side of the first opening; and
      the edge longitudinal winding portion configured to provide the second display signal to the second pixel column, wherein the edge longitudinal winding portion providing the second display signal to the second pixel column partially surrounds the first opening at the second side of the first opening;
   the first floating electrode comprises:
      a first portion at a side, of the edge longitudinal winding portion that provides the second display signal to the first pixel column, close to the first opening; and
      a second portion at a side, of the edge longitudinal winding portion that provides the second display signal to the second pixel column, close to the first opening.

19. The display substrate according to claim 3, wherein the plurality of pixels comprise a first pixel column and a second pixel column that respectively extend along the second direction; the first opening has a first side and a second side that are opposite to each other in the first direction, and a third side and a fourth side that are opposite to each other in the second direction;
   the display substrate further comprises two edge longitudinal winding portions corresponding to the first opening, and the two edge longitudinal winding portions comprise:
      the edge longitudinal winding portion configured to provide the second display signal to the first pixel column, wherein the edge longitudinal winding portion providing the second display signal to the first pixel column partially surrounds the first opening at the first side of the first opening; and the edge longitudinal winding portion configured to provide the second display signal to the second pixel column, wherein the edge longitudinal winding portion providing the second display signal to the second pixel column partially surrounds the first opening at the second side of the first opening;

the first floating electrode comprises:

a first portion at a side, of the edge longitudinal winding portion that provides the second display signal to the first pixel column, close to the first opening; and a second portion at a side, of the edge longitudinal winding portion that provides the second display signal to the second pixel column, close to the first opening.

20. The display substrate according to claim 2, wherein each of the plurality of first signal lines passes sequentially through the first display region, the first opening peripheral region, and the second display region along the first direction, and comprises a first lead portion and a transverse winding portion that are in the first opening peripheral region, the transverse winding portion partially surrounds the first opening, and the first lead portion is connected with the transverse winding portion;

orthographic projections of the transverse winding portions of the plurality of first signal lines on the base substrate respectively have overlapping regions with the orthographic projections of the longitudinal winding portions of the part of the plurality of second signal lines on the base substrate;

the display substrate further comprises:

a second floating electrode, wherein the transverse winding portion closest to the first opening among the transverse winding portions of the plurality of first signal lines is an edge transverse winding portion, the second floating electrode is in a same layer as the edge transverse winding portion and is in a different layer from the first floating electrode, and the second floating electrode is at a side of the edge transverse winding portion close to the first opening.

* * * * *